United States Patent
Lai et al.

(10) Patent No.: US 12,191,370 B2
(45) Date of Patent: Jan. 7, 2025

(54) SEMICONDUCTOR DEVICE WITH TUNABLE CHANNEL LAYER USAGE AND METHODS OF FABRICATION THEREOF

(71) Applicant: Taiwan Semiconductor Manufacturing Company, Ltd., Hsin-Chu (TW)

(72) Inventors: Bo-Yu Lai, Taipei (TW); Wei-Yang Lee, Taipei (TW); Ming-Lung Cheng, Kaohsiung County (TW); Chia-Pin Lin, Hsinchu County (TW); Yuan-Ching Peng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 362 days.

(21) Appl. No.: 17/714,528

(22) Filed: Apr. 6, 2022

(65) Prior Publication Data
US 2023/0187518 A1    Jun. 15, 2023

Related U.S. Application Data

(60) Provisional application No. 63/289,493, filed on Dec. 14, 2021.

(51) Int. Cl.
*H01L 29/06* (2006.01)
*H01L 29/417* (2006.01)
(Continued)

(52) U.S. Cl.
CPC .... *H01L 29/42392* (2013.01); *H01L 29/0665* (2013.01); *H01L 29/41775* (2013.01); *H01L 29/66553* (2013.01); *H01L 29/78696* (2013.01)

(58) Field of Classification Search
CPC .......... H01L 29/42392; H01L 29/0665; H01L 29/41775
See application file for complete search history.

(56) References Cited

U.S. PATENT DOCUMENTS 8,772,109 B2   7/2014   Colinge
8,785,285 B2   7/2014   Tsai et al.
(Continued)

FOREIGN PATENT DOCUMENTS

CN   113270402 A    8/2021
CN   113782431 A   12/2021
(Continued)

*Primary Examiner* — Thao P Le
(74) *Attorney, Agent, or Firm* — HAYNES AND BOONE, LLP

(57) ABSTRACT

A method includes forming a stack of channel layers and sacrificial layers on a substrate. The channel layers and the sacrificial layers have different material compositions and being alternatingly disposed in a vertical direction. The method further includes patterning the stack to form a semiconductor fin, forming an isolation feature on sidewalls of the semiconductor fin, recessing the semiconductor fin, thereby forming a source/drain recess, such that a recessed top surface of the semiconductor fin is below a top surface of the isolation feature, growing a base epitaxial layer from the recessed top surface of the semiconductor fin, depositing an insulation layer in the source/drain recess, and forming an epitaxial feature in the source/drain recess, wherein the epitaxial feature is above the insulation layer. The insulation layer is above the base epitaxial layer and above a bottom-most channel layer.

20 Claims, 45 Drawing Sheets

(51) Int. Cl.
    *H01L 29/423*     (2006.01)
    *H01L 29/66*     (2006.01)
    *H01L 29/786*     (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 11,855,185 B2 * | 12/2023 | Chen .................. H01L 21/0332 |
| 11,862,561 B2 * | 1/2024 | Chang ................. H01L 23/5286 |
| 12,040,328 B2 * | 7/2024 | Khaderbad ..... H01L 21/823821 |
| 2023/0114216 A1 * | 4/2023 | Li ..................... H01L 29/78696 |
| | | 257/401 |
| 2023/0261077 A1 * | 8/2023 | Liu ................... H01L 29/66545 |
| 2023/0378261 A1 * | 11/2023 | Yao .................. H01L 29/78618 |
| 2023/0420506 A1 * | 12/2023 | Lee ................ H01L 21/823481 |
| 2024/0128364 A1 * | 4/2024 | Lung ................. H01L 29/0847 |
| 2024/0154014 A1 * | 5/2024 | Pan ................ H01L 21/823418 |
| 2024/0222431 A1 * | 7/2024 | Lin ................ H01L 21/823418 |
| 2024/0266424 A1 * | 8/2024 | Hsiao ................ H01L 29/0673 |

FOREIGN PATENT DOCUMENTS

| | | | |
|---|---|---|---|
| KR | 20200111997 A | 10/2020 | |
| TW | 202139276 A | 10/2021 | |
| TW | 202141802 A | 11/2021 | |

\* cited by examiner

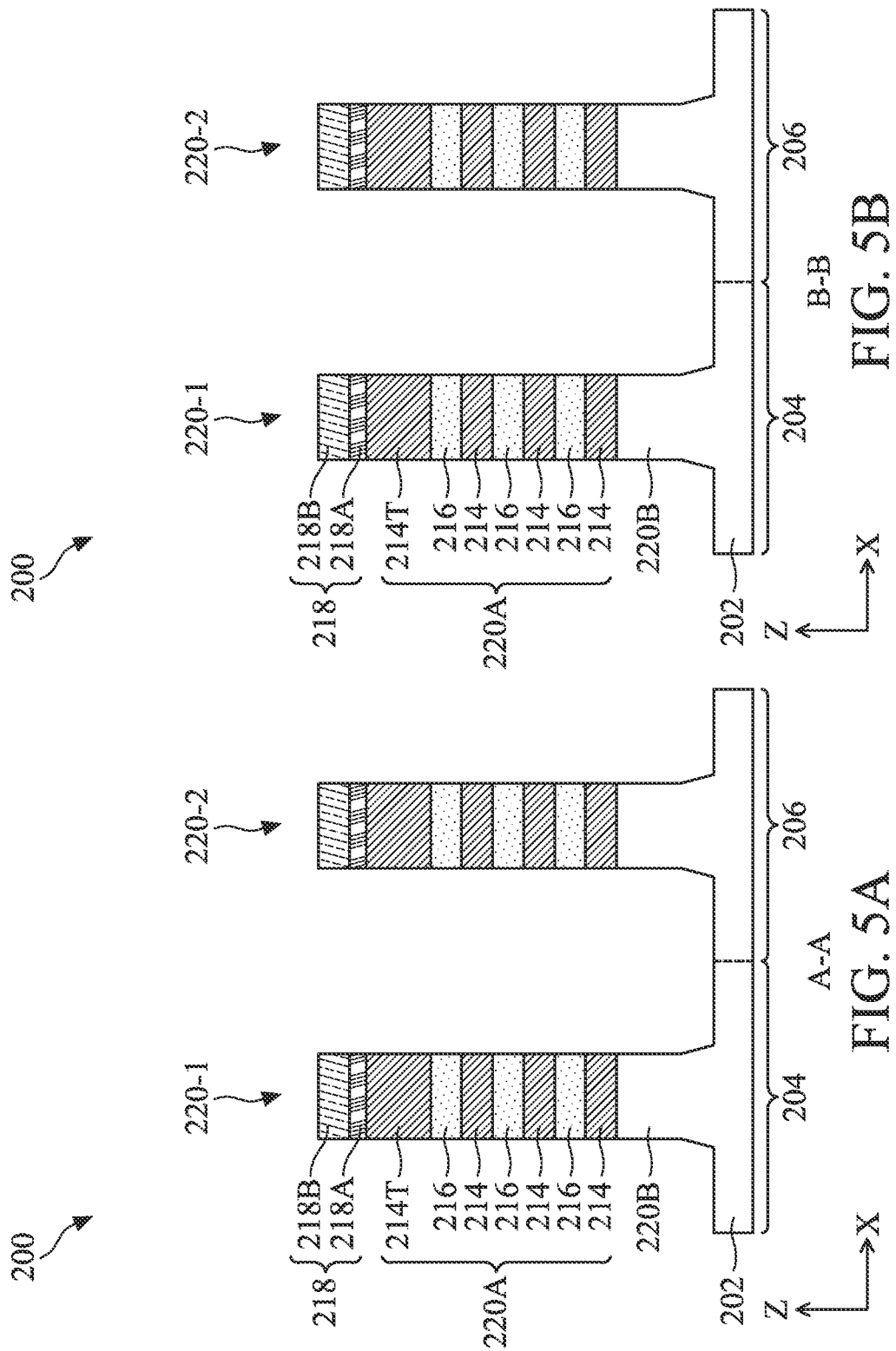

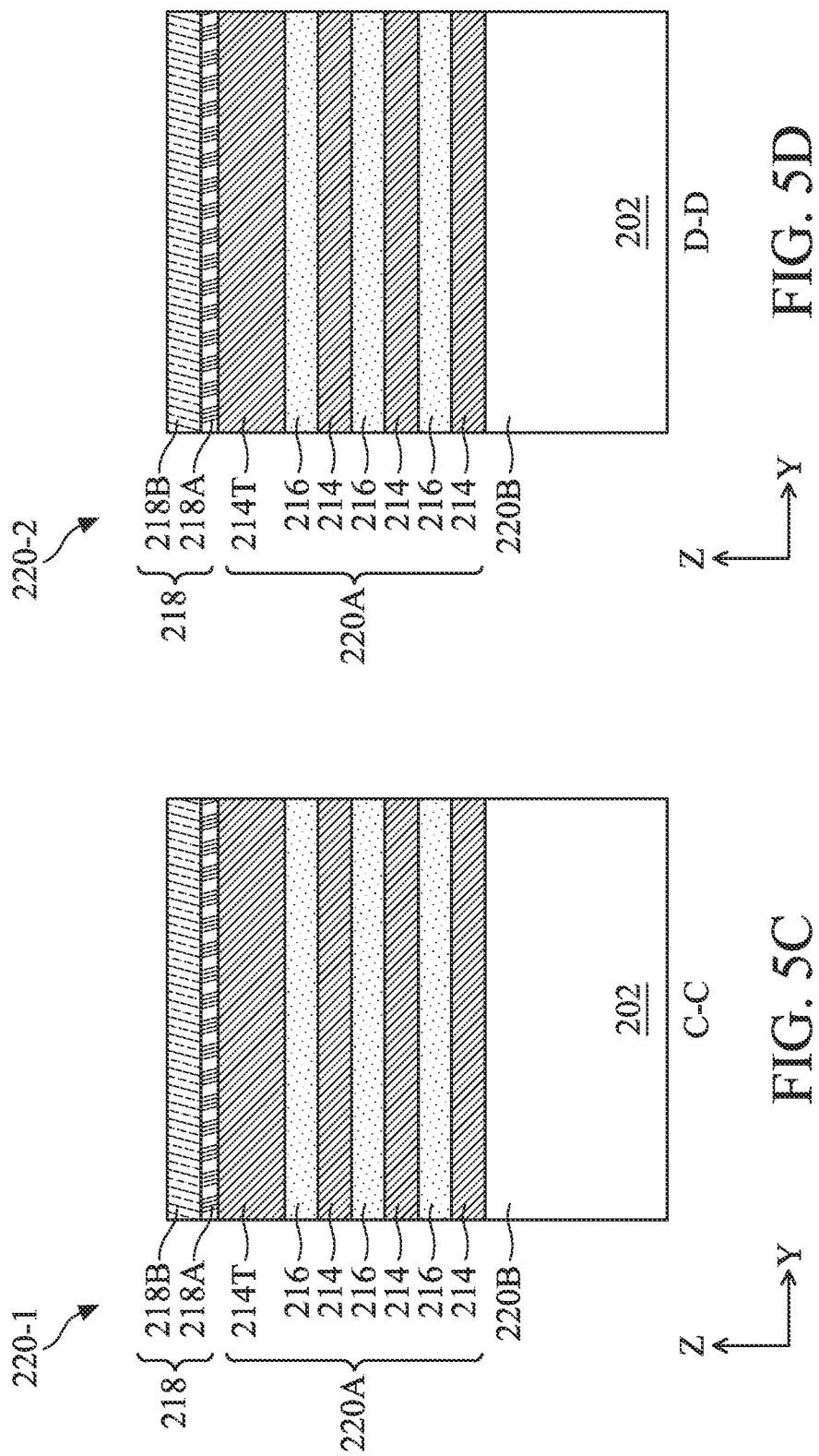

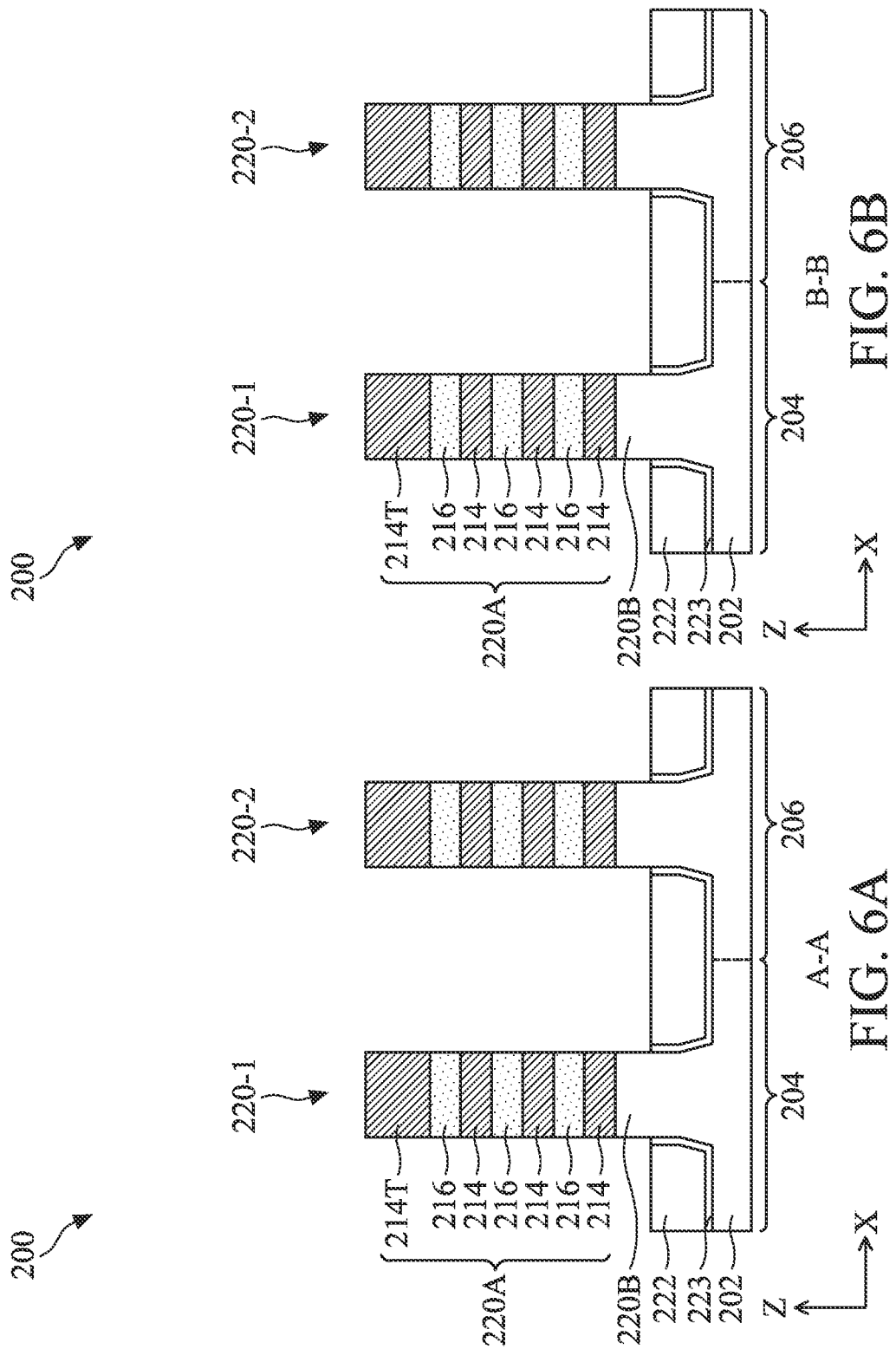

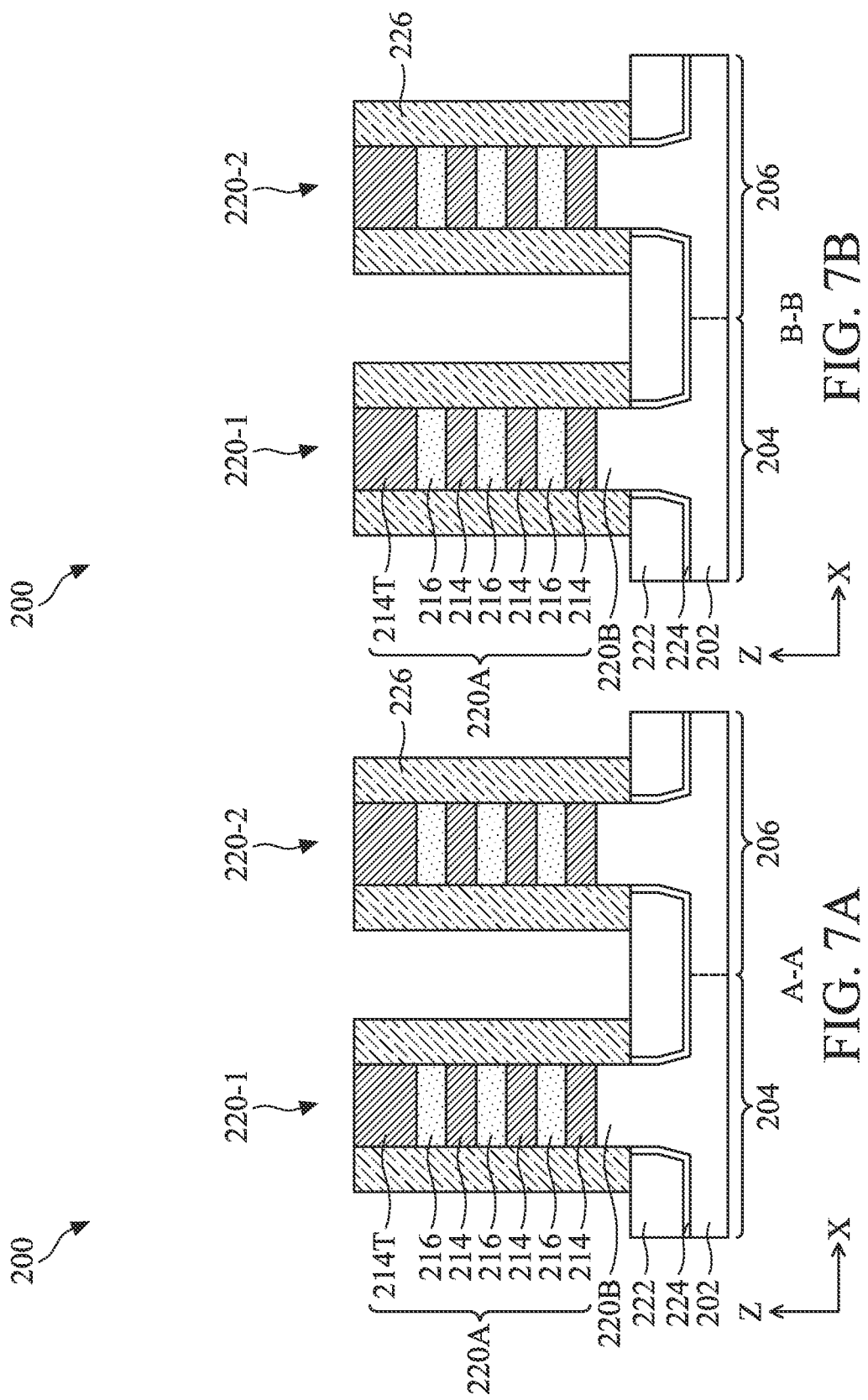

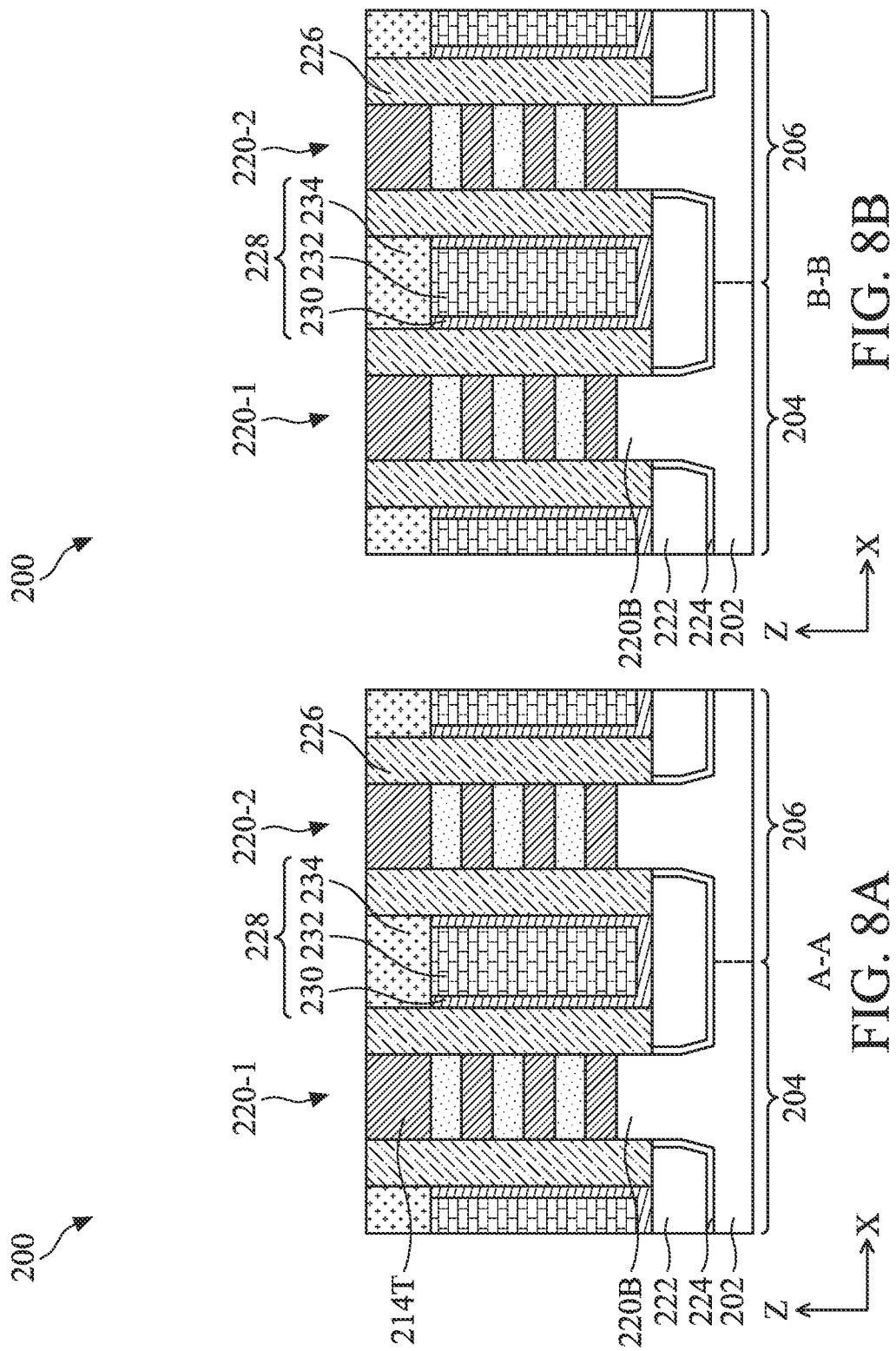

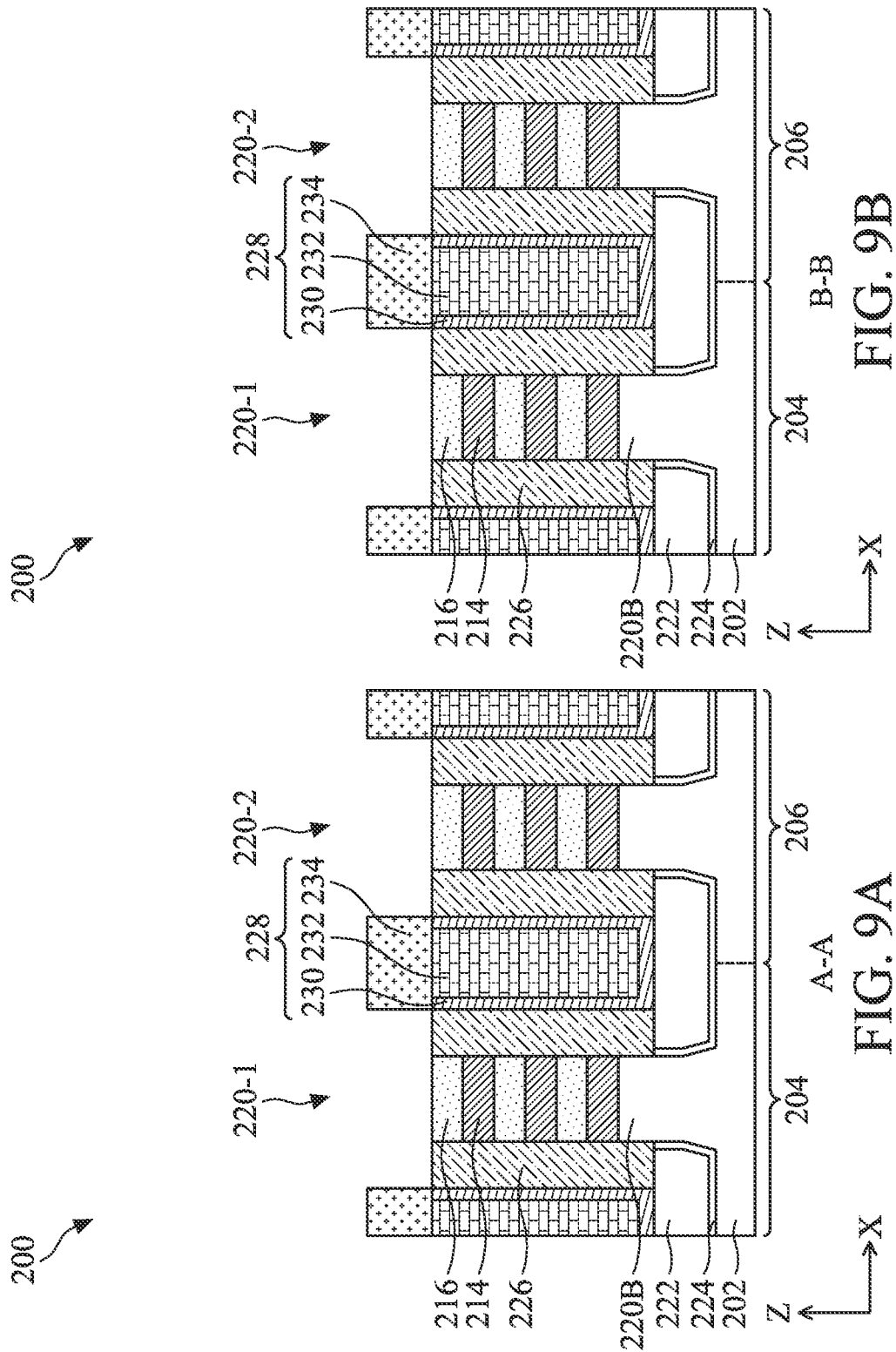

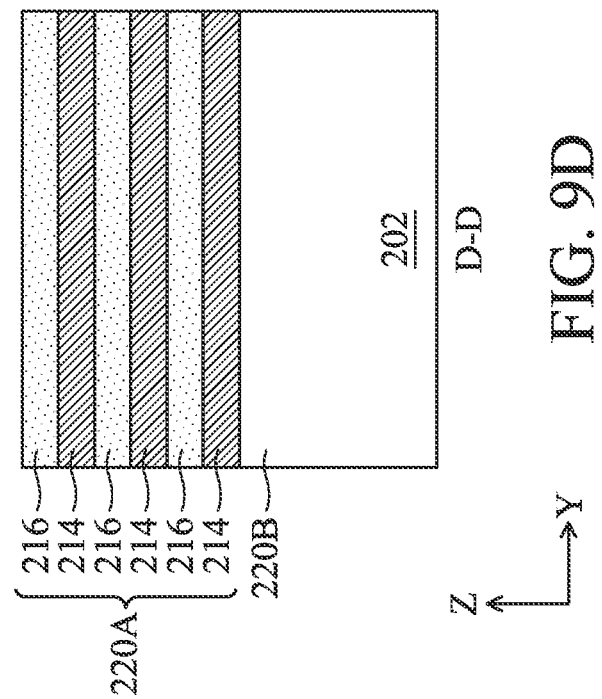
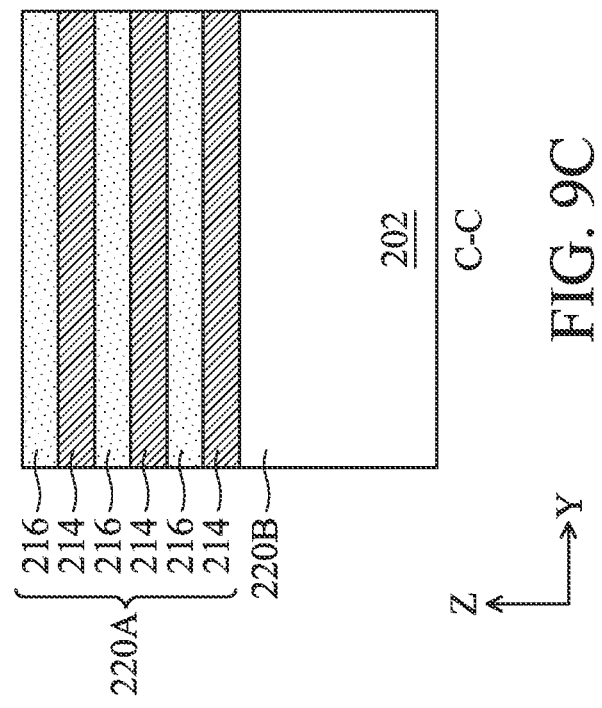

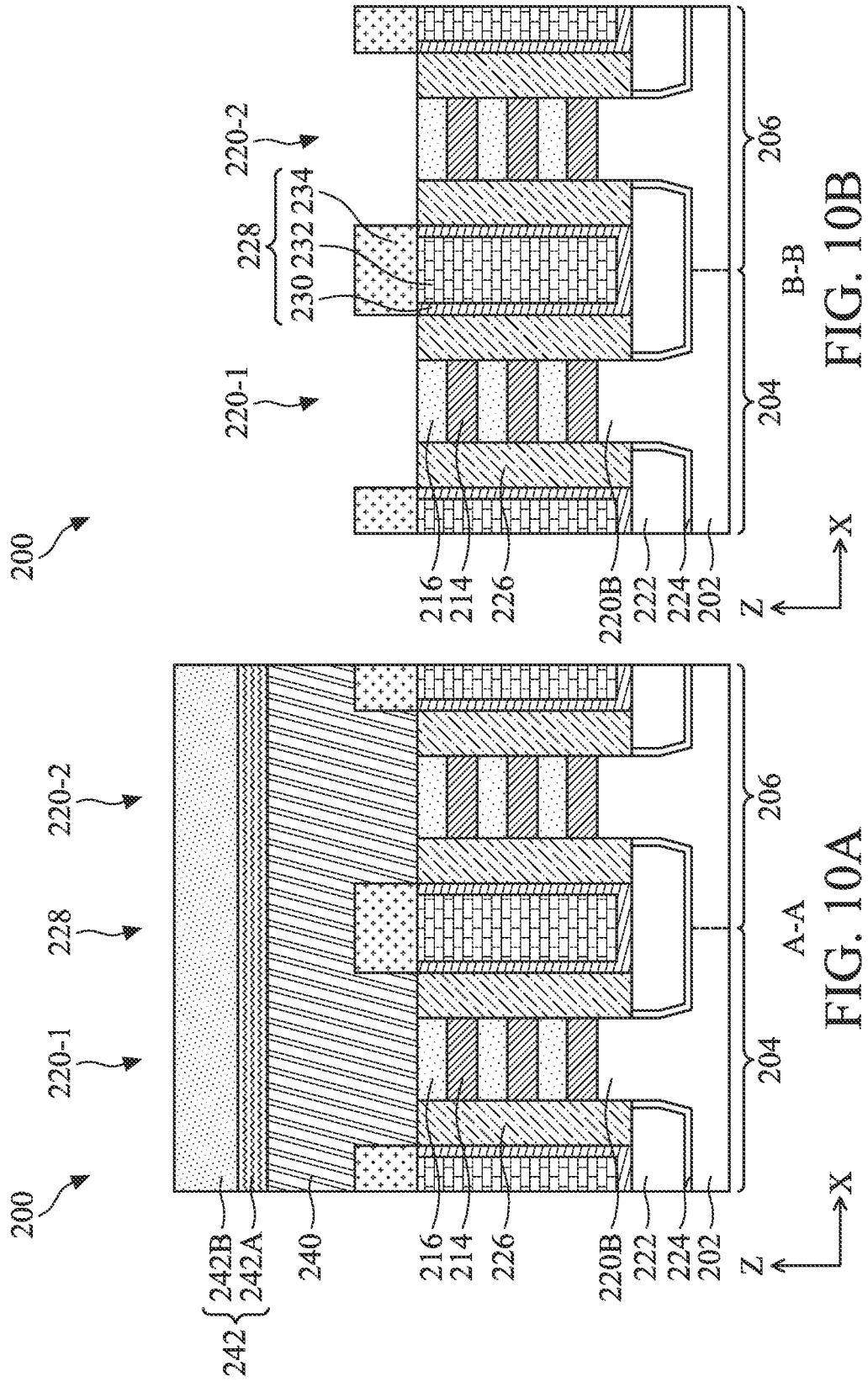

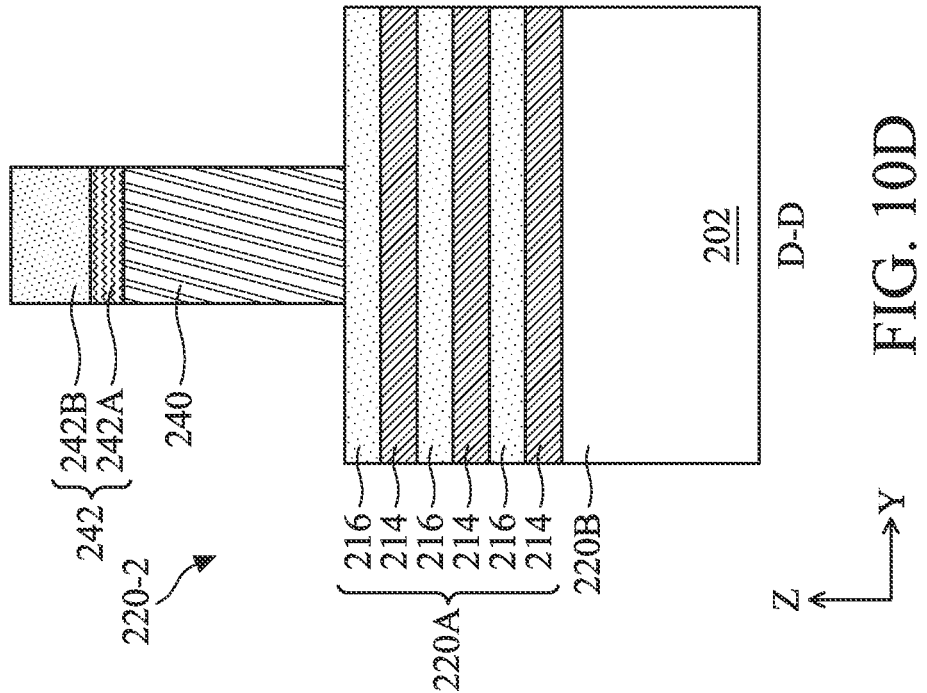
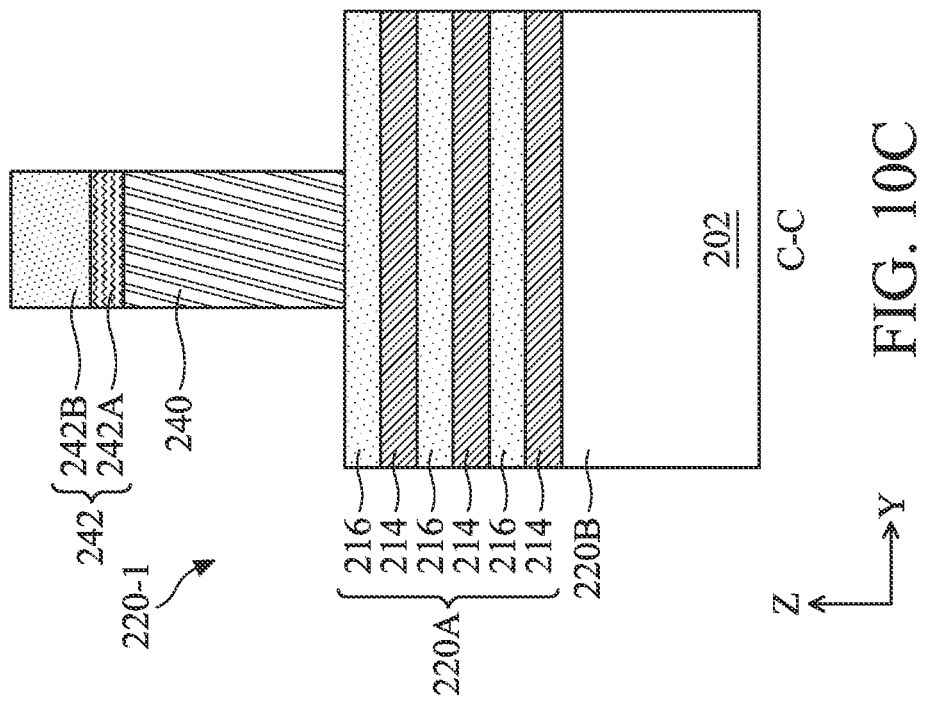

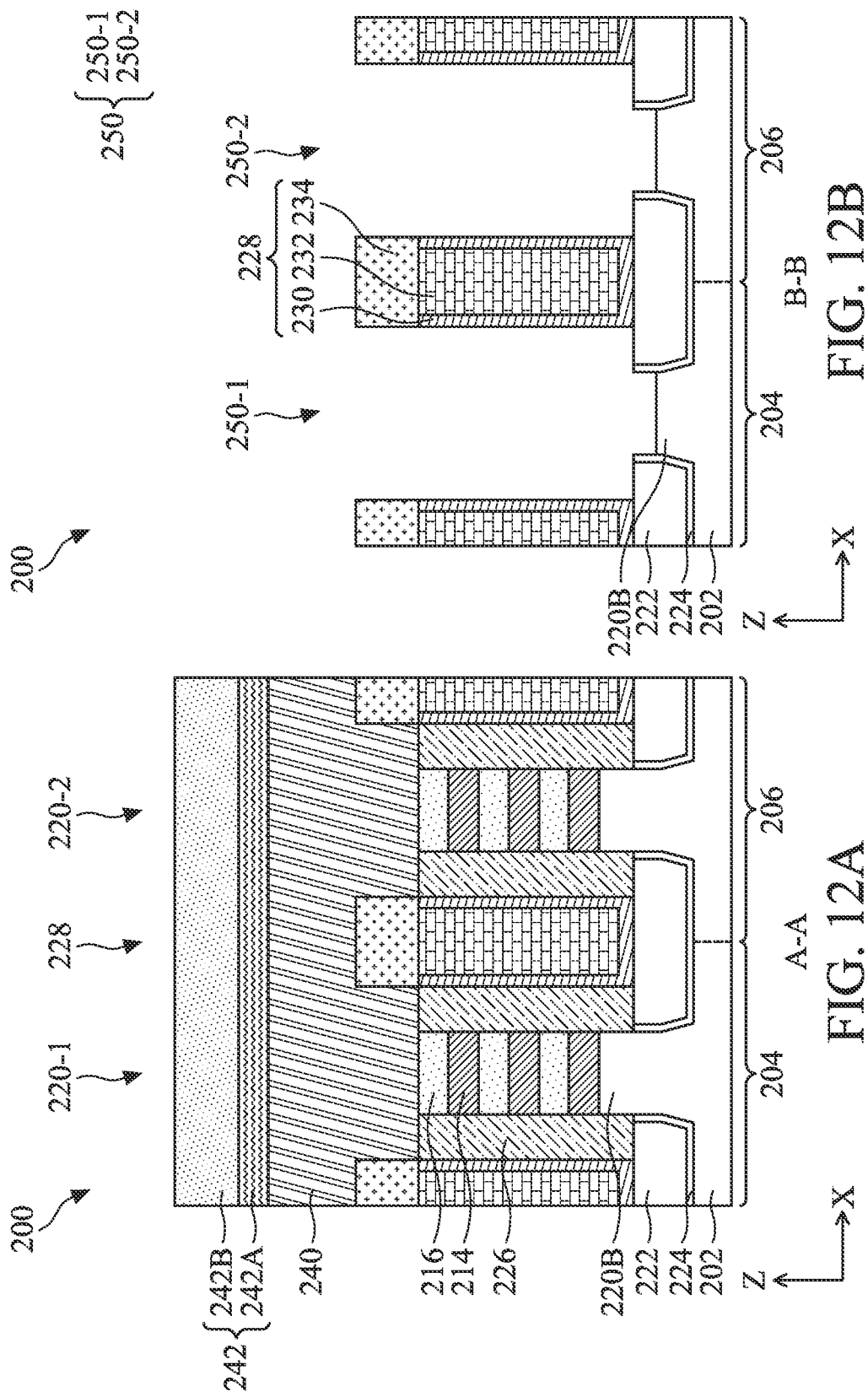

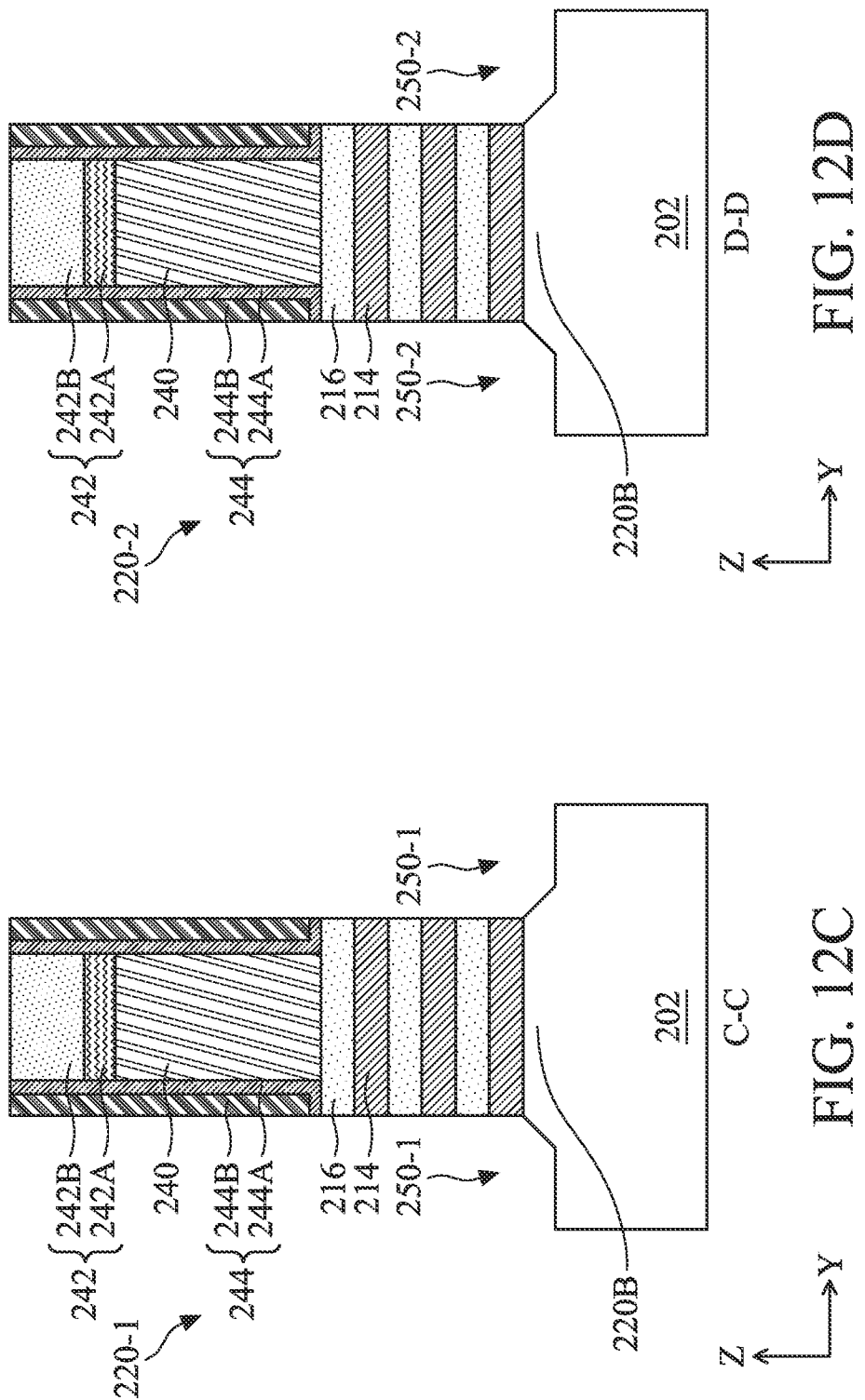

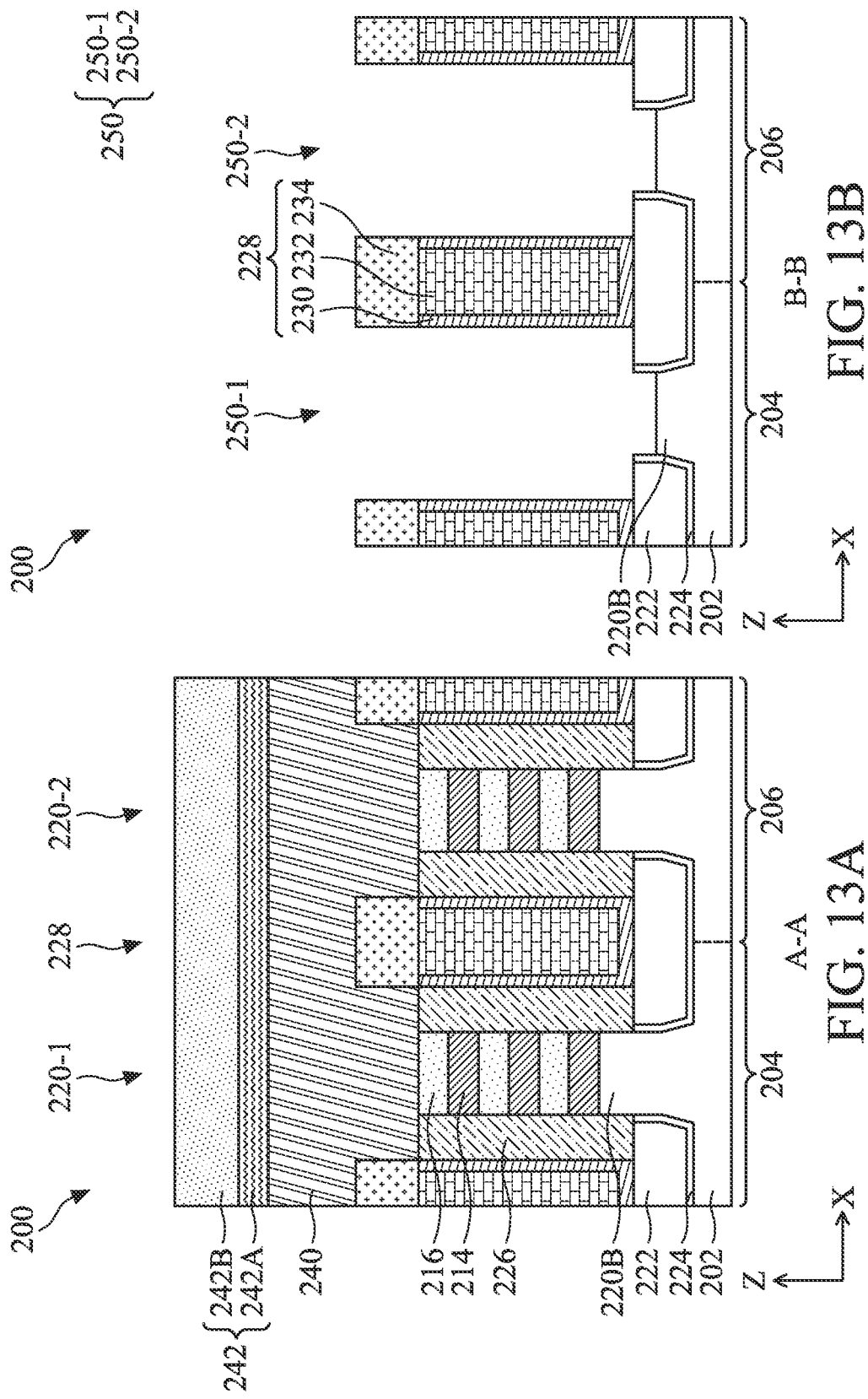

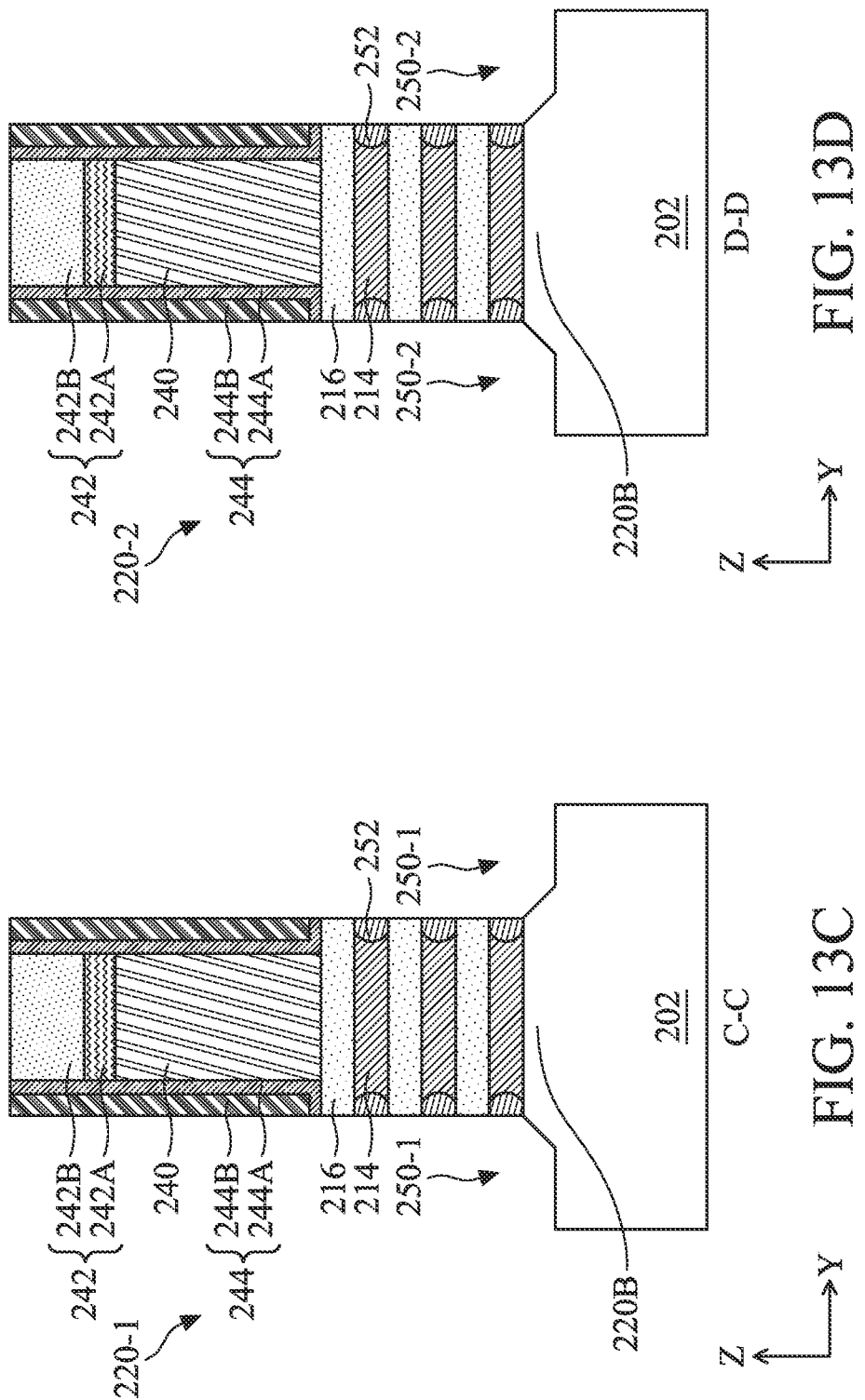

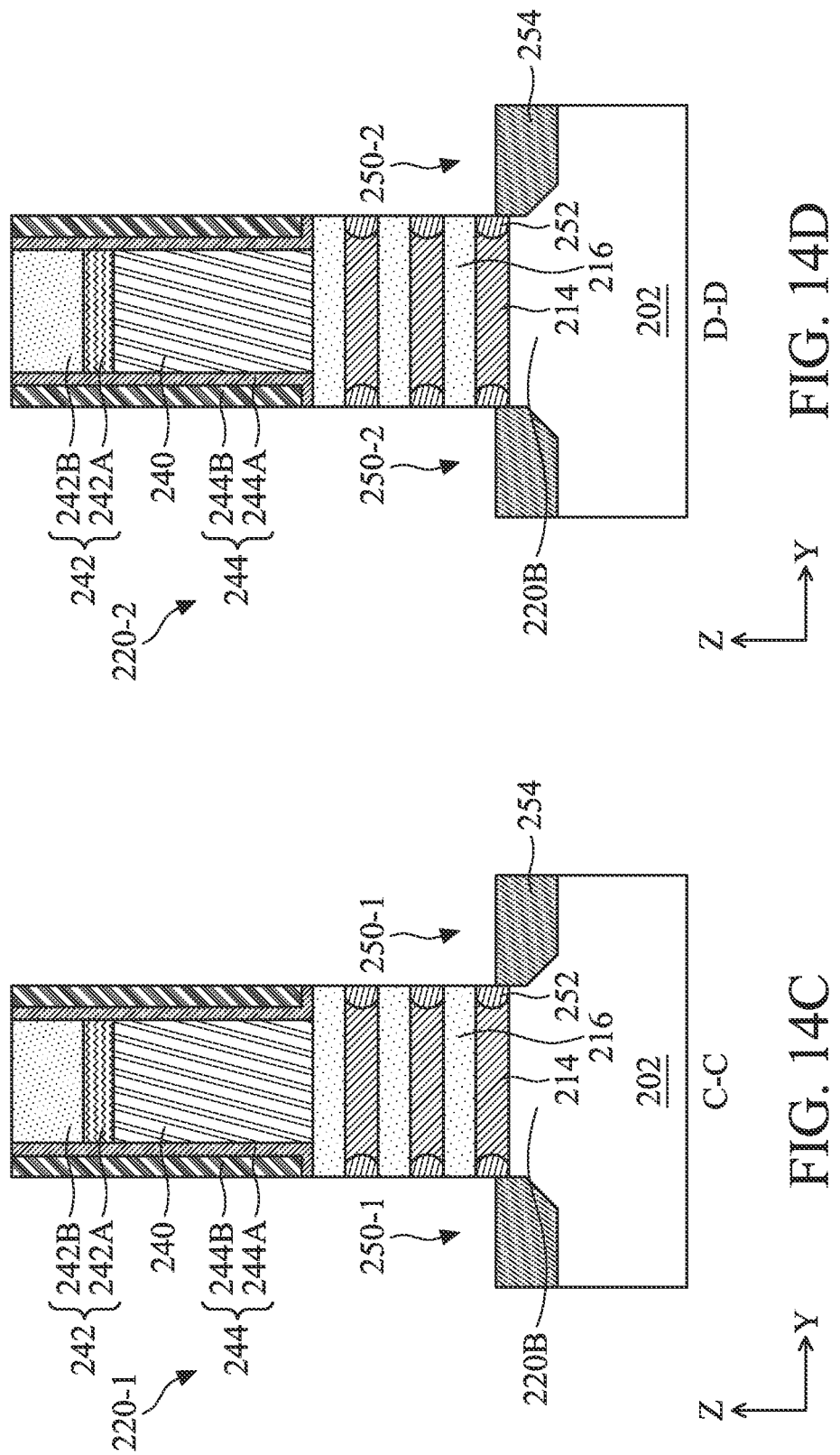

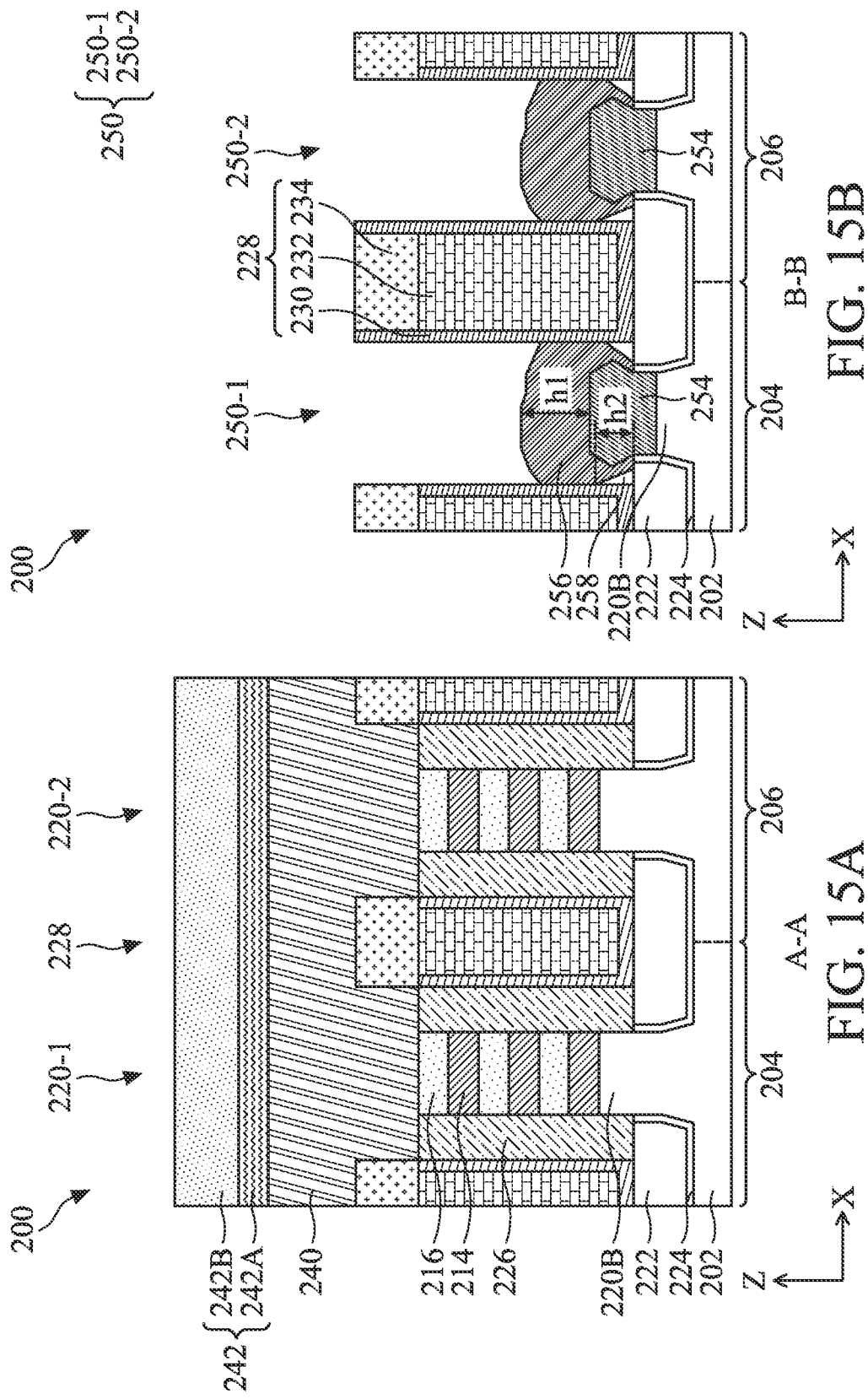

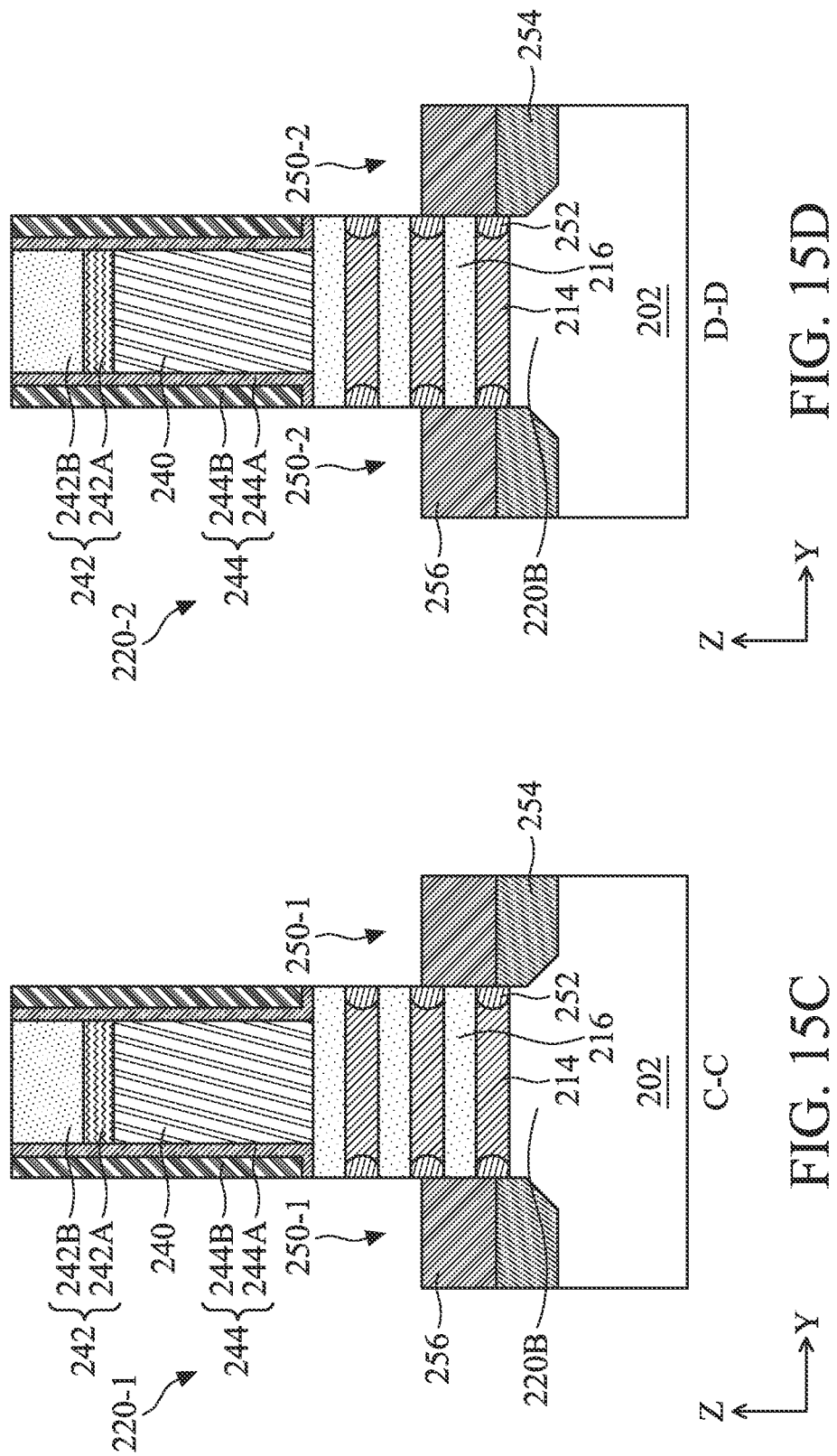

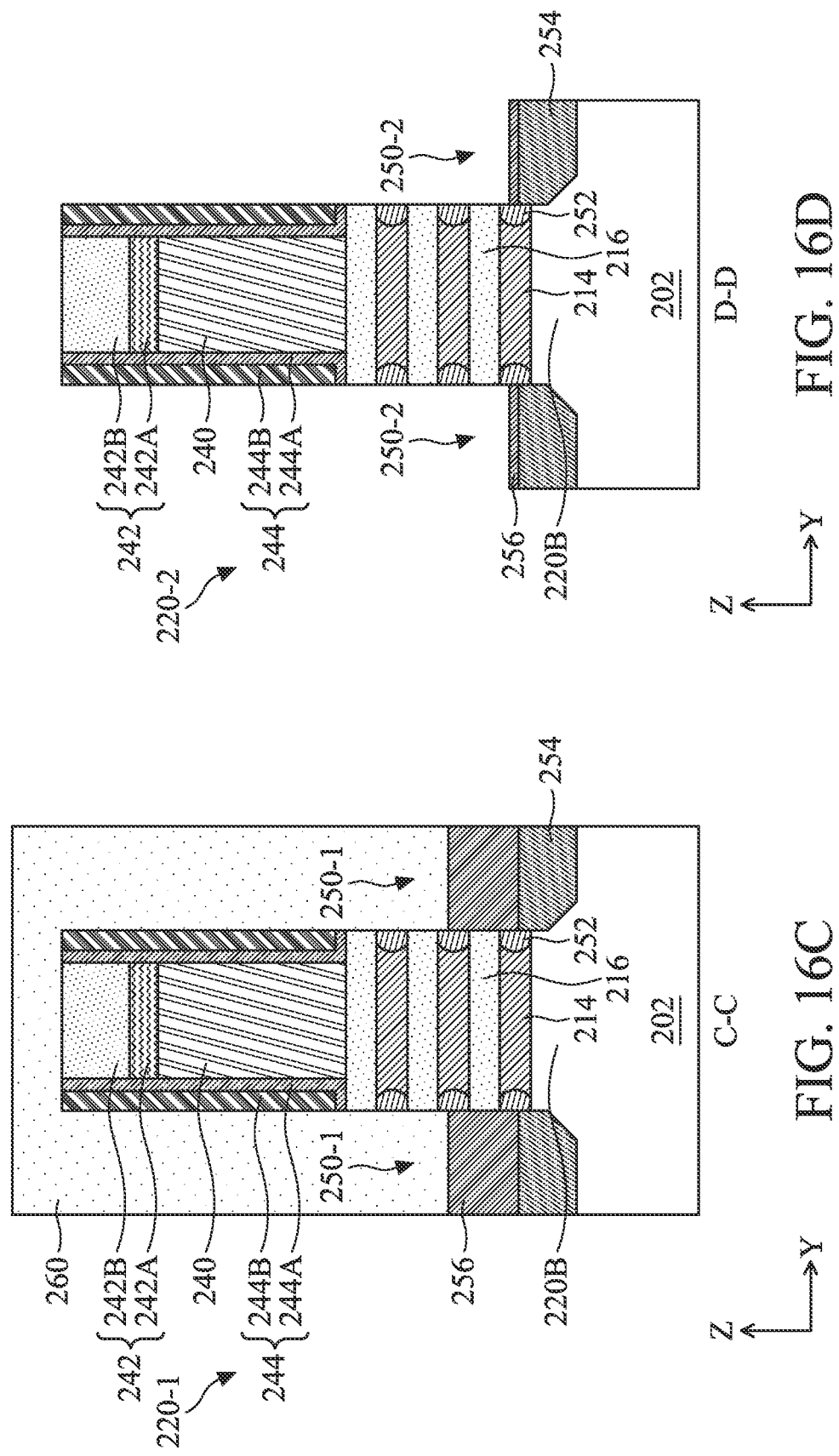

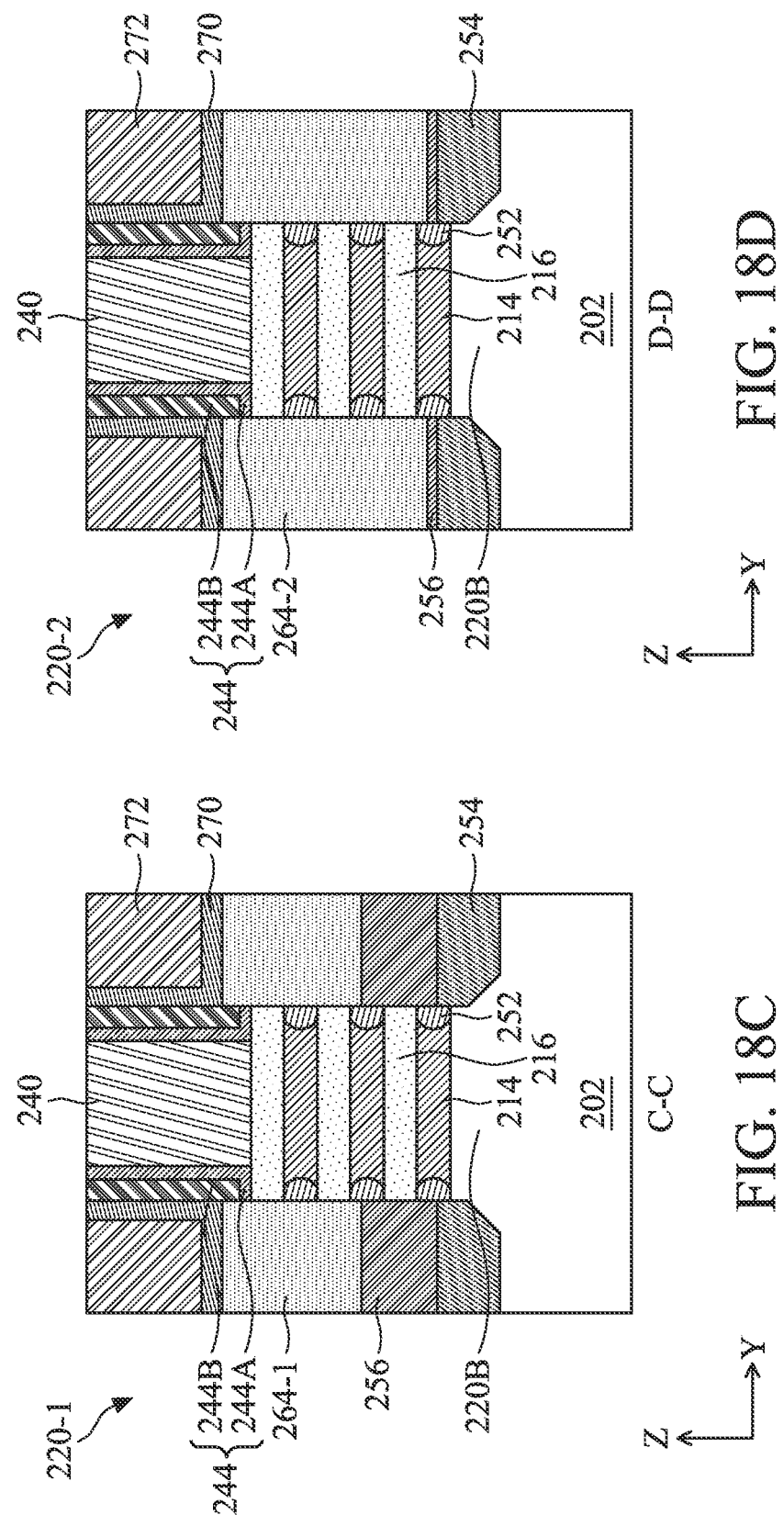

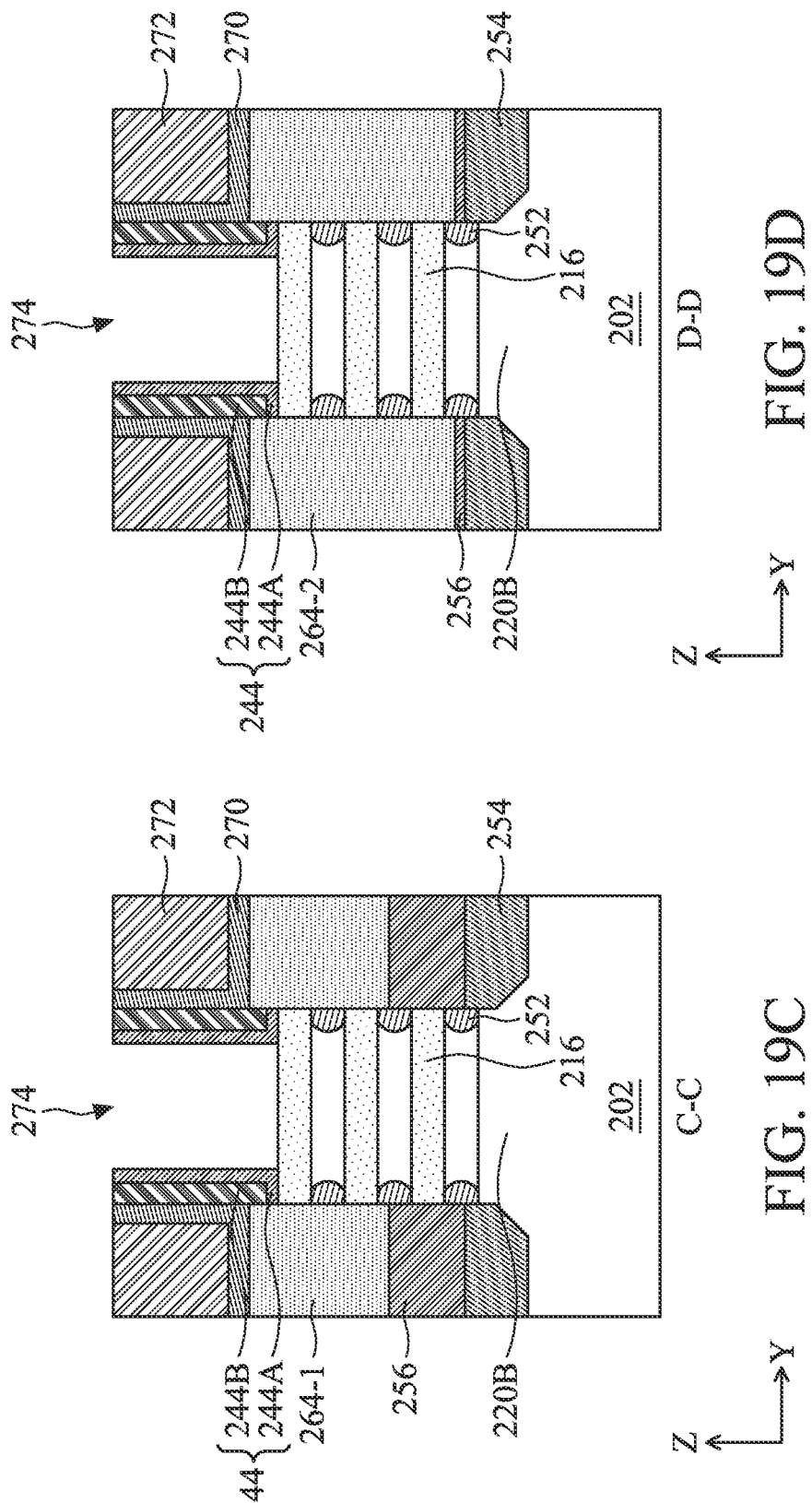

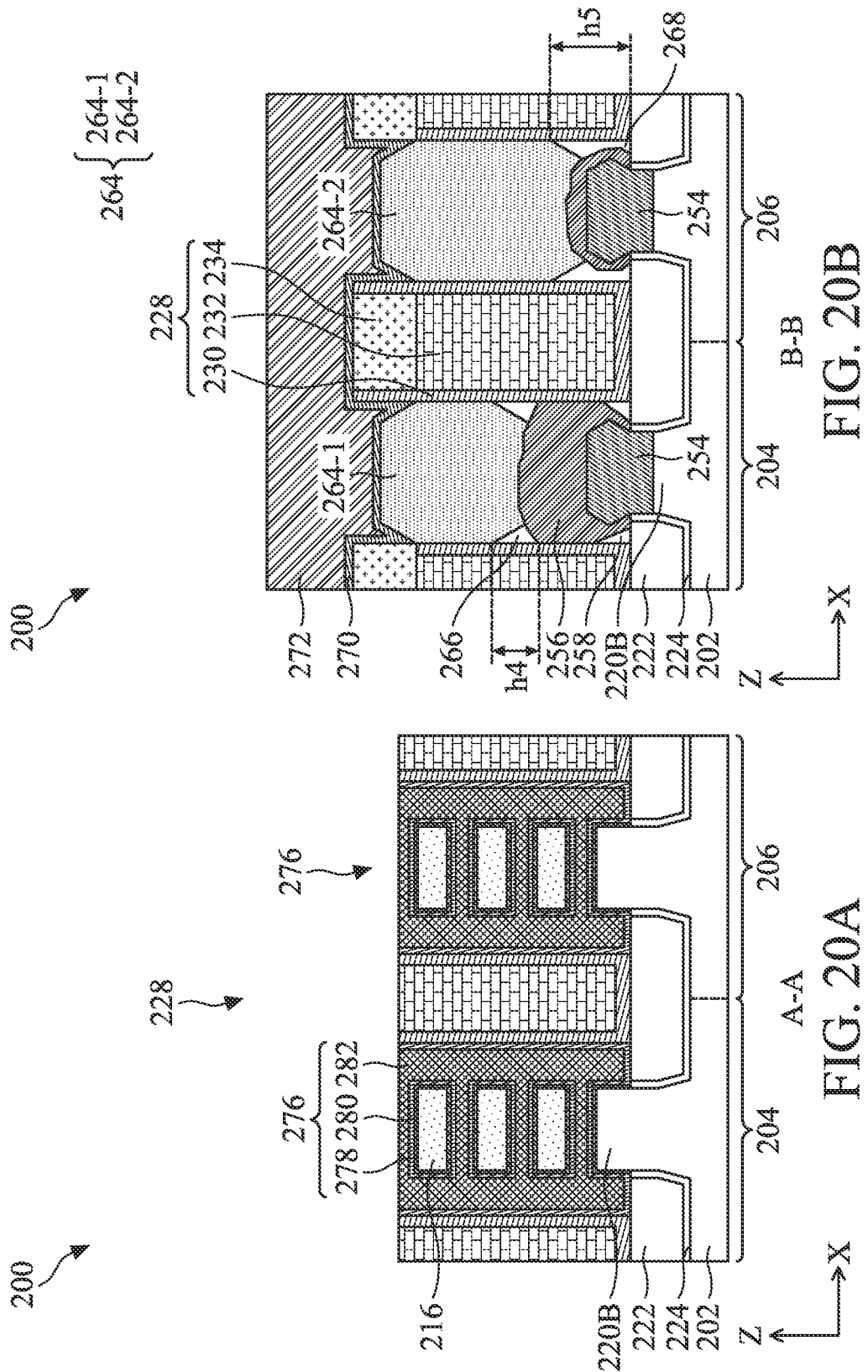

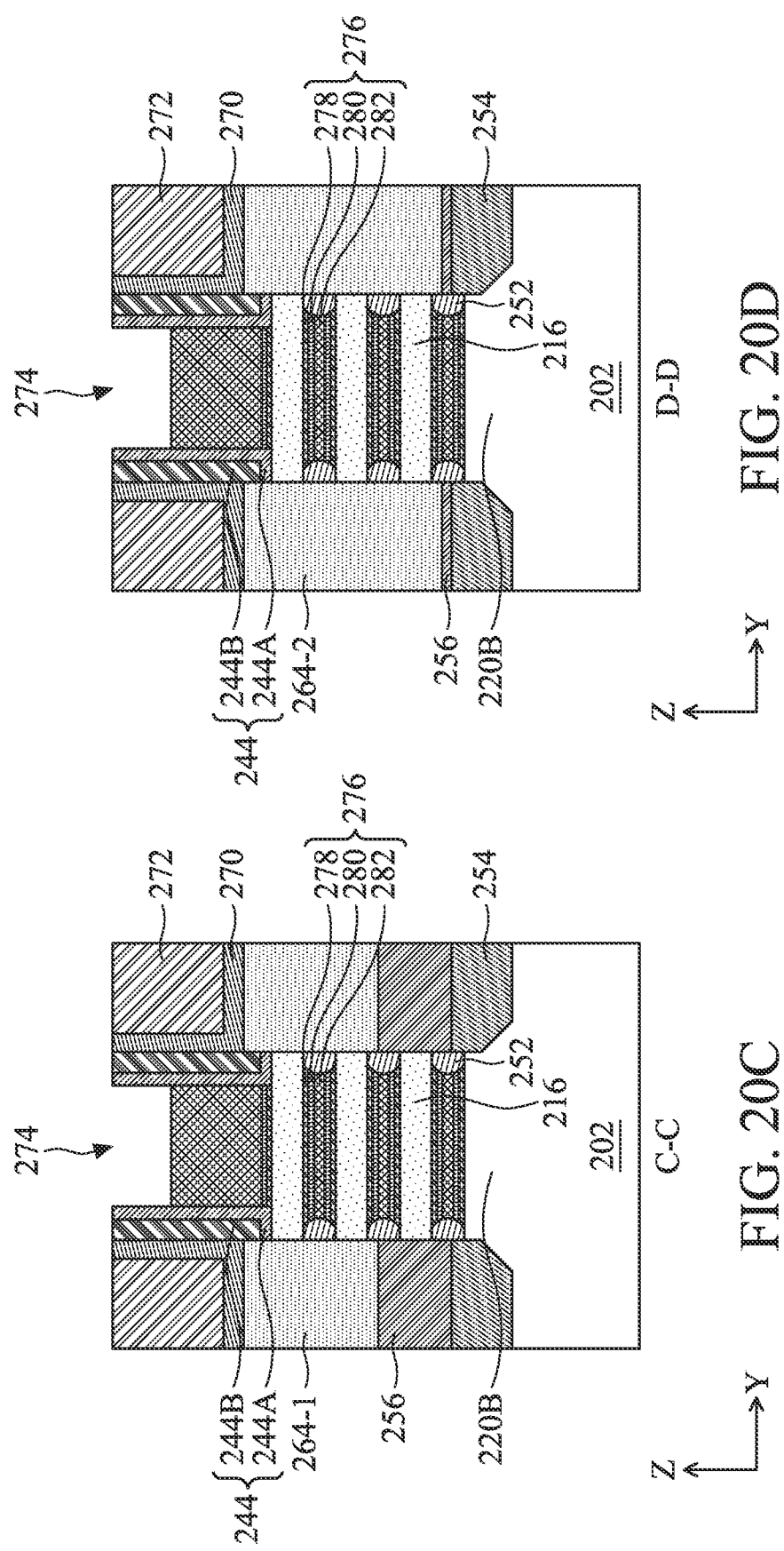

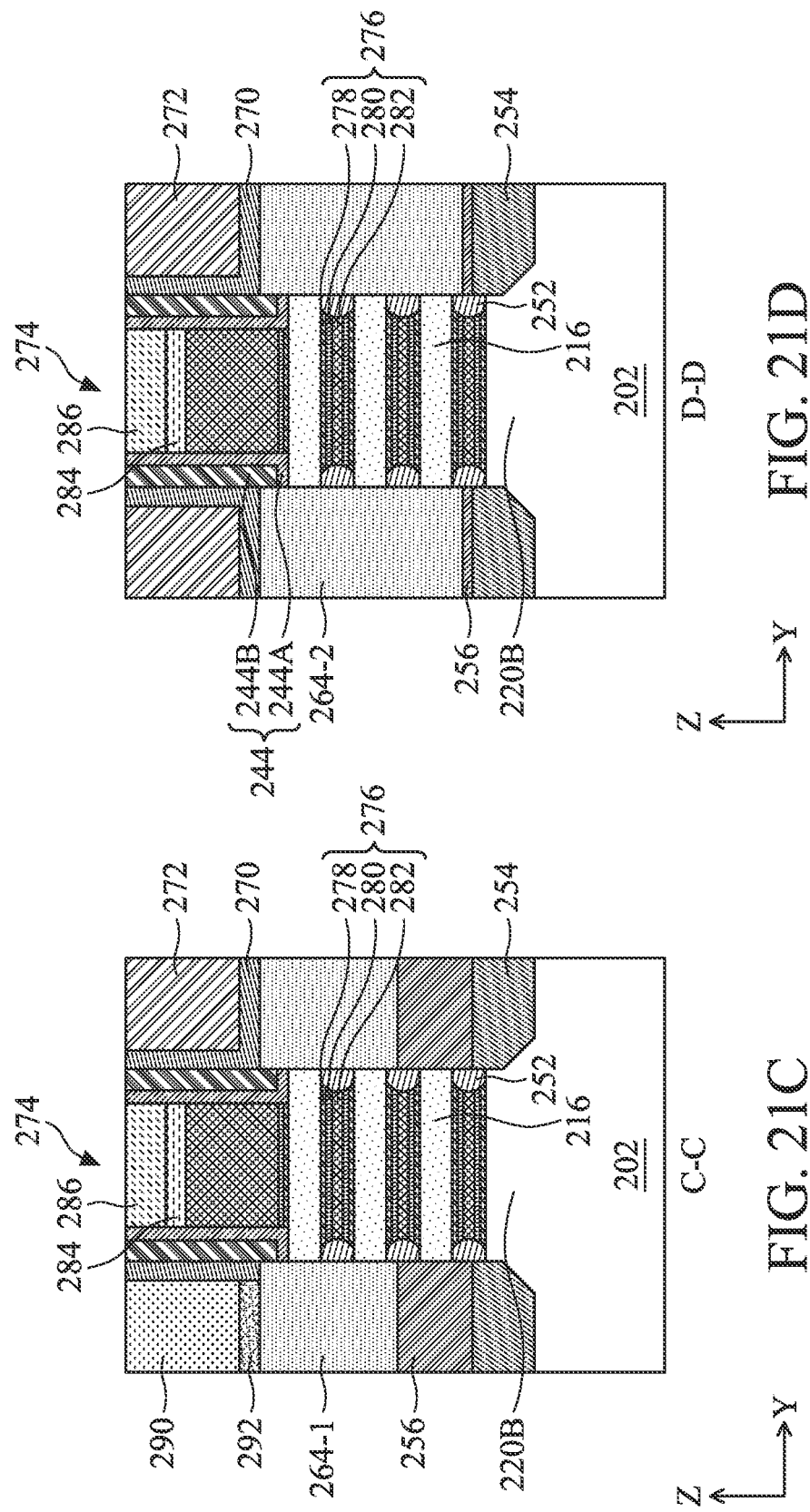

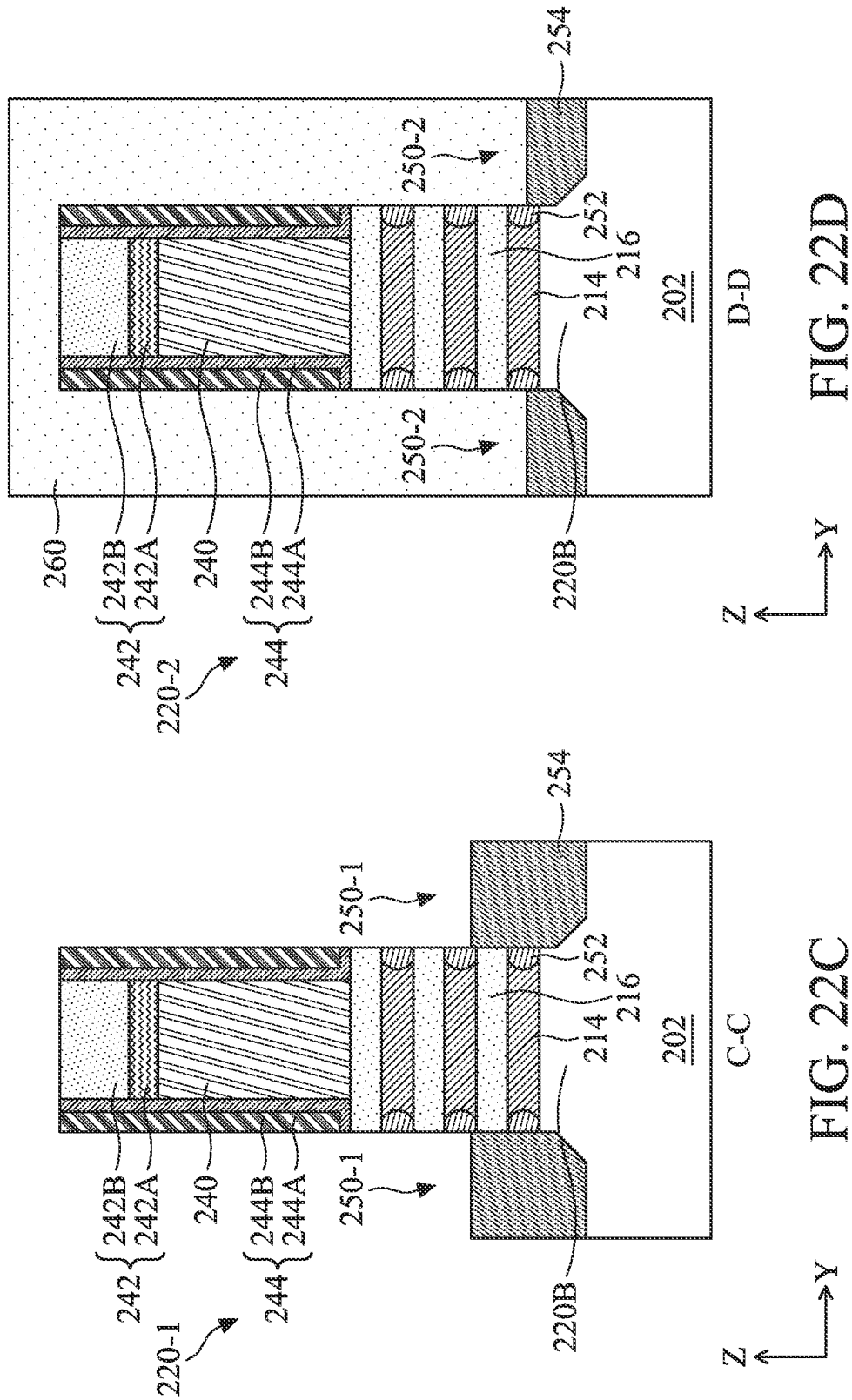

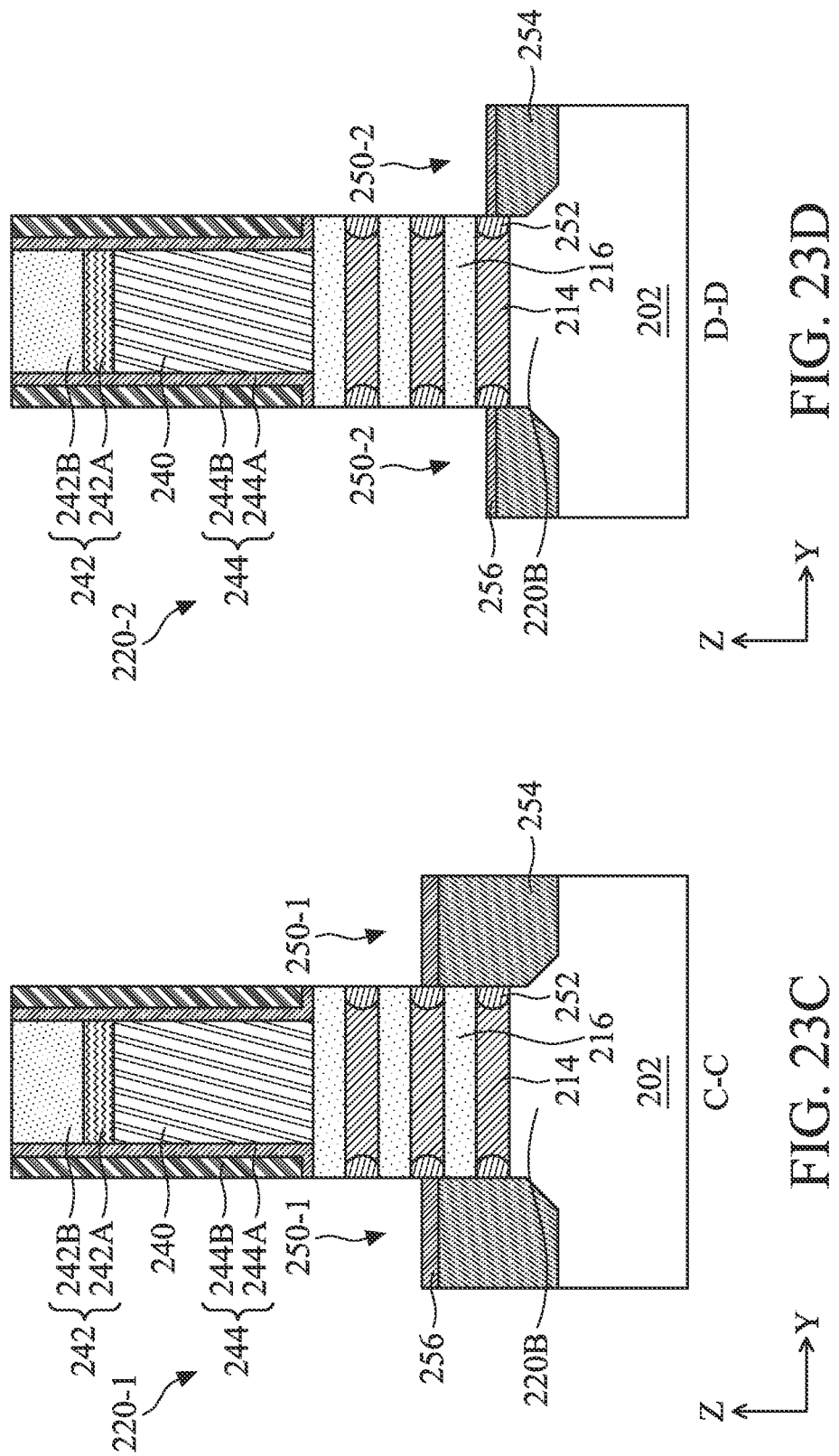

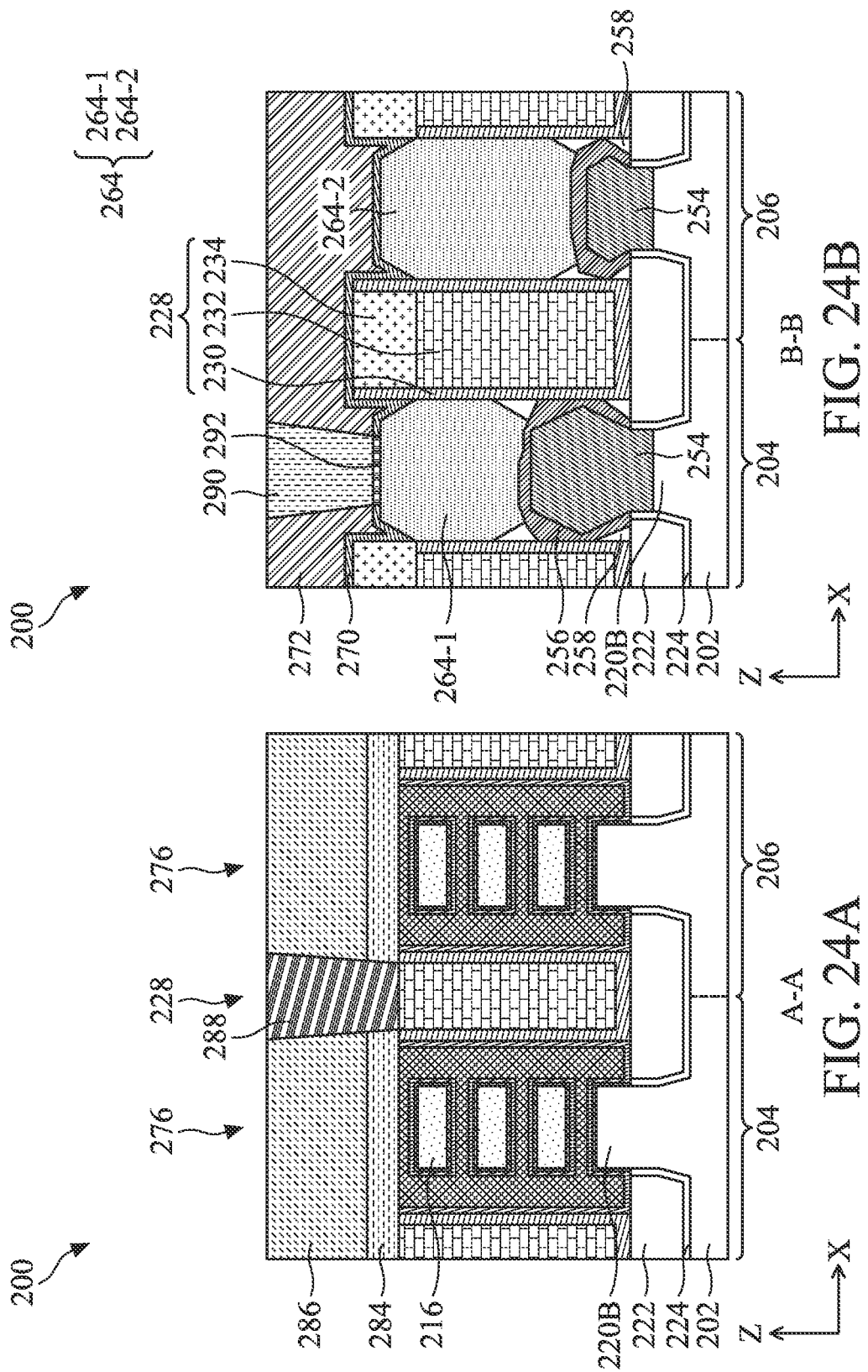

SEMICONDUCTOR DEVICE WITH TUNABLE CHANNEL LAYER USAGE AND METHODS OF FABRICATION THEREOF

PRIORITY DATA

This application claims priority to U.S. Provisional Patent Application No. 63/289,493, filed on Dec. 14, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structure which can extend around the channel region providing access to the stacked semiconductor channel layers on four sides. Compared to planar transistors, such configuration provides better control of the channel and drastically reduces SCEs (in particular, by reducing sub-threshold leakage). The number of stacked semiconductor channel layers is chosen based on device performance considerations, particularly current driving capability of the transistors.

IC devices include transistors that serve different functions, such as input/output (I/O) functions and core functions. These different functions require the transistors to have different constructions. At the same time, it is advantageous to have similar processes and similar process windows to fabricate these different transistors to reduce cost and improve yield. Although existing GAA transistors and processes are generally adequate for their intended purposes, they have not been entirely satisfactory in every aspect. For example, in an IC chip, there are different regions serving different functions, such as high-power regions for high performance computing (HPC) unit or central processing unit (CPU), which requires GAA transistors with strong current driving capability to achieve high operating speed, and low-power regions for I/O or system-on-a-chip (SoC) unit, which requires GAA transistors with less current driving capability to achieve low-leakage performance. Accordingly, a need of the number of stacked semiconductor channel layers in GAA transistors in different regions may be different in one IC chip. Therefore, in the course of IC evolution, how to achieve tunable numbers of stacked semiconductor channel layers suiting different applications on one chip is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 22A, 22B, 22C, 22D, 23A, 23B, 23C, 23D, 24A, 24B, 24C, and 24D illustrate cross-sectional views of a semiconductor structure during a fabrication process according to the embodiments of the method of FIGS. 1A and 1B, according to one or more aspects of the present disclosure.

DETAILED DESCRIPTION

Figure 1A:
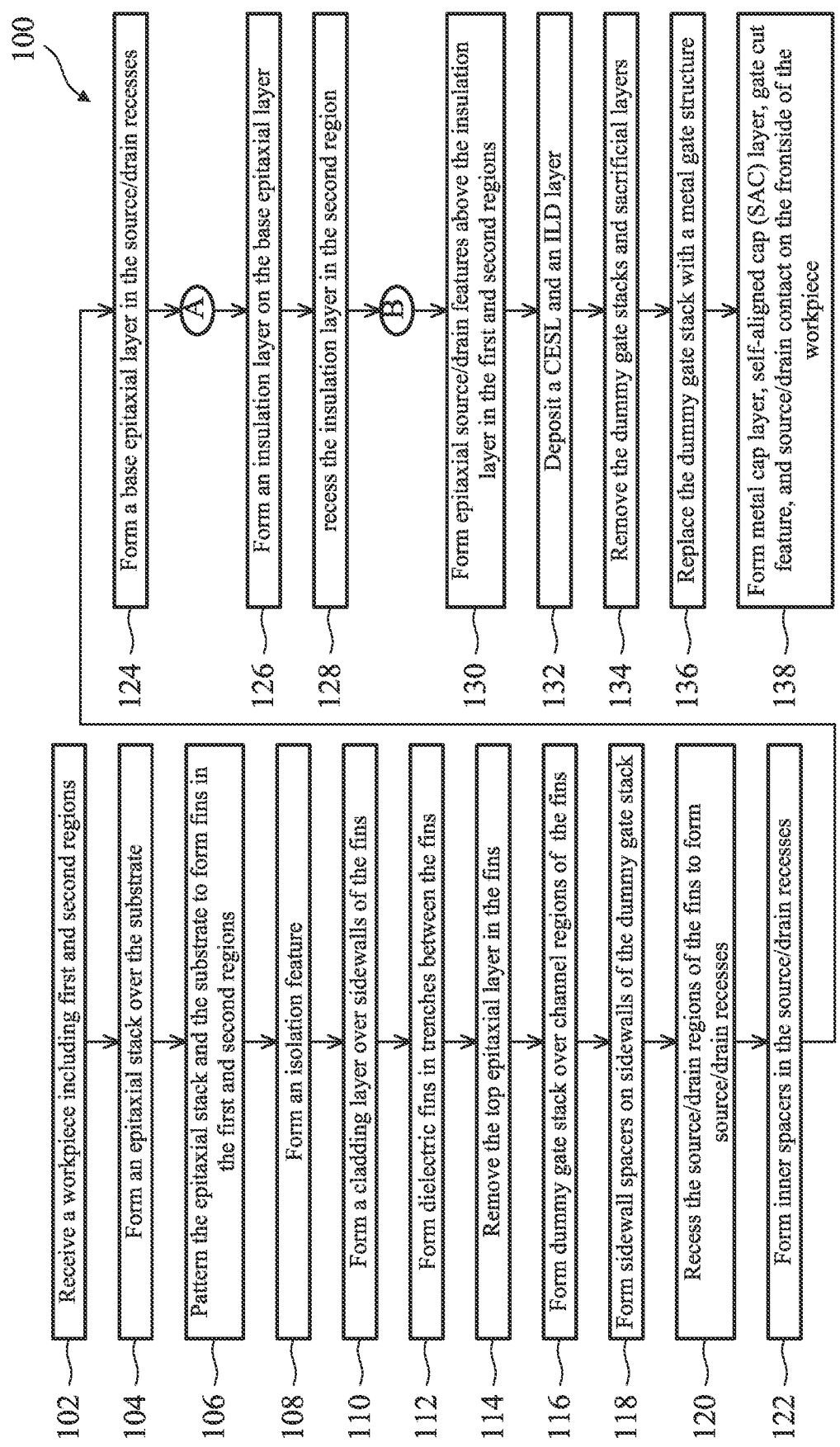
FIG. 1A shows a flow chart of an embodiment of a method for forming multi-gate devices, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

This application generally relates to semiconductor structures and fabrication processes, and more particularly to integrate circuit (IC) chips having multi-gate transistors with tunable numbers of stacked semiconductor channel layers in different regions suiting different applications on one chip. A multi-gate transistor generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. In various embodiments, at least two gate-all-around (GAA) transistors with different (also referred to tunable or varying) numbers of stacked semiconductor channel layers (also referred to as channel layers) on the same substrate are placed in a core area (e.g., for high-power applications) and an I/O area (for low-leakage applications) of one IC chip, respectively. The tunable numbers of stacked channel layers can be achieved by isolating one or more bottom channel layers from contacting epitaxial source/drain (S/D) features, according to various aspects of the present disclosure.

The details of the structure and fabrication methods of the present disclosure are described below in conjunction with the accompanied drawings, which illustrate a process of making GAA devices, according to some embodiments. A GAA device has vertically-stacked horizontally-oriented channel layers. The channel layer may be referred to as "nanostructure" or "nanosheet," which is used herein to designate any material portion with nanoscale, or even microscale dimensions, and having an elongate shape, regardless of the cross-sectional shape of this portion. Thus, the term "nanostructure" or "nanosheet" as used herein designates both circular and substantially circular cross-section elongate material portions, and beam or bar-shaped material portions including for example a cylindrical in shape or substantially rectangular cross-section. GAA devices are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as other types of MBC transistors) for carrying out the same purposes and/or achieving the same advantages of the embodiments introduced herein.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing an insulation layer interposing the epitaxial source/drain features and one or more bottom channel layers to adjust the number of available functional channel layers. The insulation layer also interposes the epitaxial source/drain features and the semiconductor substrate thereunder. A gate structure extending around the stacked channel layers also directly engages a top surface of a semiconductor substrate under the bottommost channel layer, which may cause leakage current flowing into the semiconductor substrate. The insulation layer also assists in suppressing the leakage current.

Figure 1B:
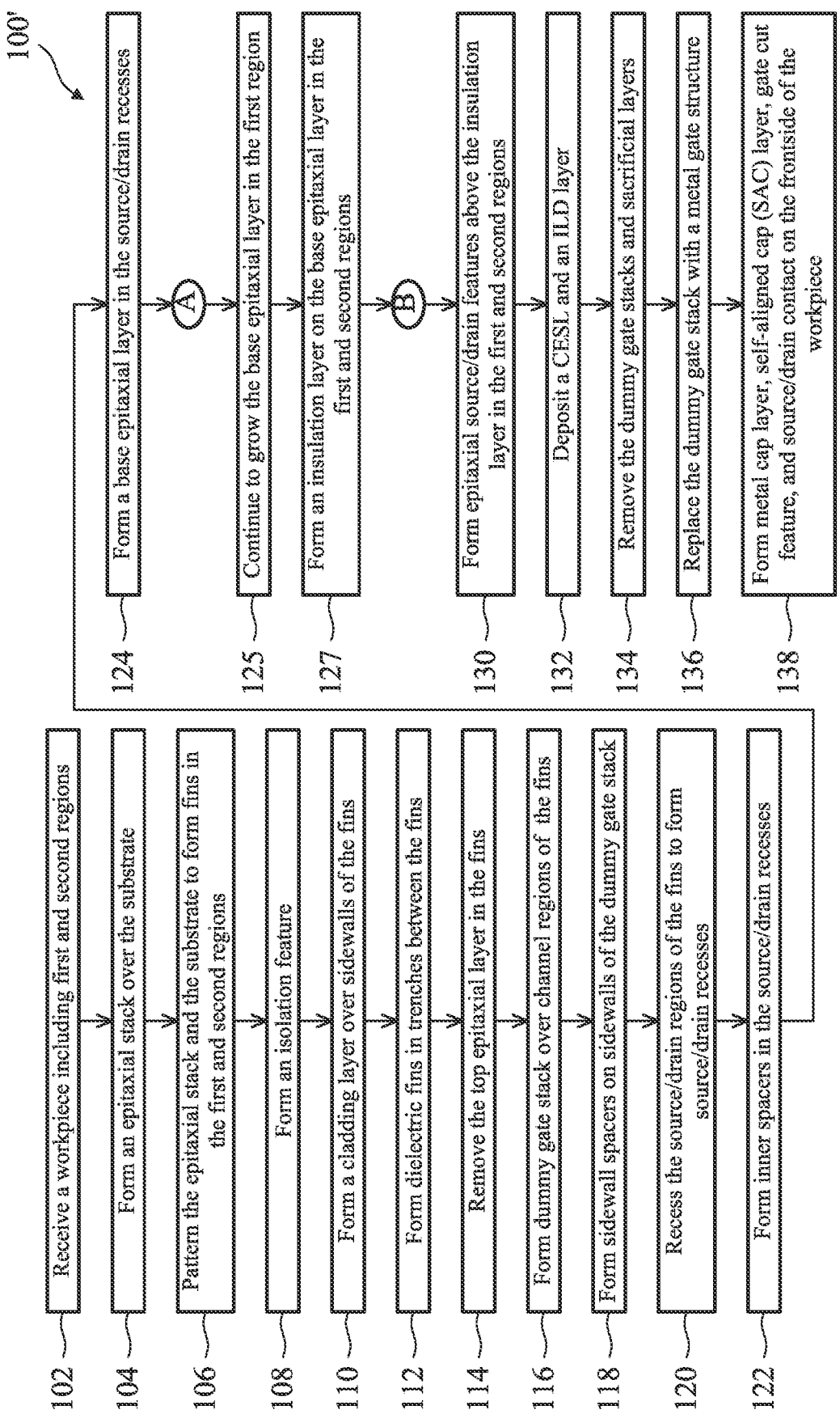
FIG. 1B shows a flow chart of an alternative embodiment of the method for forming multi-gate devices, according to one or more aspects of the present disclosure.
Figure 2:
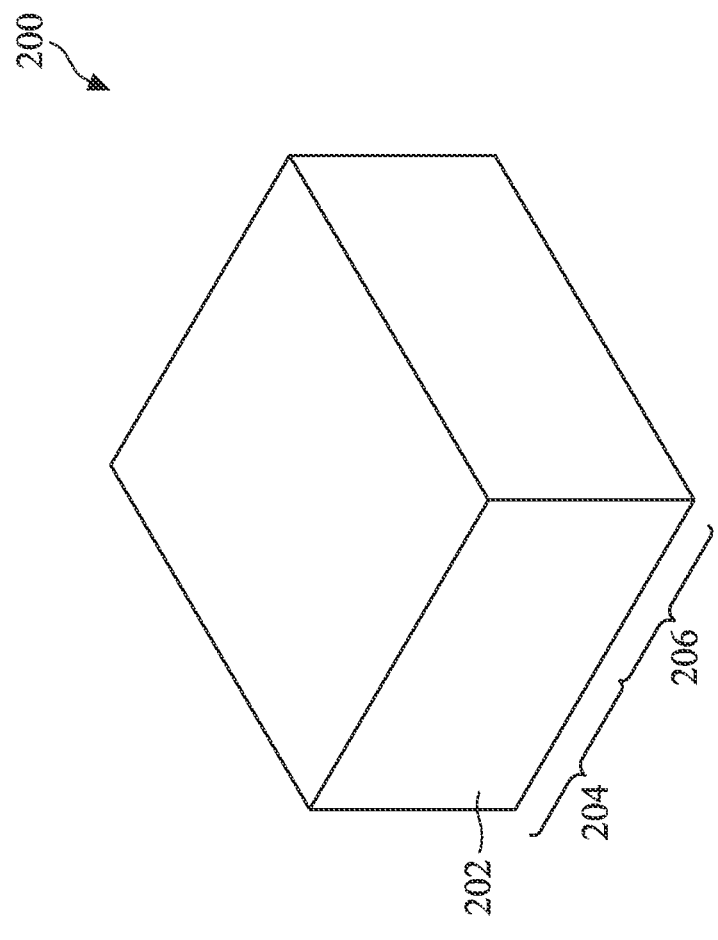
FIGS. 2, 3, and 4 illustrate perspective views of a semiconductor structure during a fabrication process according to embodiments of the method of FIGS. 1A and 1B, according to one or more aspects of the present disclosure.
Figure 3:
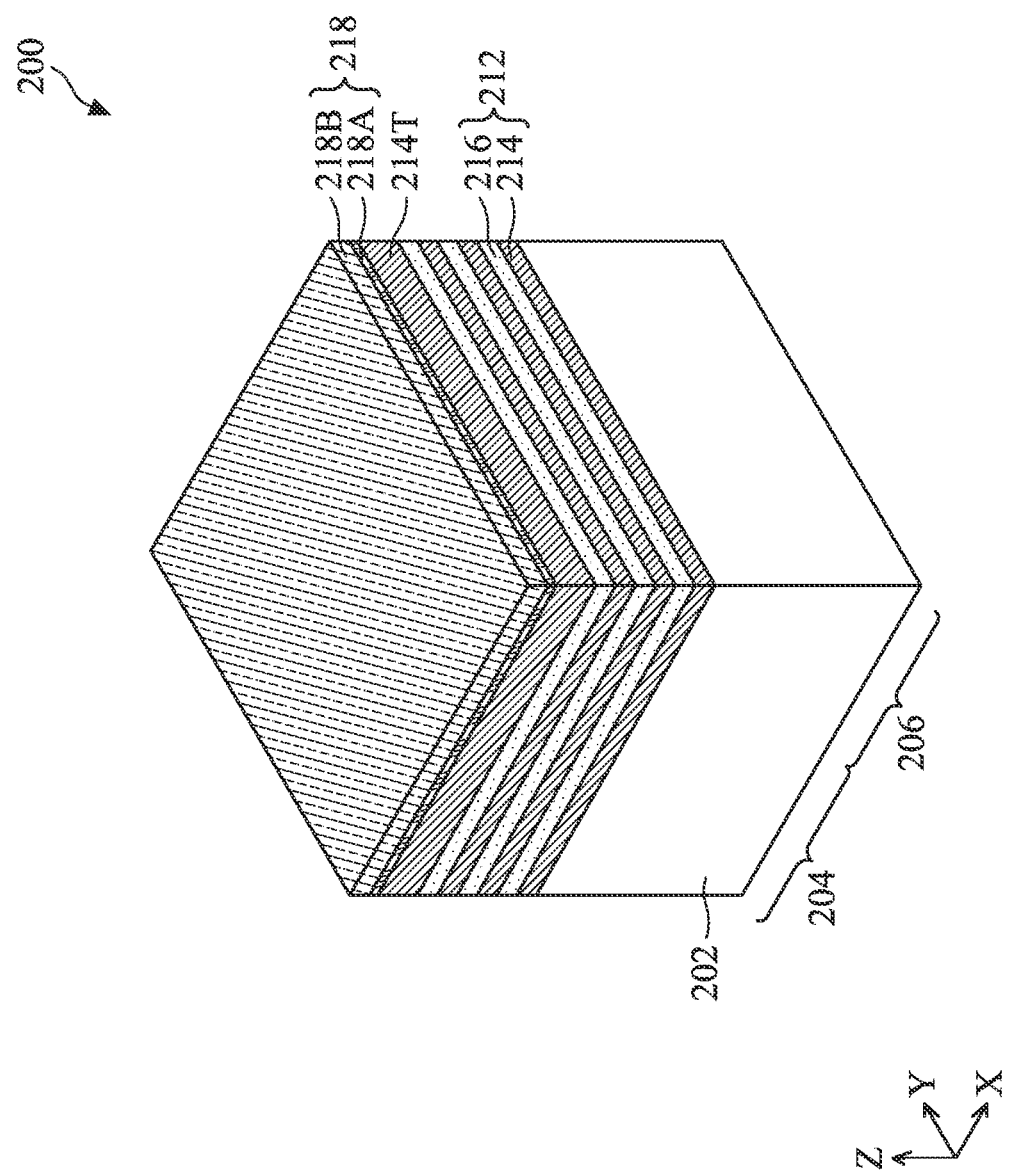
Figure 4:
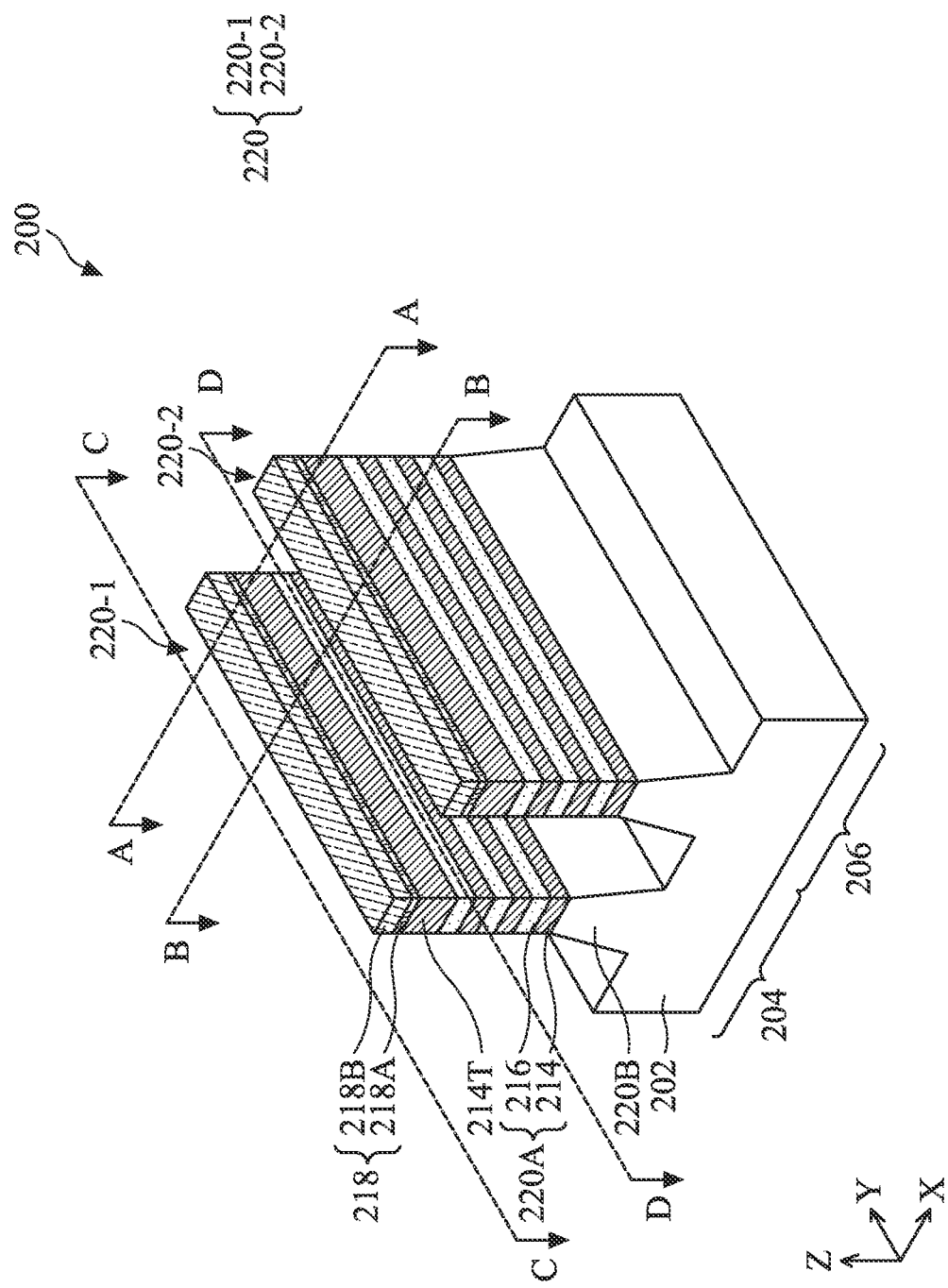

The various aspects of the present disclosure will now be described in more detail with reference to the figures. FIGS. 1A and 1B illustrate flowcharts of a method 100 and an alternative method 100', respectively, for forming a semiconductor device. Each method is merely an example and is not intended to limit the present disclosure to what is explicitly illustrated in the method. Additional steps may be provided before, during and after the respective method, and some steps described can be replaced, eliminated, or moved around for additional embodiments of the respective method. Not all steps are described herein in detail for reasons of simplicity. The methods 100 and 100' are described below in conjunction with FIGS. 2-24D, which illustrate diagrammatic perspective views and fragmentary cross-sectional views of a workpiece 200 at different stages of fabrication according to embodiments of the methods 100 and 100'. Because a semiconductor device will be formed from the workpiece 200, the workpiece 200 may be referred to as a semiconductor device 200 or a device 200 as the context requires. FIGS. 2-4 are diagrammatic perspective views of the workpiece 200 at various stages of fabrication according to some embodiments. Among FIGS. 5A-24D, for better illustration of various aspects of the present disclosure, each of the figures ending with the capital letter A illustrates a fragmentary cross-sectional view in a channel region (i.e., as illustrated in FIG. 4, a cut along A-A line in a channel region along a lengthwise direction of gate structures and perpendicular to a lengthwise direction of channel layers) of the to-be-formed transistor(s). Each of the figures ending with the capital letter B illustrates a fragmentary cross-sectional view of a source/drain region (i.e., as illustrated in FIG. 4, a cut along B-B line in a source/drain region that is perpendicular to the lengthwise direction of channel layers) of the to-be-formed transistor(s). Each of the figures ending with the capital letter C illustrates a fragmentary cross-sectional view along a first fin in a first region (i.e., as illustrated in FIG. 4, a cut along C-C line along a first fin in a first region). Each of the figures ending with the capital letter D illustrates a fragmentary cross-sectional view along a second fin in a second region (i.e., as illustrated in FIG. 4, a cut along D-D line along a second fin in a second region). Throughout FIGS. 2-24D, the X direction, the Y direction, and the Z direction are perpendicular to one another and are used consistently. Additionally, throughout the present disclosure, like reference numerals are used to denote like features. Embodiments of the present disclosure are described using an MBC transistor structure, particularly, a GAA transistor structure, which is for illustration purpose only and should not be construed as limiting the scope of the present disclosure; for example, the present disclosure may also be applicable to other multi-gate devices, including FinFET transistors.

Referring to FIGS. 1A and 2, the method 100 includes a block 102 where a workpiece 200 is received. The workpiece 200 includes a substrate 202. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various layers, including conductive or insulating layers formed on a semiconductor substrate. The substrate 202 includes a first region 204 and a second region 206. The first region 204 may be an I/O area that includes I/O cells, ESD cells, and other circuits. Transistors formed in the first region 204 are for low-power and/or low-leakage applications. The second region 206 may be a core area that includes high performance computing (HPC) unit, central processing unit (CPU) logic circuits, memory circuits, and other core circuits. Transistors formed in the second region 206 are for high-power and/or high-speed applications. Generally, transistors in the second region 206 due to their power-hungry applications need stronger current driving capability than transistors in the first region 204. Notably, although in the illustrate embodiment, the regions 204 and 206 are depicted as adjacent to each other, it is for illustrative purposes only. In various embodiments, the regions 204 and 206 may be adjacent to each other or separated from one another with one or more other regions disposed therebetween, so are the transistors formed in the regions 204 and 206.

Referring to FIG. 3, the method 100 includes a block 104 (FIG. 1A) where one or more epitaxial layers are formed over the substrate 202. In some embodiments, an epitaxial stack 212 is formed over the regions 204 and 206. The epitaxial stack 212 includes epitaxial layers 214 of a first composition interposed by epitaxial layers 216 of a second composition, and a top epitaxial layer 214T of the first composition over the top epitaxial layer 216. The first and second composition can be different. In an embodiment, the epitaxial layers 214 are silicon germanium (SiGe) and the epitaxial layers 216 are silicon (Si). However, other embodiments are possible including those that provide for a first composition and a second composition having different oxidation rates and/or etch selectivity. It is noted that three (3) layers of each of the epitaxial layers 214 and 216 are illustrated in FIG. 3, which is for illustrative purposes only and not intended to be limiting beyond what is specifically recited in the claims. It can be appreciated that any number of epitaxial layers can be formed in the epitaxial stack 212; the number of epitaxial layers depending on the desired number of channel layers for forming transistors. In some embodiments, the number of epitaxial layers 216 is between 2 and 10.

In some embodiments, the epitaxial layer 214 has a thickness ranging from about 8 nm to about 12 nm. The epitaxial layers 214 may be substantially uniform in thickness. In some embodiments, the epitaxial layer 216 has a thickness ranging from about 8 nm to about 10 nm. In some embodiments, the epitaxial layers 216 may be substantially uniform in thickness. As described in more detail below, the epitaxial layers 216 may serve as channel layers (or channel members) for subsequently-formed GAA transistors and its thickness is chosen based on device performance considerations. The epitaxial layers 214 may serve to reserve a spacing (or referred to as a gap) between adjacent channel layers and its thickness is chosen based on device performance considerations. The epitaxial layers 214 would be subsequently removed and may also be referred to as the sacrificial layers 214. Like the epitaxial layers 214, the top epitaxial layer 214T may be formed of silicon germanium (SiGe). The top epitaxial layer 214T may be thicker than the epitaxial layers 214 and function to protect the epitaxial stack 212 from damages during fabrication processes. In some instances, a thickness of the top epitaxial layer 214T may be between about 20 nm and about 40 nm.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the epitaxial layers 216, include the same material as the substrate 202, such as silicon (Si). In some embodiments, compositions of the top epitaxial layer 214T and the epitaxial layers 214 are substantially the same. In some embodiments, the epitaxial layers 214 and 216 include a different material than the substrate 202. As stated above, in at least some examples, the epitaxial layer 214 includes an epitaxially grown $Si_{1-x}Ge_x$ layer (e.g., x is about 25~55%) and the epitaxial layer 216 includes an epitaxially grown Si layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation and etch selectivity properties. In various embodiments, the epitaxial layers 214 and 216 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

Further, a mask layer 218 is formed over the epitaxial stack 212. In some embodiments, the mask layer 218 includes a first mask layer 218A and a second mask layer 218B. The first mask layer 218A is a pad oxide layer made of silicon oxide, which can be formed by a thermal oxidation process. The second mask layer 218B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Referring to FIG. 4 and FIGS. 5A-5D, the method 100 includes a block 106 (FIG. 1A) where the epitaxial stack 212 are patterned to form a first semiconductor fin 220-1 in the first region 204 and a second semiconductor fin 220-2 in the second region 206 (collectively referred to as fins 220), as shown in FIG. 4 and FIGS. 5A-5D. In various embodiments, each of the fins 220 includes an upper portion 220A (also termed as epitaxial portion 220A) of the interleaved epitaxial layers 214/216 and the top epitaxial layer 214T, and a base portion 220B that is formed by patterning a top portion of the substrate 202. The base portion 220B still has a fin-shape protruding from the substrate 202 and is also termed as the fin-shape base 220B. The mask layer 218 is patterned into a mask pattern by using patterning operations including photolithography and etching. In some embodiments, operations at the block 106 patterns the epitaxial stack 212 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into fins 220 with trenches between adjacent fins. Each of the fins 220 protrudes upwardly in the Z-direction from the substrate 202 and extends lengthwise in the Y-direction. In FIG. 4, two (2) fins 220 are spaced apart along the X-direction with one fin disposed above the first region 204 and one fin disposed above the second region 206. But the number of the fins is not limited to two, and may be as small as one or more than two. Notably, although in the illustrate embodiment, the two fins 220 are depicted as adjacent to each other, it is for illustrative purposes only. In various embodiments, the fins 220 may be adjacent to each other or separated from one another with other fins disposed therebetween.

Figure 6C:
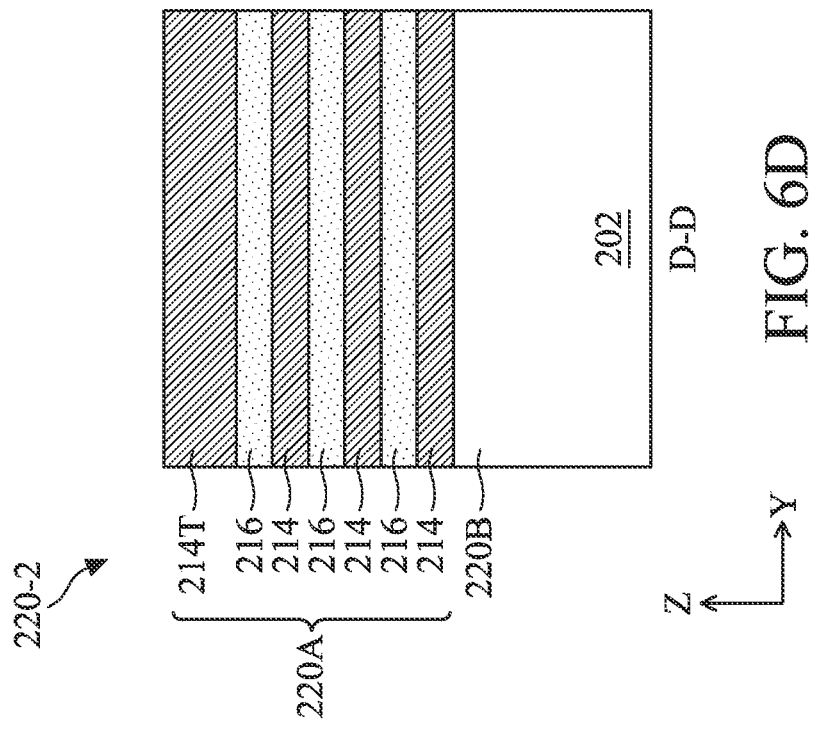
Figure 6D:
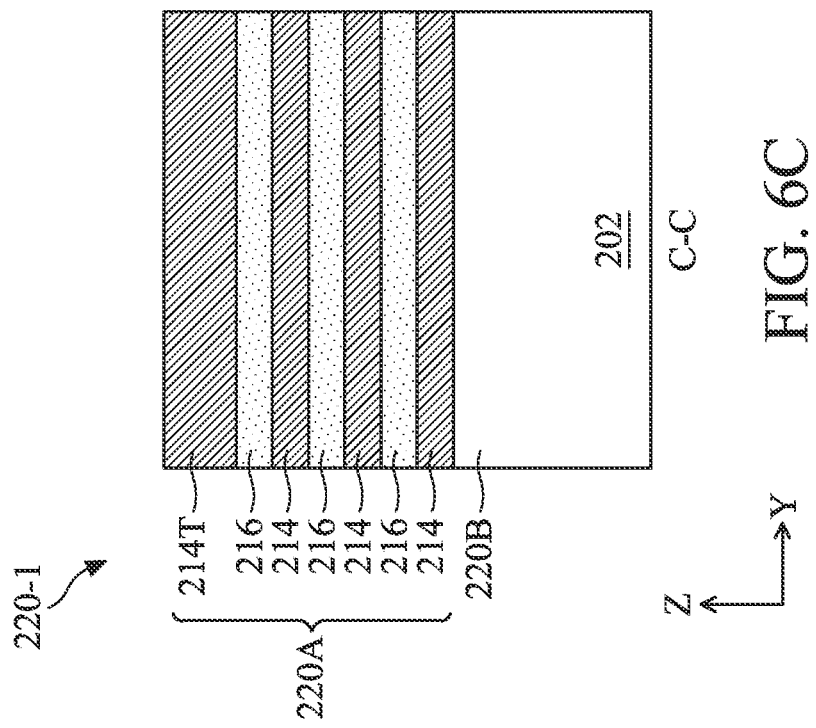
Figure 7D:
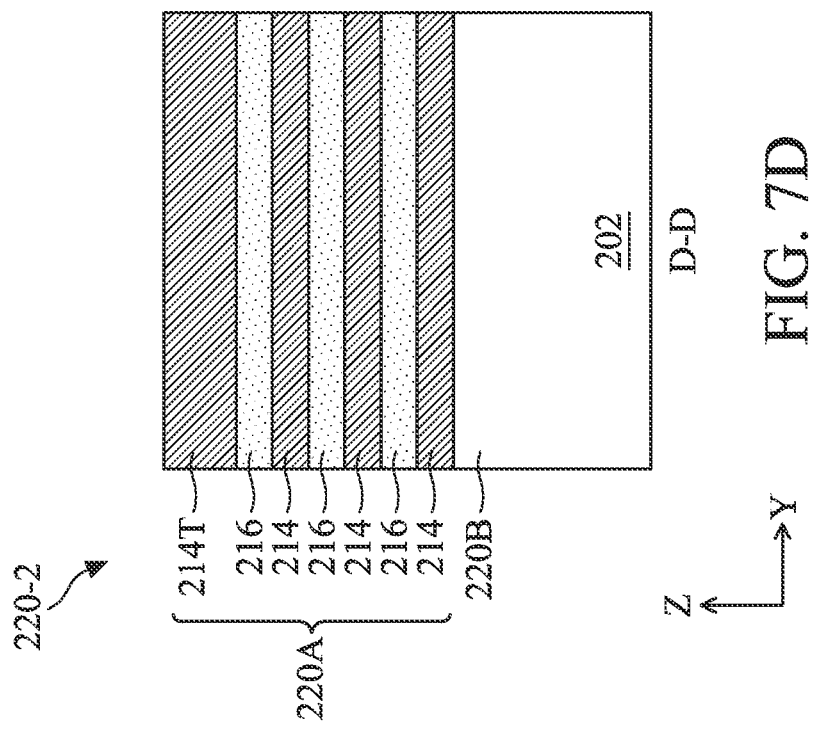
Figure 7C:
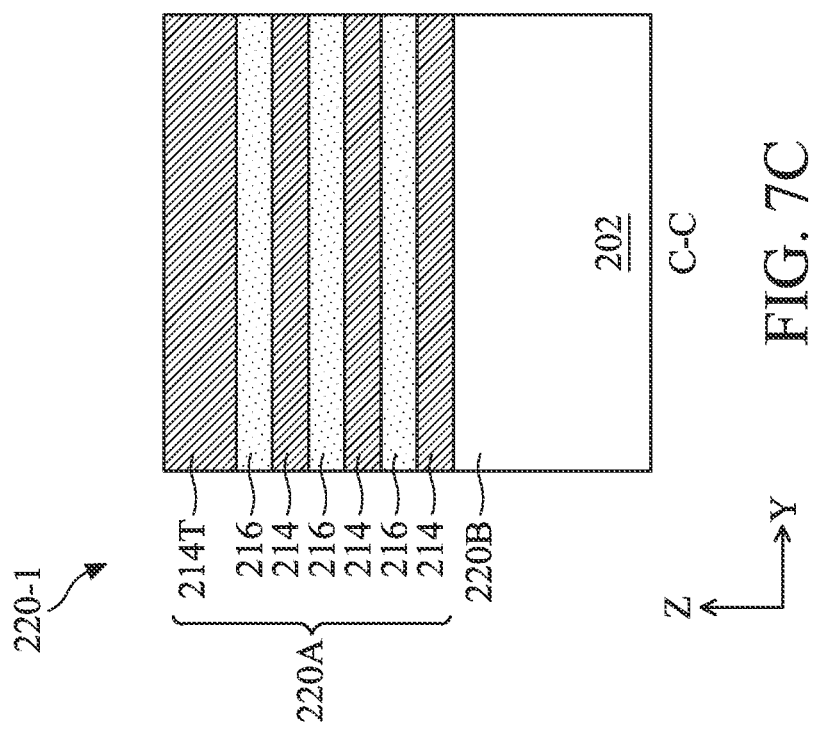

Referring to FIGS. 6A-6D, the method 100 includes a block 108 (FIG. 1A) where the trenches between adjacent fins 220 are filled with a dielectric material to form an isolation feature 222. The isolation feature 222 may include one or more dielectric layers. Suitable dielectric materials for the isolation feature 222 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. Then, a planarization operation, such as a chemical mechanical polishing (CMP) method, is performed such that the upper surface of the top epitaxial layer 214T is exposed from the isolation feature 222. Operations at the block 108 subsequently recesses the isolation features 222 to form shallow trench isolation (STI) features (also denoted as STI features 222). Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220. In the illustrated embodiment, the mask layer 218 is removed by a CMP process performed prior to the recessing of the isolation features 222. In some embodiments, the mask layer 218 is removed by an etchant used to recess the isolation features 222. In the illustrated embodiment, the STI feature 222 is disposed on sidewalls of the fin-shape base 220B. A top surface of the STI feature 222 may be coplanar with a bottom surface of the epitaxial portion 220A (or a top surface of the fin-shape base 220B) or below the bottom surface of the epitaxial portion 220A (or the top surface of the fin-shape base 220B) for about 1 nm to about 10 nm. In some embodiments, a liner layer 223 is blanket deposited over the fins 220 before depositing the isolation feature 222. In some embodiments, the liner layer 223 is made of SiN or a silicon nitride-based material (e.g., SiON, SiCN or SiOCN). Then, as shown in FIGS. 6A and 6B, liner layer 223 is recessed so that the epitaxial portion 220A (and a top portion of the fin-shape base 220B in the illustrated embodiment) of the fins 220 are exposed.

Referring to FIGS. 7A-7D, the method 100 includes a block 110 (FIG. 1A) where a cladding layer 226 is deposited on sidewalls of the fins 220. In some embodiments, the cladding layer 226 may have a composition similar to that of the epitaxial layers 214 or the top epitaxial layer 214T. In one example, the cladding layer 226 may be formed of silicon germanium (SiGe). Their common composition allows selective and simultaneous removal of the epitaxial layers 214 and the cladding layer 226 in a subsequent etching process. In some embodiments, the cladding layer 226 may be conformally and epitaxially grown as a blanket layer on the workpiece 200 using vapor phase epitaxy (VPE) or molecular beam epitaxy (MBE). Depending on the extent of the selective growth of the cladding layer 226, an etch-back process may be performed to expose the isolation feature 222.

Figure 8C:
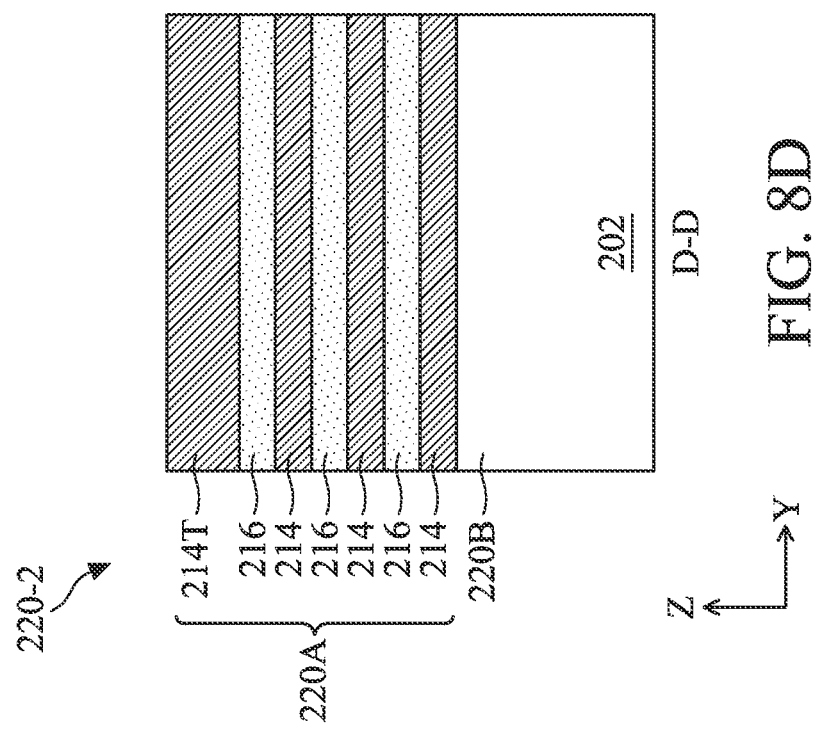
Figure 8D:
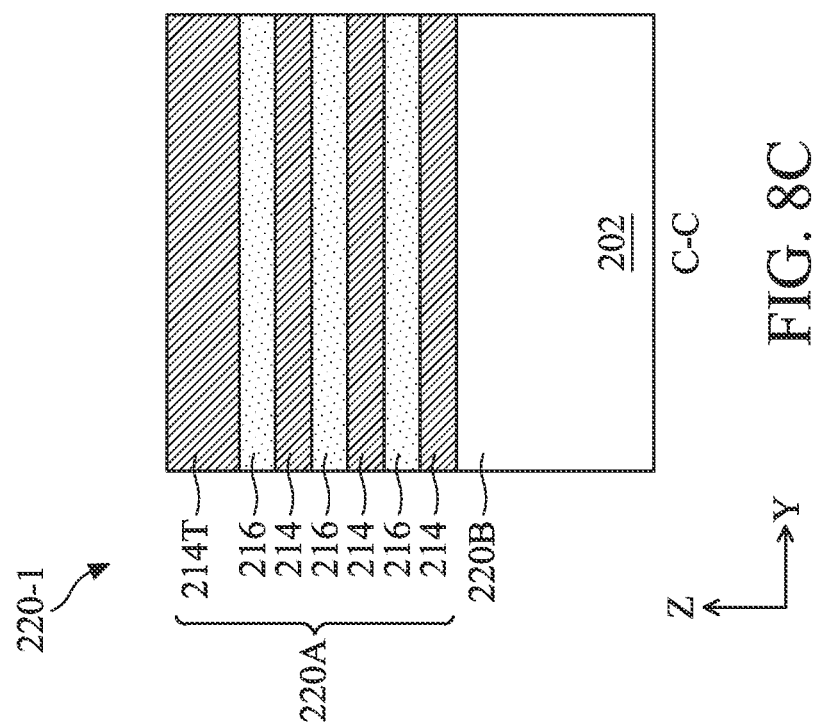
Figures 11A, 11B:
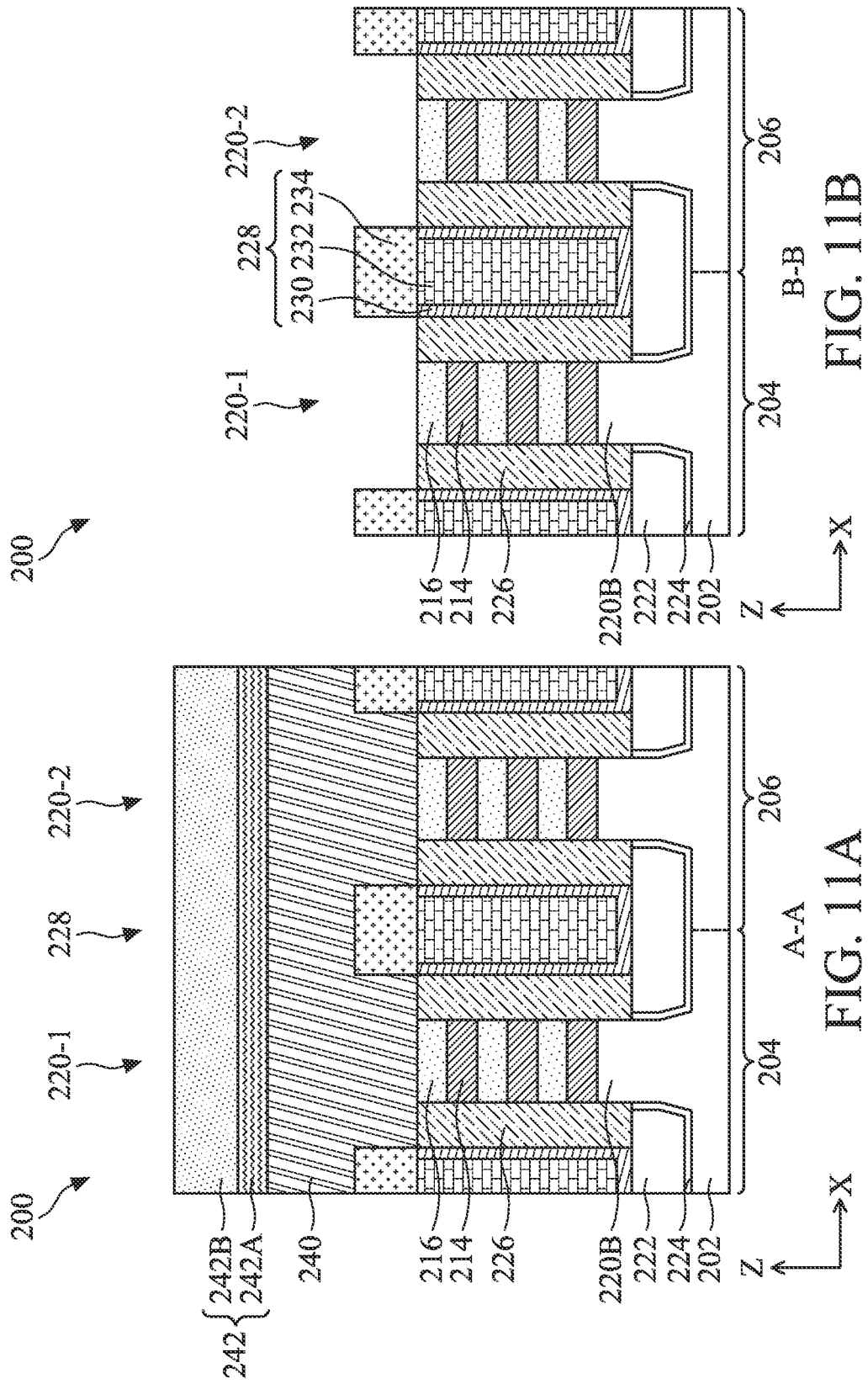
Figure 11D:
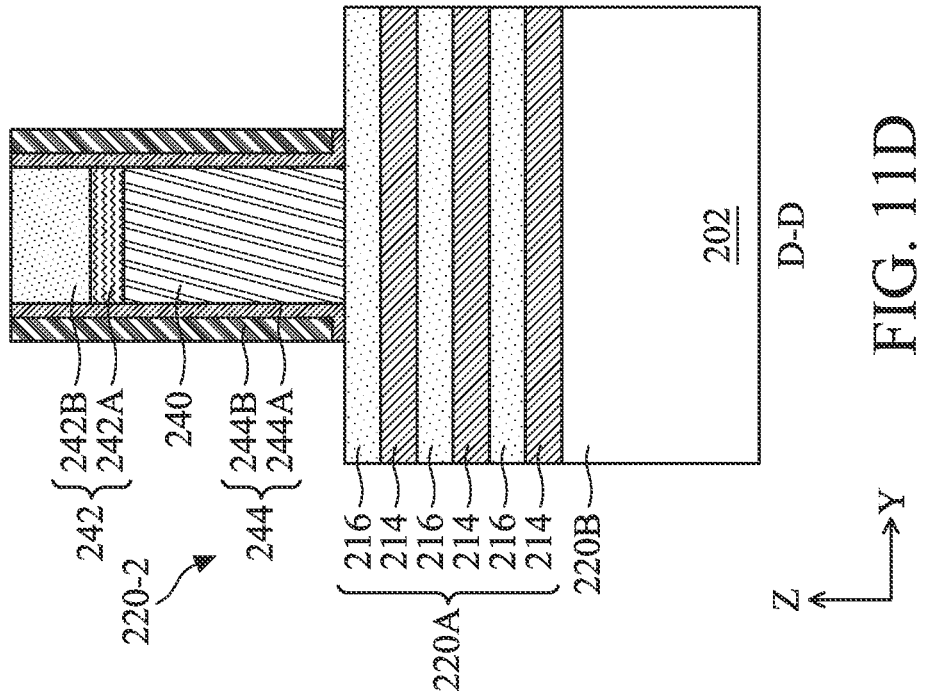
Figure 11C:
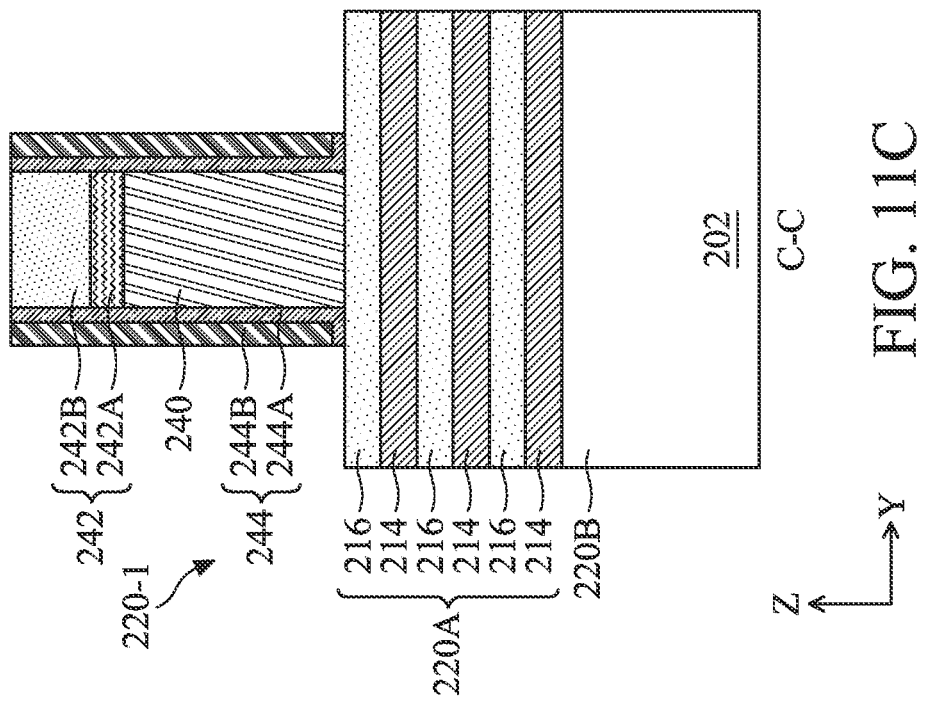

Referring to FIGS. 8A-8D, the method 100 includes a block 112 (FIG. 1A) where dielectric fins 228 are formed in trenches between the fins 220. An example process to form the dielectric fins 228 includes conformally depositing a first dielectric layer 230 and subsequently depositing a second dielectric layer 232 in trenches between the fins 220. The second dielectric layer 232 is surrounded by the first dielectric layer 230. The first dielectric layer 230 may be conformally deposited using CVD, ALD, or a suitable method. The first dielectric layer 230 lines the sidewalls and the bottom surfaces of the trenches between the fins 220. The second dielectric layer 232 is then deposited over the first dielectric layer 230 using CVD, high density plasma CVD (HDPCVD), and/or other suitable process. In some instances, a dielectric constant of the second dielectric layer 232 is smaller than that of the first dielectric layer 230. The first dielectric layer 230 may include silicon, silicon nitride, silicon carbide, silicon carbonitride, silicon carbon oxynitride, aluminum oxide, aluminum nitride, aluminum oxynitride, zirconium oxide, zirconium nitride, zirconium aluminum oxide, hafnium oxide, or a suitable dielectric material. In one embodiment, the first dielectric layer 230 includes aluminum oxide. The second dielectric layer 232 may include silicon oxide, silicon carbide, silicon oxynitride, silicon oxycarbonitride, or a suitable dielectric material. In one embodiment, the second dielectric layer 232 includes silicon oxide. The dielectric layers 230 and 232 are then etched back. The etch back process may include a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Subsequently, a third dielectric layer 234 is deposited above the dielectric layers 230 and 232 using CVD, high density plasma CVD (HDPCVD), and/or other suitable process. The third dielectric layer 234 includes a high-K dielectric material (e.g., k>7) and is also referred to as the high-K dielectric layer 234. In some embodiments, the high-K dielectric layer 234 may include hafnium oxide ($HfO_2$), zirconium oxide ($ZrO_2$), hafnium aluminum oxide ($HfAlO_x$), hafnium silicate ($HfSiO_x$), aluminum oxide ($Al_2O_3$), or other suitable high-K dielectric material. After the deposition of the dielectric layer 234, the workpiece 200 is planarized using a chemical mechanical polishing (CMP) process to expose the top epitaxial layer 214T. As shown in FIGS. 8A and 8B, upon conclusion of the CMP process, the dielectric layers 230, 232, and 234 collectively define the dielectric fins 228 between the fins 220. The dielectric fins 228 may also be referred to as hybrid fins 228.

Referring to FIGS. 9A-9D, the method 100 includes a block 114 (FIG. 1A) where the top epitaxial layer 214T in the fins 220 are removed. At the block 114, the workpiece 200 is etched to selectively remove the top epitaxial layer 214T and a portion of the cladding layer 226 to expose the topmost epitaxial layer 216, without substantially damaging the dielectric fins 228. In some instances, because the top epitaxial layer 214T and the cladding layer 226 are formed of silicon germanium (SiGe), the etching process at the block 114 may be selective to silicon germanium (SiGe). For example, the cladding layer 226 and the top epitaxial layer 214T may be etched using a selective wet etching process that includes ammonium hydroxide ($NH_4OH$), hydrogen fluoride (HF), hydrogen peroxide ($H_2O_2$), or a combination thereof. After the removal of the top epitaxial layer 216T and a portion of the cladding layer 226, the dielectric fins 224, particularly the third dielectric layer 234, rise above the topmost epitaxial layer 216.

Referring to FIGS. 10A-10D, the method 100 includes a block 116 (FIG. 1A) where a dummy gate stacks 240 are formed over the channel regions of the fins 220. In some embodiments, a gate replacement process (or gate-last process) is adopted where the dummy gate stack 240 serves as a placeholder for functional gate structures. Other processes and configuration are possible. In the illustrated embodiment, the dummy gate stack 240 includes a dummy dielectric layer and a dummy electrode disposed over the dummy dielectric layer. For patterning purposes, a gate top hard mask 242 is deposited over the dummy gate stack 240. The gate top hard mask 242 may be a multi-layer and include a silicon nitride mask layer 242A and a silicon oxide mask layer 242B over the silicon nitride mask layer 242A. The regions of the fins 220 underlying the dummy gate stack 240 may be referred to as channel regions. Each of the channel regions in either the fin 220-1 or the fin 220-2 is sandwiched between two source/drain regions for source/drain formation. In an example process, the dummy dielectric layer in the dummy gate stack 240 is blanket deposited over the workpiece 200 by CVD. A material layer for the dummy electrode is then blanket deposited over the dummy dielectric layer. The dummy dielectric layer and the material layer for the dummy electrode are then patterned using photolithography processes to form the dummy gate stack 240. In some embodiments, the dummy dielectric layer may include silicon oxide and the dummy electrode may include polycrystalline silicon (polysilicon).

Referring to FIGS. 11A-11D, the method 100 includes a block 118 (FIG. 1A) where sidewall spacers 244 are formed on sidewall of the dummy gate stack 240. In some embodiments, the sidewall spacers 244 may have a thickness between about 2 nm and about 10 nm. In some embodiments, the sidewall spacers 244 may include a dielectric material such as silicon oxide, silicon nitride, silicon carbide, silicon oxynitride, SiCN, silicon oxycarbide, SiOCN, a low-K material, and/or combinations thereof. In some embodiments, the sidewall spacers 244 include multiple layers, such as a liner spacer layer 244A and a main spacer layer 244B. By way of example, the sidewall spacers 244 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the sidewall spacers 244 may be etched-back to expose portions of the fins 220 not covered by the dummy gate stack 240 (e.g., in source/drain regions). In some instances, the etch-back process removes portions of dielectric material used to form the sidewall spacers 244 along a top surface of the dummy gate stack 240, thereby exposing the gate top hard mask 242. In some embodiments, the etch-back process may include a wet etch process, a dry etch process, a multiple-step etch process, and/or a combination thereof. It is noted that after the etch-back process, the sidewall spacers 244 remain disposed on sidewalls of the dummy gate stack 240.

Referring to FIGS. 12A-12D, the method 100 includes a block 120 (FIG. 1A) where the source/drain regions of the fins 220 are recessed to form source/drain recesses 250-1 in the first region 204 and source/drain recesses 250-2 in the second region 206 (collectively as source/drain recesses 250). With the dummy gate stack 240 and the sidewall spacers 244 serving as an etch mask, the workpiece 200 is anisotropically etched to form the source/drain recesses 250 over the source/drain regions of the fins 220. In some embodiments, operations at the block 120 remove the epitaxial layers 214 and 216, the cladding layer 226, as well as a top portion of the fin-shape base 220B from the source/drain regions, thereby exposing the isolation feature 222 in the source/drain recesses 250. In the illustrated embodiment, the source/drain recesses 250 extend into the fin-shape base 220B and are below a top surface of the isolation feature 222. The anisotropic etch at the block 120 may include a dry etching process. For example, the dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring to FIGS. 13A-13D, the method 100 includes a block 122 (FIG. 1A) where inner spacers 252 are formed on lateral ends of the epitaxial layers 214. In some embodiments, a lateral etching (or horizontal recessing) is performed to recess the epitaxial layers 214 to form cavities on lateral ends of the epitaxial layers 214. The amount of etching of the epitaxial layers 214 may range from about 2 nm to about 10 nm. When the epitaxial layers 214 are SiGe, the lateral etching process may use an etchant, such as, but not limited to, ammonium hydroxide ($NH_4OH$), tetramethylammonium hydroxide (TMAH), ethylenediamine pyrocatechol (EDP), or potassium hydroxide (KOH) solutions. Subsequently, an insulating layer is deposited in the source/drain recesses 250 and fill the cavities on lateral ends of the epitaxial layers 214. The insulating layer may include a dielectric material, such as SiN, SiOC, SiOCN, SiCN, $SiO_2$, and/or other suitable material. In some embodiments, the insulating layer is conformally deposited, for example, by ALD or any other suitable method. After the conformal deposition of the insulating layer, an etch-back process is performed to partially remove the insulating layer from outside of the cavities. By this etching the insulating layer remains substantially within the cavities, thereby forming the inner spacers 252.

Figures 14A, 14B:
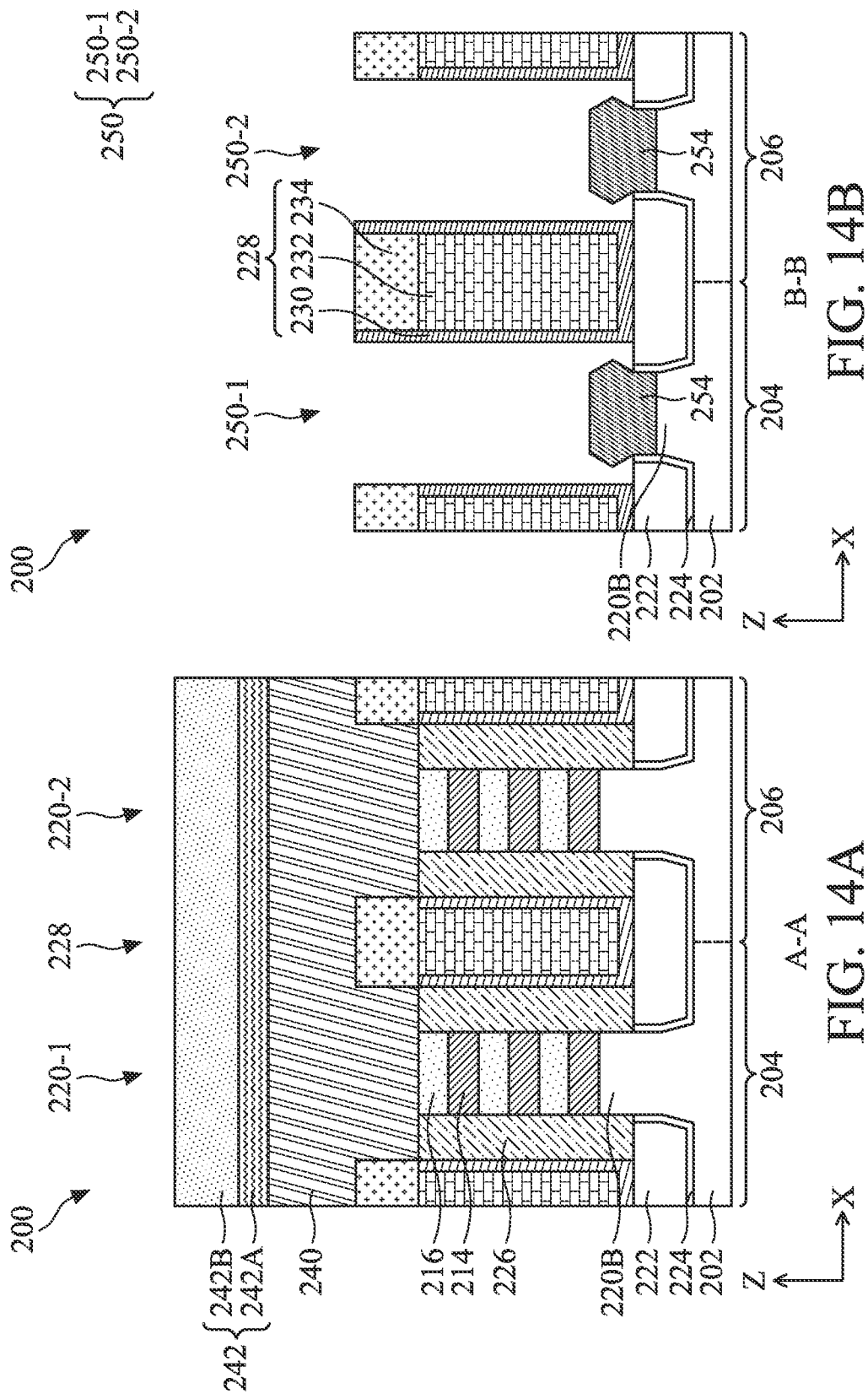

Referring to FIGS. 14A-14D, the method 100 includes a block 124 (FIG. 1A) where a base epitaxial layer 254 is epitaxially grown from the recessed top surface of the fin-shape base 220B in both the first region 204 and the second region 206. By way of example, epitaxial growth of the base epitaxial layer 254 may be performed by vapor-phase epitaxy (VPE), ultra-high vacuum CVD (UHV-CVD), molecular beam epitaxy (MBE), and/or other suitable processes. In some embodiments, the base epitaxial layer 254 include the same material as the substrate 202, such as silicon (Si). In some alternative embodiments, the base epitaxial layer 254 includes a different semiconductor material than the substrate 202, such as silicon germanium (SiGe). As shown in FIG. 14B, the base epitaxial layer 254 may exhibit faceted growth when it raises above the top surface of the isolation feature 222, such that a width of the base epitaxial layer 254 above the isolation feature 222 is larger than a width of the fin-shape base 220B above the isolation features 222 (under the dummy gate stack 240). In some embodiments, the base epitaxial layer 254 is substantially dopant-free (i.e., having an extrinsic dopant concentration from about 0 $cm^{-3}$ to about $1\times10^{17}$ $cm^{-3}$). As a comparison, in one instance, the fin-shape base 220B is lightly doped and has a higher doping concentration than the base epitaxial layer 254. Referring to FIGS. 14C and 14D, the growth of the base epitaxial layer 254 is under time control such that the top surface of the base epitaxial layer 254 is above the top surface of the fin-shape base 220B under the dummy gate stack 240. In other words, the base epitaxial layer 254 partially covers sidewalls of the bottommost inner spacers 252 in the illustrated embodiment.

Referring to FIGS. 15A-15D, the method 100 includes a block 126 (FIG. 1A) where an insulation layer 256 is formed over the base epitaxial layer 254 in both the first region 204 and the second region 206. In some embodiments, the insulation layer 256 includes silicon oxide ($SiO_2$), aluminum oxide (AlOx), silicon nitride (SiN), silicon oxynitride (SiON), silicon carbonitride (SiCN), silicon carbon oxynitride (SiCON), silicon carbide (SiC), silicon oxycarbide (SiOC), or a combination thereof. The insulation layer 256 insulates the base epitaxial layer 254 from contacting epitaxial source/drain features to be formed in subsequent processes to suppress leakage current into the buck substrate. In some embodiments, the insulation layer 256 is first deposited in the source/drain recesses 250 using a plasma-enhanced chemical vapor deposition (PECVD) process, covering the base epitaxial layer 254 and sidewalls of the source/drain recesses 250. Since deposition under a PECVD process usually forms a deposited layer thicker in a bottom portion of a recess but thinner on its sidewalls, an etch-back process is subsequently performed to remove the insulation layer 256 from sidewalls of the source/drain recesses 250 and also slightly recess the insulation layer 256 to a determined height h1 (e.g., by controlling the etching time), such that sidewalls of the bottommost epitaxial layer 216 are fully covered by the insulation layer 256, as shown in FIGS. 15C and 15D. In some embodiments, the height h1 ranges from about 20 nm to about 28 nm. The removing of the insulation layer 256 from sidewalls of the source/drain recesses 250 may include a suitable etching process, such as a dry etching process, a wet etching process, or an RIE process. In various embodiments, a top surface of the insulation layer 256 is below a bottom surface of the second epitaxial layer 216 to the bottom. Referring to FIG. 15B, air gaps 258 may be trapped at corner regions of the source/drain recesses 250, being capped by the insulation layer 256. A height h2 of the air gaps 258 may range from about 4 nm to about 6 nm. The term "air gap" is used to describe a void defined by surrounding substantive features, where a void may contain air, nitrogen, ambient gases, gaseous chemicals used in previous or current processes, or combinations thereof.

In some embodiments, the source/drain recesses 250 may have a high aspect ratio and to prevent the dielectric material during the deposition of the insulation layer 256 from capping the top openings of the source/drain recesses 250, operations at the block 126 may adopt a cyclic deposition process. In the cyclic deposition process, operations at the block 126 alternates between a dielectric material deposition and an etching process to clean up dielectric material from accumulating at edges of the top opening of the source/drain recesses 250 and gradually grow the thickness of the insulation layer 256 through cycles. The etching process also helps removing dielectric material from sidewalls of the source/drain recesses 250. In some instances, the cyclic deposition process may take from about 1 cycle to about 5 cycles.

Figures 16A, 16B:
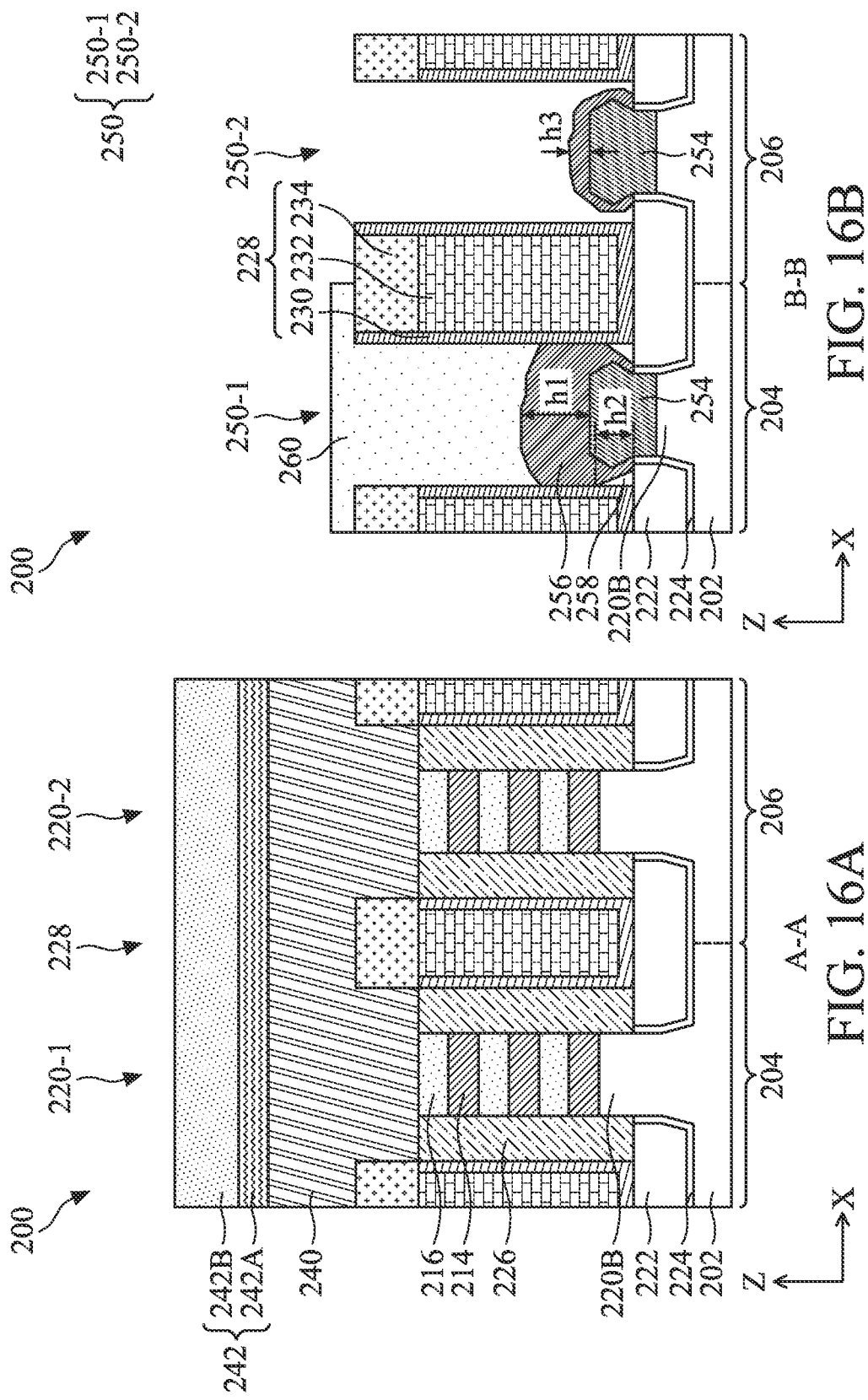

Referring to FIGS. 16A-16D, the method 100 includes a block 128 (FIG. 1A) where the insulation layer 256 is recessed in the second region 206 in an etch-back process. A mask layer 260 with an opening exposing the source/drain recesses 250-2 in the second region 206 restrains the etching process to the insulation layer 256 in the second region 206. The mask layer 260 may be a bottom anti-reflective coating (BARC) layer and patterned by using a photolithography process, which may include forming a resist layer on the mask layer 260, exposing the resist by a lithography exposure process, performing a post-exposure bake process, developing the resist layer to form the patterned resist layer that exposes part of the mask layer 260, patterning the mask layer 260, and finally removing the patterned resist layer. The etch back process may use a suitable etching process, such as a dry etching process, a wet etching process, or an RIE process. The etch back process recesses the insulation layer 256 in the source/drain recesses 250-2 to a determined height h3 (e.g., by controlling the etching time), such that sidewalls of the bottommost epitaxial layer 216 are fully exposed. In some embodiments, the height h3 ranges from about 4 nm to about 6 nm. In various embodiments, a top surface of the insulation layer 256 in the second region 206 is below a bottom surface of the bottommost epitaxial layer 216 and the bottommost inner spacer 252 is partially exposed, as shown in FIG. 16D. Referring to FIG. 16B, air gaps 258 previously trapped at corner regions of the source/drain recesses 250-2 may be released due to the thinning of the insulation layer 256 in the source/drain recesses 250-2. The mask layer 260 is then removed in a suitable process such as etching, resist stripping or plasma ashing.

Figures 17A, 17B:
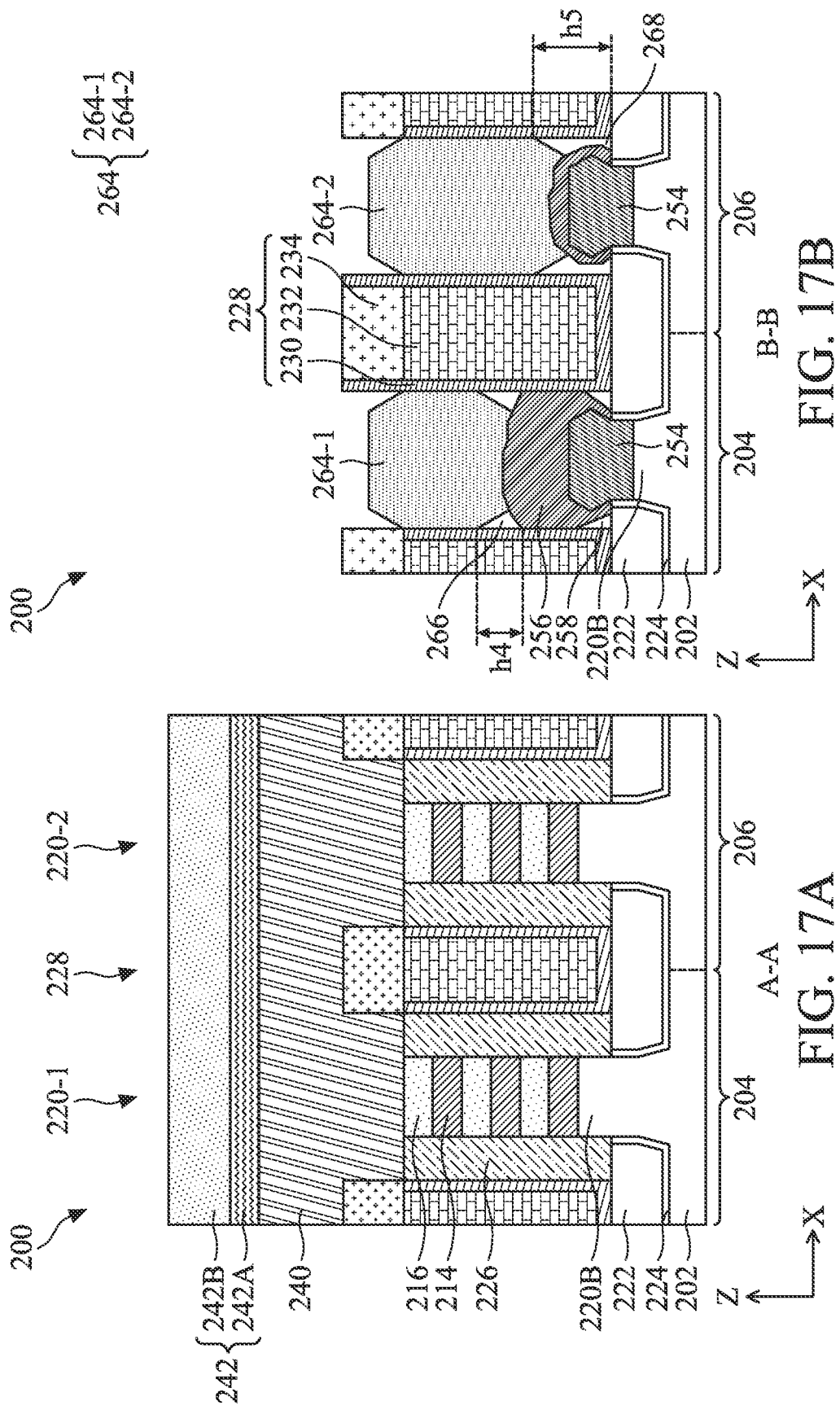
Figures 17C, 17D:
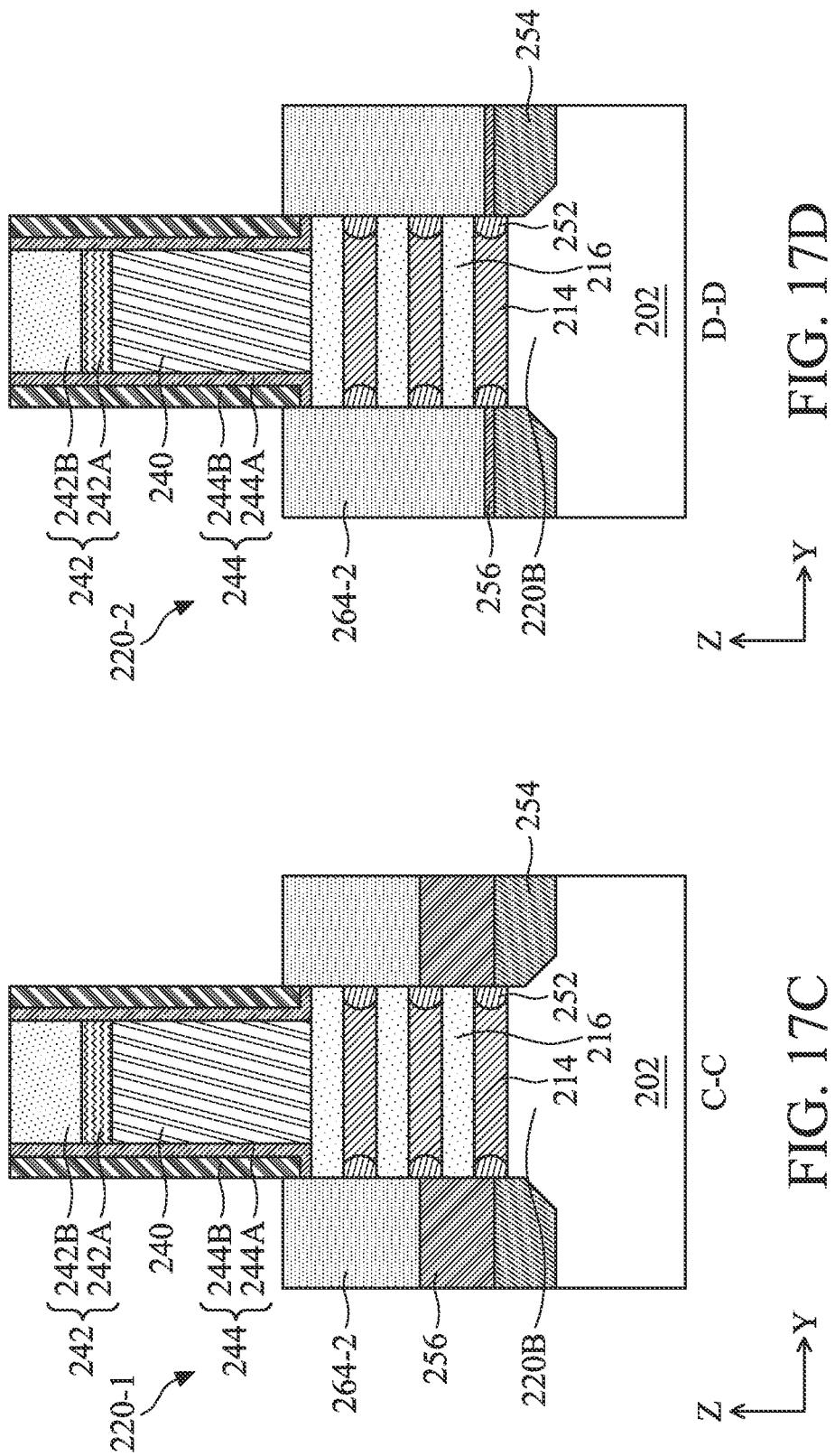
Figures 18A, 18B:
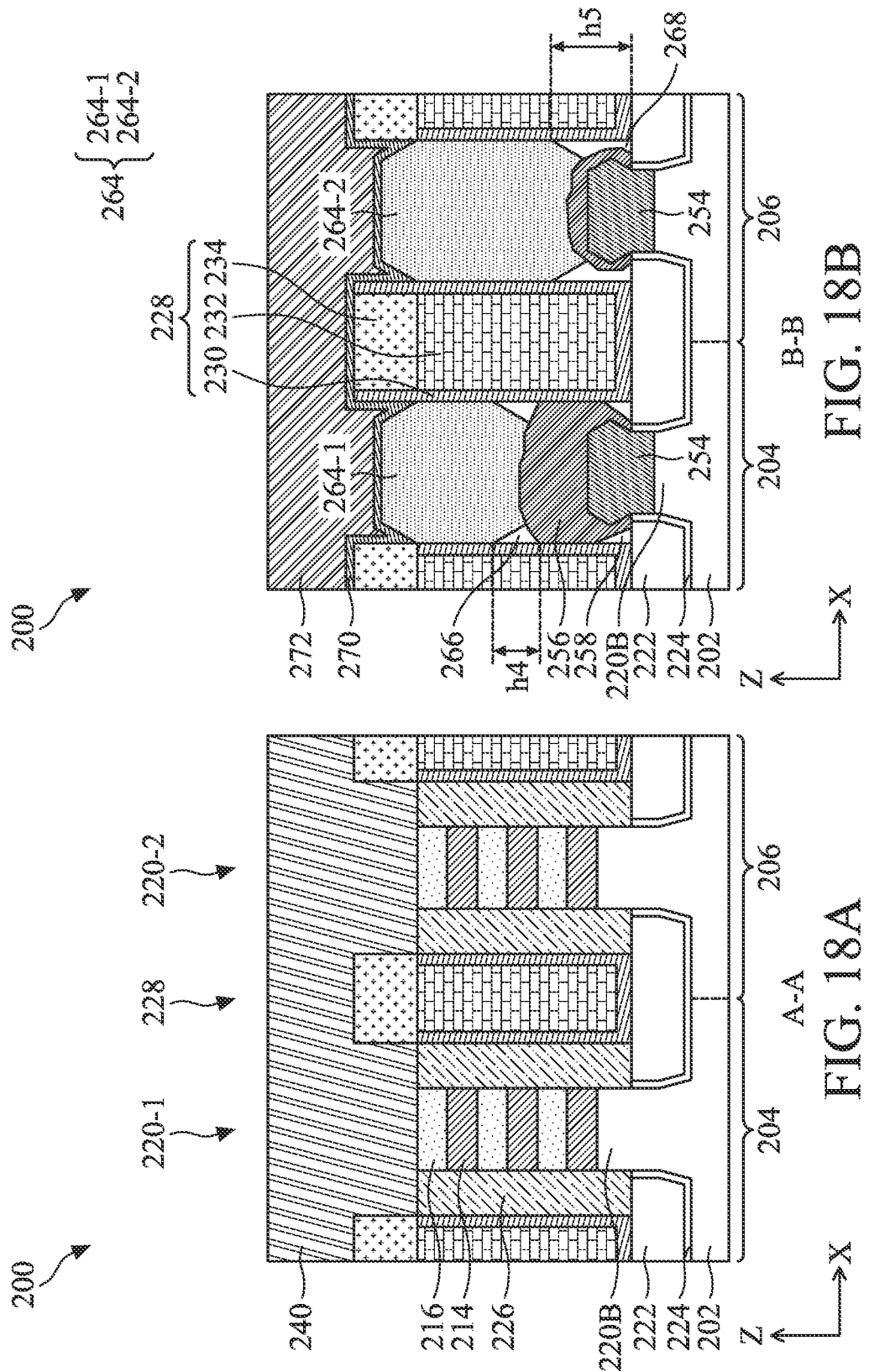

Referring to FIGS. 17A-17D, the method 100 includes a block 130 (FIG. 1A) where first epitaxial source/drain features 264-1 are formed in the source/drain recesses 250-1 and second epitaxial source/drain features 264-2 are formed in the source/drain recesses 250-2 (collectively as source/drain features 264). In an embodiment, forming the epitaxial source/drain features 264 includes epitaxially growing one or more semiconductor layers by an MBE process, a chemical vapor deposition process, and/or other suitable epitaxial growth processes. In a further embodiment, the epitaxial source/drain features 264 are in-situ or ex-situ doped with an n-type dopant or a p-type dopant. For example, in some embodiments, the epitaxial source/drain features 264 include silicon doped with phosphorous for forming epitaxial source/drain features for an n-type FET. In some embodiments, the epitaxial source/drain features 264 include silicon-germanium (SiGe) doped with boron for forming epitaxial source/drain features for a p-type FET. The semiconductor layers of the epitaxial source/drain features 264 are selectively grown on different semiconductor surfaces exposed in the source/drain recesses, such as the lateral ends of the epitaxial layers 216. Since the insulation layer 256 covers the top surface of the base epitaxial layer 254, the epitaxial growth of the epitaxial source/drain features 264 does not take place therefrom. In other words, the insulation layer 256 blocks possible current path from the bottom of the epitaxial source/drain features 264 to the fin-shape base 220B (or substrate 202). Accordingly, substrate leakage current is significantly reduced. Further, the epitaxial source/drain features 264-1 in the first region 204 has a smaller height and smaller volume than the epitaxial source/drain features 264-2 in the second region 206. The epitaxial source/drain features 264-1 contacts top epitaxial layers 216 but not the bottom ones (e.g., the bottommost one as shown in FIG. 17C). As a comparison, the epitaxial source/drain feature 264-2 contacts all available epitaxial layers 216 in the second region 206. Therefore, the GAA transistors formed in the subsequent processes in the first region 204 would have less functional channel layers than the GAA transistors formed in the second region 206.

Reference is made to FIG. 17B. The epitaxial source/drain features 264 may exhibit faceted growth. Air gaps 266 may be formed between the bottom surface of the epitaxial source/drain feature 264-1 and the top surface of the insulation layer 256. The air gaps 266 is stacked above the air gaps 258. The air gaps 266 may have a height h4 ranges from about 12 nm to about 24 nm. Air gaps 268 may be formed between the bottom surface of the epitaxial source/drain feature 264-2 and the top surface of the insulation layer 256. The air gaps 268 are positioned below the air gaps 266. Yet since the air gaps 268 extend upward from corner regions of the source/drain recesses 250-2, the air gaps 268 have the largest height and the largest volume among the air gaps 258, 266, and 268. The air gaps 268 may have a height h5 ranges from about 15 nm to about 30 nm.

Referring to FIGS. 18A-18D, the method 100 includes a block 132 (FIG. 1A) where a contact etch stop layer (CESL) 270 and an interlayer dielectric layer (ILD) 272 are deposited on the frontside of the workpiece 200. In an example process, the CESL 270 is first conformally deposited over the workpiece 200 and then the ILD layer 272 is deposited over the CESL 270. The CESL 270 may include silicon nitride, silicon oxide, silicon oxynitride, and/or other materials known in the art. The CESL 270 may be deposited using ALD, plasma-enhanced chemical vapor deposition (PECVD) process and/or other suitable deposition or oxidation processes. In some embodiments, the ILD layer 272 includes materials such as SiCN, SiON, SiOCN, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 272 may be deposited by spin-on coating, an FCVD process, or other suitable deposition technique. In some embodiments, after formation of the ILD layer 272, the workpiece 200 may be annealed to improve integrity of the ILD layer 272. To remove excess materials (including the gate top hard mask 242) and to expose top surfaces of the dummy gate stacks 240, a planarization process (such as a CMP process) may be performed to the workpiece 200 to provide a planar top surface. Top surfaces of the dummy gate stacks 240 are exposed on the planar top surface.

Figures 19A, 19B:
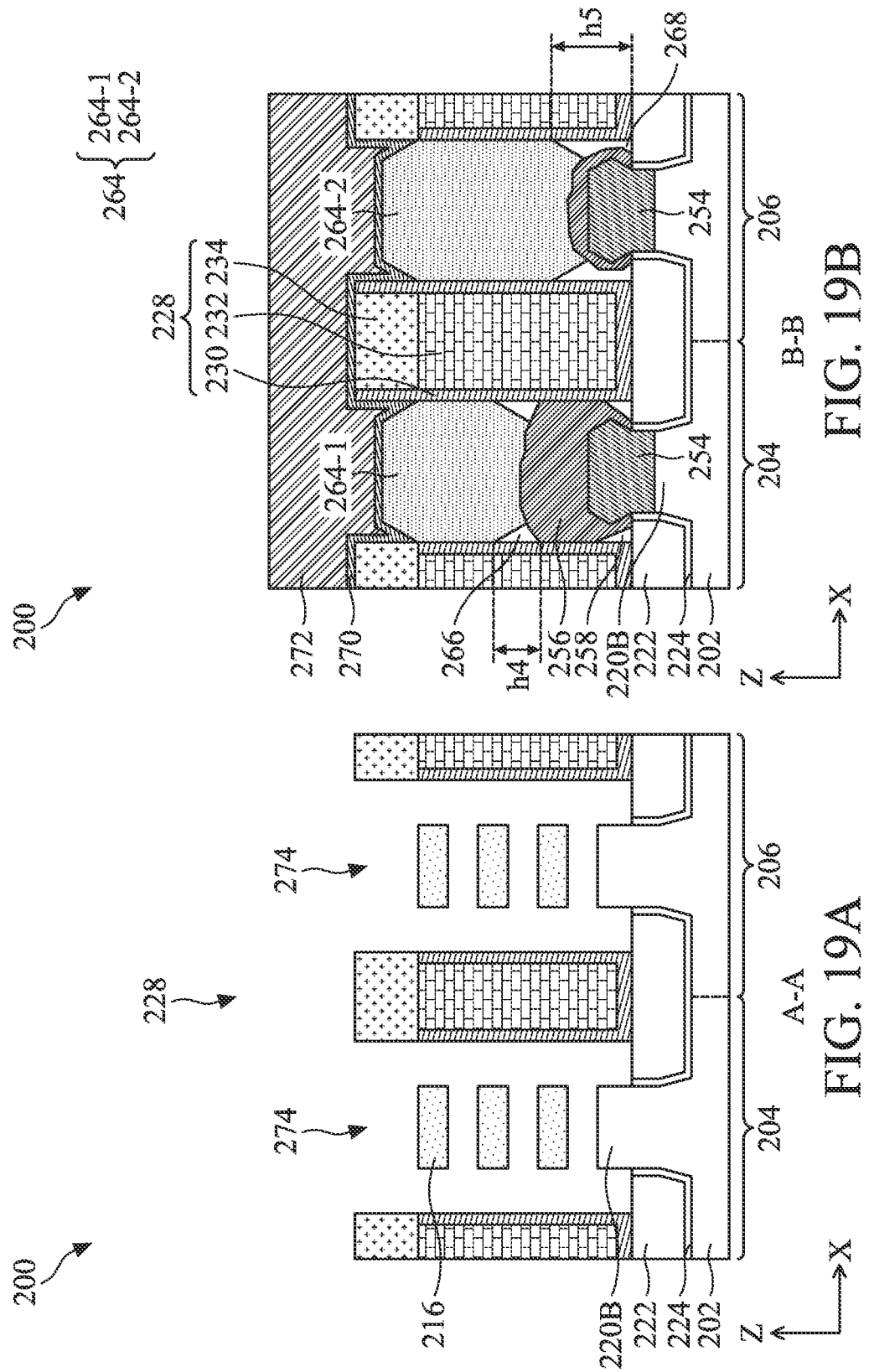
Figures 21A, 21B:
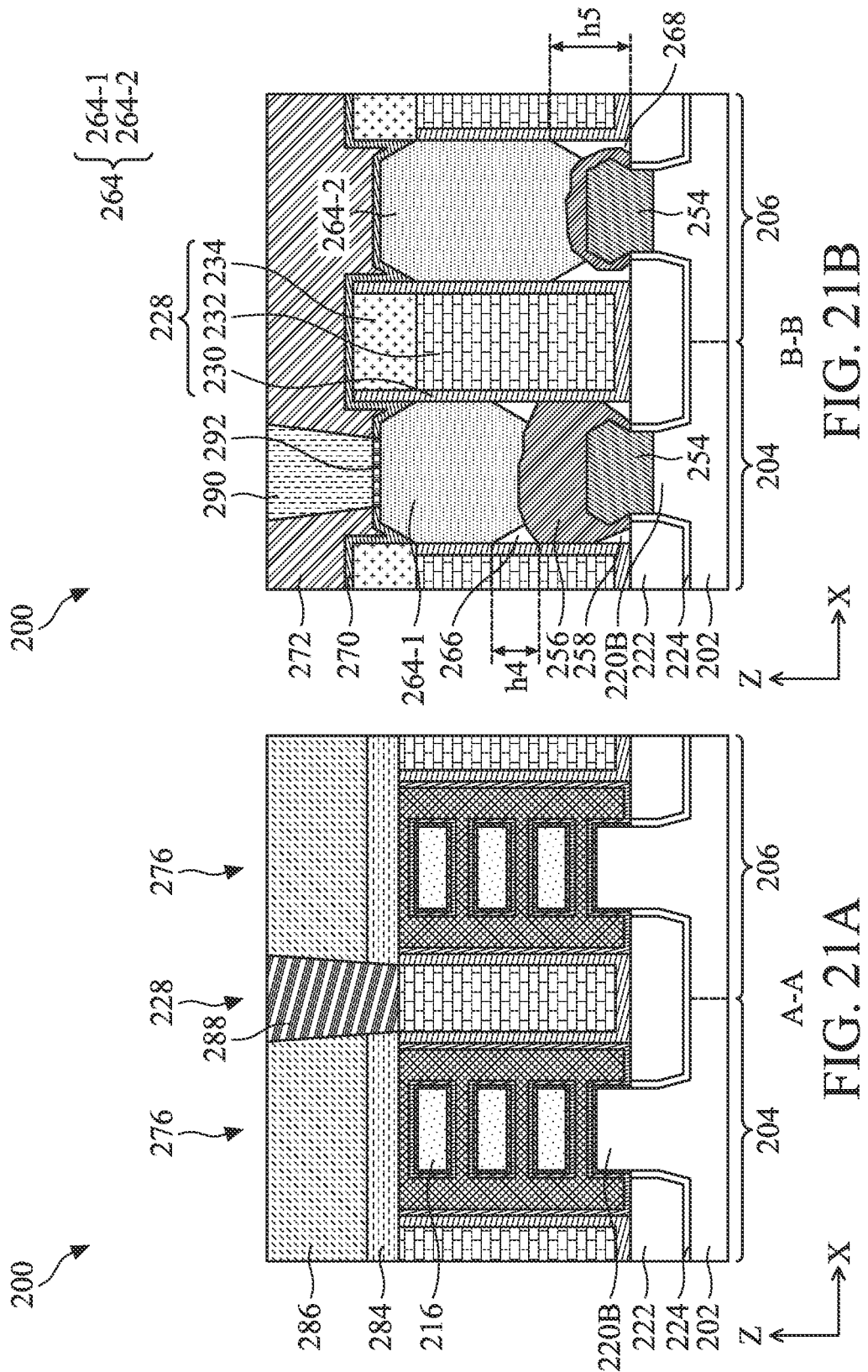

Referring to FIGS. 19A-19D, the method 100 includes a block 134 (FIG. 1B) where the dummy gate stacks 240, the epitaxial layers 214, and the cladding layer 226 are selectively removed. The dummy gate stacks 240 exposed at the conclusion of the block 132 are removed from the workpiece 200 by a selective etching process. The selective etching process may be a selective wet etching process, a selective dry etching process, or a combination thereof. In the depicted embodiment, the selective etching process selectively removes the dummy dielectric layer and the dummy electrode without substantially damaging the epitaxial layers 216 and the sidewall spacers 244. The removal of the dummy gate stacks 240 results in gate trenches 274 over the channel regions. After the removal of the dummy gate stacks 240, the epitaxial layers 214, epitaxial layers 216, and the cladding layer 226 in the channel regions are exposed in the gate trenches 274. Subsequently, operations at the block 134 selectively removes the epitaxial layers 214 and the cladding layer 226 from the gate trenches 274 to release the epitaxial layers 216. The selective removal of the epitaxial layers 214 and the cladding layer 226 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. The released epitaxial layers 216 are also denoted as channel layers (or channel members) 216, or referred to as nanostructures 216 due to the nanoscale of the feature. In the depicted embodiment where the channel layers 216 resemble a sheet or a nanosheet, the channel layer release process may also be referred to as a sheet formation process. The channel layers 216 may have rounded corners at the conclusion of a sheet formation process. The channel layers 216 are vertically stacked along the Z direction. All channel layers 216 are spaced apart from the dielectric fins 228 for a distance reserved by the cladding layer 226. Yet, as shown in FIGS. 19C and 19D, in the region 204, at least the bottommost channel layer 216 is laterally sandwiched by the insulation layer 256 and has no contact with the epitaxial source/drain feature 264-1. Thus, a GAA transistor formed in the region 204 have one less functional channel layer than its counterpart in the region 206. In an alternative embodiment, the insulation layer 256 in the region 204 can be deposited with larger height so as to block two or more bottom channel layers 216 from contacting the epitaxial source/drain features 264-1. Accordingly, a GAA transistor formed in the region 204 may have two or more functional channel layers less than its counterpart in the region 206.

Referring to FIGS. 20A-20D, the method 100 includes a block 136 (FIG. 1B) where gate structures 276 (also known as functional gate structures 276 or metal gate structures 276) are formed in the gate trenches 274 to engage each of the channel layer 216. Each of the gate structures 276 includes an interfacial layer 278 disposed on the channel layers 216, a high-k dielectric layer 280 disposed on the interfacial layer 278, and a gate electrode layer 282 over the gate dielectric layer 280. The interfacial layer 278 and the high-k dielectric layer 280 are collectively referred to as a gate dielectric layer. The interfacial layer 278 may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed semiconductive surfaces of the channel layers 216 and exposed semiconductive surfaces of the fin-shape base 202B to form the interfacial layer. That is, the exposed dielectric surfaces of the isolation feature 222 may be not covered by the interfacial layer 278. The high-k dielectric layer 280 is then deposited over the interfacial layer 278 using ALD, CVD, and/or other suitable methods. The high-k dielectric layer 280 also covers the exposed surfaces of the isolation feature 222. The high-k dielectric layer 280 includes high-K dielectric materials. In one embodiment, the high-k dielectric layer 280 may include hafnium oxide. Alternatively, the high-k dielectric layer 280 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable material.

After the formation of the high-k dielectric layer 280, the gate electrode layer 282 is deposited over the high-k dielectric layer 280. The gate electrode layer 282 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 282 may be formed by ALD, PVD, CVD, e-beam evaporation, or other suitable process. Although not explicitly shown in the figures, the gate structures 276 are deposited as a joint gate structure and then etched back until the dielectric fins 228 separate the joint gate structure into the gate structures 276 that are separated apart from each other. The dielectric fins 228 also provide electrical isolation between neighboring gate structures 276. The etching back of the gate structures 276 may include a selective wet etching process that uses nitric acid, hydrochloric acid, sulfuric acid, ammonium hydroxide, hydrogen peroxide, or a combination thereof. In the depicted embodiment, each of the channel layers 216 is wrapped around by a respective gate structure 276. At the conclusion of the block 136, the protruding portions of the dielectric fins 228, particularly the third dielectric layer 234, may be etched back in the channel regions, as illustrated in FIG. 20A.

Referring to FIGS. 21A-21D, the method 100 includes a block 138 (FIG. 1A) where a metal cap layer 284, a self-aligned cap (SAC) layer 286, a gate cut feature 288, and a source/drain contact 290 are formed in the frontside of the workpiece 200. In some embodiments, the metal cap layer 284 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 284 includes tungsten (W), such as fluorine-free tungsten (FFW), and is deposited by PVD. The metal cap layer 284 electrically connects the gate structures 276. After the deposition of the metal cap layer 284, the SAC layer 286 is deposited over the workpiece 200 by CVD, PECVD, or a suitable deposition process. The SAC layer 286 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etching processes are then performed to etch the deposited SAC layer 286 to form gate cut openings to expose the top surfaces of the dielectric fins. Thereafter, a dielectric material is deposited and planarized by a CMP process to form the gate cut feature 288 in the gate cut openings. The dielectric material for the gate cut feature 288 may be deposited using HDPCVD, CVD, ALD, or a suitable deposition technique. In some instances, the gate cut feature 288 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut feature 288 and the SAC layer 286 may have different compositions to introduce etch selectivity. The gate cut feature 288 and the corresponding dielectric fin 228 directly thereunder collectively separate the metal cap layer 284 into segments. The source/drain contact 290 may include tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), or a combination thereof, and may be deposited using PVD, CVD, or metal organic chemical vapor deposition (MOCVD). The workpiece 200 may also include a silicide feature 292 between the source/drain contact 290 and the epitaxial source/drain features 264 to further reduce contact resistance. The silicide feature 292 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. Alternatively, the silicide formation may be skipped and the source/drain contact 290 directly contacts the epitaxial source/drain feature 264.

The workpiece 200 may undergo further processing to form various features and regions known in the art. For example, subsequent processing may form various contacts, vias, metal lines, and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Reference is now made to FIG. 1B, which demonstrate a flow chart for an alternative embodiment of the method 100, denoted as method 100'. The method 100' proceeds through operations at the blocks 102-124. After operations at the block 124, the method 100' proceeds to operations at the blocks 125 and 127. After operations at the block 127, the method 100' continues to proceed through operations at the blocks 130-138. The method 100' is described below in conjunction with FIGS. 22A-24D. Shared operations are not repeated below in the interest of conciseness.

Figures 22A, 22B:
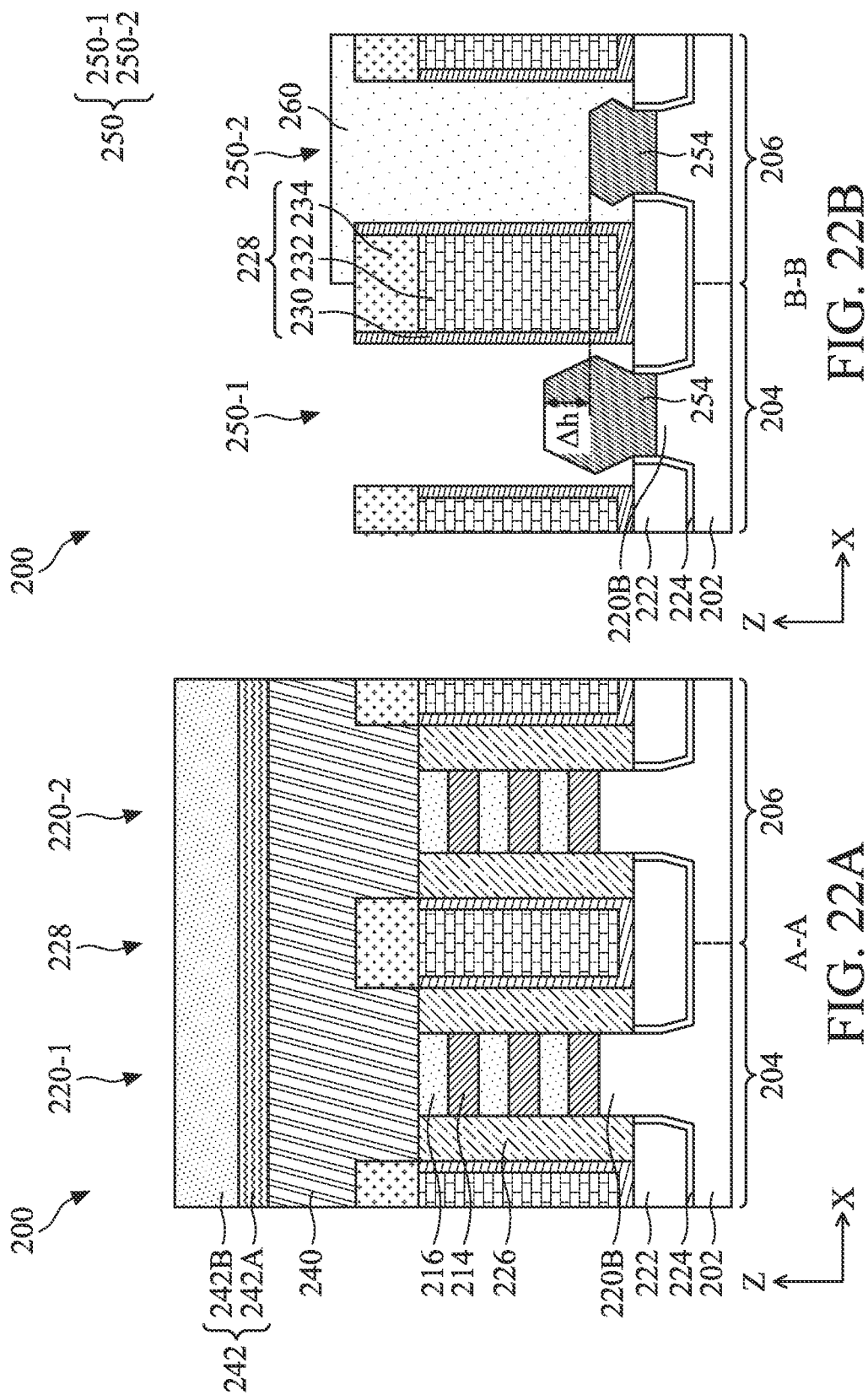

Referring to FIGS. 22A-22D, after operations at the block 122, the method 100' includes a block 125 (FIG. 1B) where the base epitaxial layer 254 in the first region 204 continues to grow for an extra height. In some embodiments, the extra height may range from about 20 nm to about 28 nm, such that the base epitaxial layer 254 in the first region 204 fully covers sidewalls of the bottommost epitaxial layer 216, as shown in FIG. 22C. A mask layer 260 with an opening exposing the source/drain recess 250-1 in the first region 204 restrains the extra epitaxial growth to the first region 204, as shown in FIG. 22B. The mask layer 260 may be a bottom anti-reflective coating (BARC) layer and patterned by using a photolithography process, which may include forming a resist layer on the mask layer 260, exposing the resist by a lithography exposure process, performing a post-exposure bake process, developing the resist layer to form the patterned resist layer that exposes part of the mask layer 260, patterning the mask layer 260, and finally removing the patterned resist layer. The extra epitaxial growth of the base epitaxial layer 254 in the first region 204 may be performed with substantially the same operations as in the block 124, such as by vapor-phase epitaxy (VPE), ultra-high vacuum CVD (UHV-CVD), molecular beam epitaxy (MBE), and/or other suitable processes. The base epitaxial layer 254 may exhibit faceted growth when it continues to raise in the first region 204, such that a width of the base epitaxial layer 254 in the first region 204 is larger than its counterpart in the second region 206, as well as height and volume. The extra growth of the base epitaxial layer 254 in the first region 204 may be under time control. The mask layer 260 is then removed in a suitable process such as etching, resist stripping or plasma ashing.

Figures 23A, 23B:
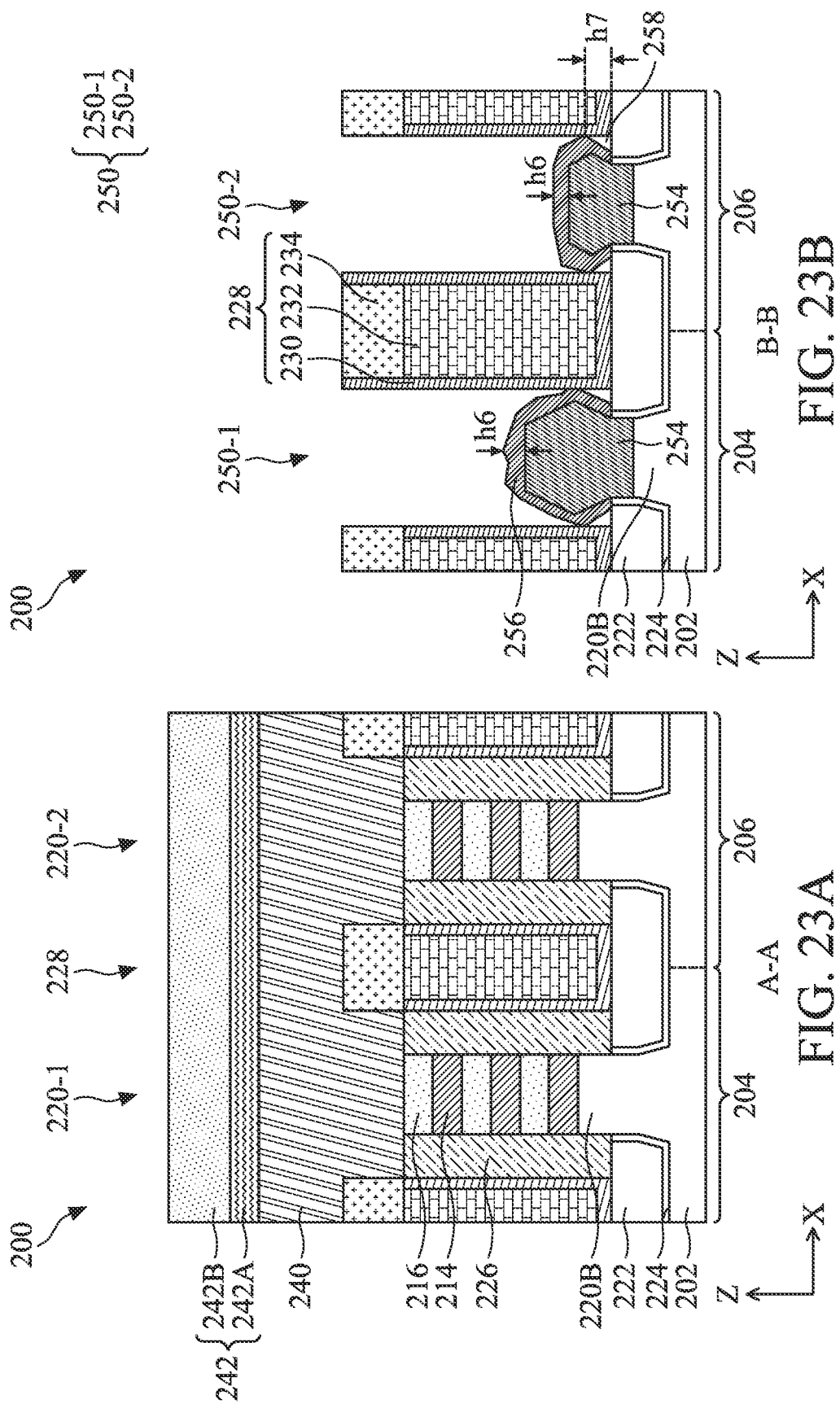

Referring to FIGS. 23A-23D, the method 100' includes a block 127 where an insulation layer 256 is formed over the base epitaxial layer 254 in both the first region 204 and the second region 206. In some embodiments, the insulation layer 256 includes silicon oxide ($SiO_2$), aluminum oxide (AlOx), silicon nitride (SiN), silicon oxynitride (SiON), silicon carbonitride (SiCN), silicon carbon oxynitride (SiCON), silicon carbide (SiC), silicon oxycarbide (SiOC), or a combination thereof. The insulation layer 256 isolates the base epitaxial layer 254 from contacting epitaxial source/drain features to be formed in subsequent processes to suppress leakage current from the buck substrate. In some embodiments, the insulation layer 256 is first deposited in the source/drain recesses 250 using a plasma-enhanced chemical vapor deposition (PECVD) process, covering the base epitaxial layer 254 and sidewalls of the source/drain recesses 250. Since deposition under a PECVD process usually forms a deposited layer thicker in the bottom portion of a recess but thinner on sidewalls, an etch-back process is subsequently performed to remove the insulation layer 256 from sidewalls of the source/drain recesses 250 and also slightly recess the insulation layer 256 to a determined height h6 (e.g., by controlling the etching time), such that in the first region 204 the sidewalls of the inner spacers 252 right above the bottommost epitaxial layer 216 are partially covered by the insulation layer 256 and in the second region 206 the sidewalls of the bottommost inner spacers 252 are partially covered by the insulation layer 256, as shown in FIGS. 23C and 23D. In furtherance of some embodiments, the insulation layer 256 in the first region 204 may also partially covers sidewalls of the bottommost epitaxial layer 216 (when the top surface of the base epitaxial layer 254 in the first region 204 is below the top surface of the bottommost epitaxial layer 216). In some embodiments, the height h6 ranges from about 4 nm to about 6 nm. The thickness of the insulation layer 256 in the first region 204 and the second region 206 is substantially the same. The removing of the insulation layer 256 from sidewalls of the source/drain recesses 250 may include a suitable etching process, such as a dry etching process, a wet etching process, or an RIE process. Referring to FIG. 23B, air gaps 258 may be trapped at corner regions of the source/drain recesses 250, being capped by the insulation layer 256. A height h7 of the air gaps 258 may range from about 4 nm to about 6 nm.

In some embodiments, the source/drain recesses 250 may have a high aspect ratio and to prevent the dielectric material during the deposition of the insulation layer 256 from capping the top openings of the source/drain recesses 250, operations at the block 127 may adopt a cyclic deposition process. In the cyclic deposition process, operations at the block 126 alternates between a dielectric material deposition and an etching process to clean up dielectric material from accumulating at edges of the top opening of the source/drain recesses 250 and gradually grow the thickness of the insulation layer 256 through cycles. The etching process also helps removing dielectric material from sidewalls of the source/drain recesses 250. In an example, the cyclic deposition process may take about 5 to about 100 cycles.

Figures 24C, 24D:
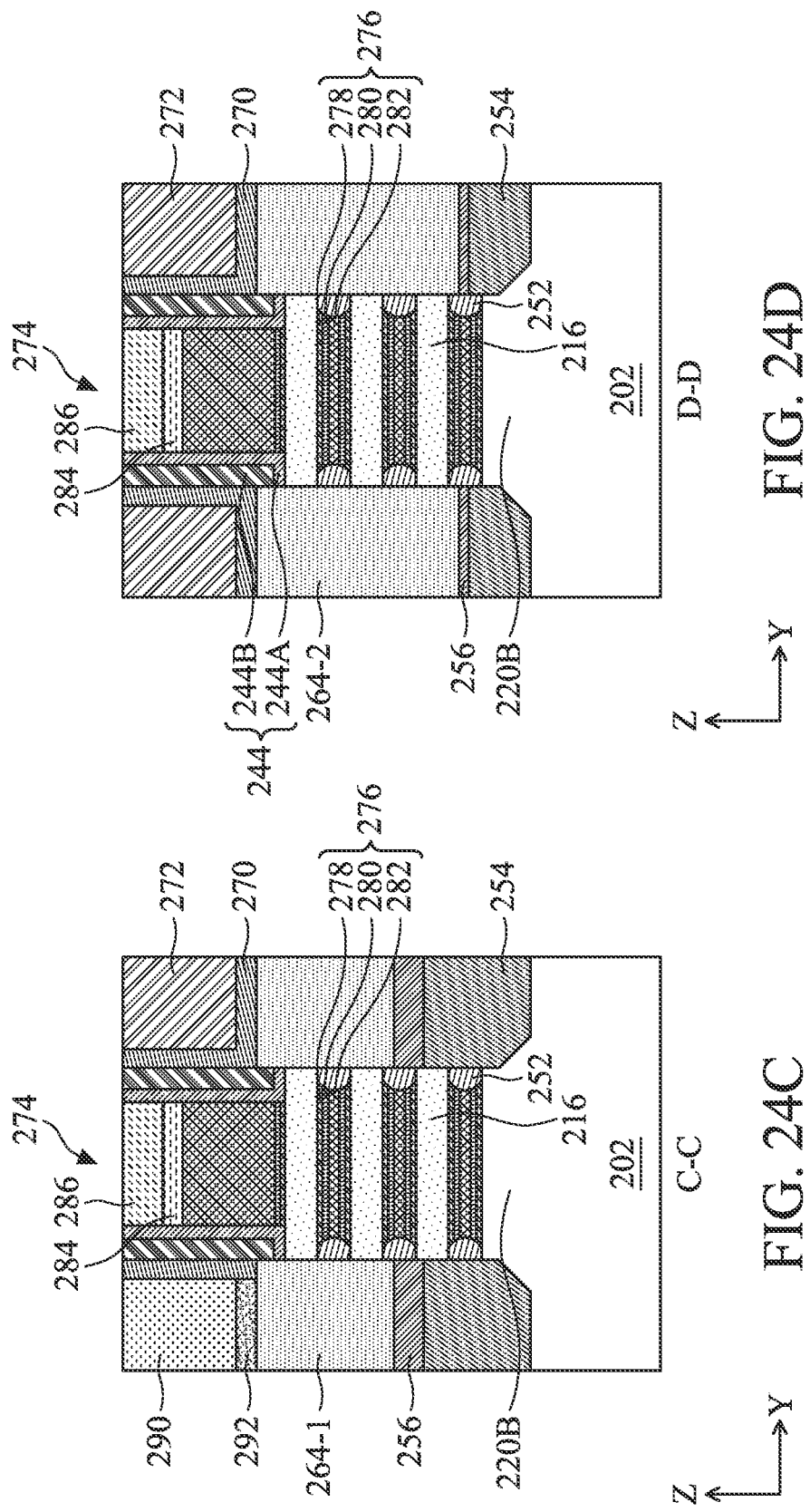

After operation at the block 127, the method 100' continues to operations at the blocks 130-138, which are shared with the method 100. The shared operations are not repeated below for the interest of conciseness. After operations at the block 138, a resultant workpiece 200 is shown in FIGS. 24A-24D. The epitaxial source/drain features 264 are in-situ or ex-situ doped with an n-type dopant or a p-type dopant. For example, in some embodiments, the epitaxial source/drain features 264 include silicon doped with phosphorous for forming epitaxial source/drain features for an n-type FET. In some embodiments, the epitaxial source/drain features 264 include silicon-germanium (SiGe) doped with boron for forming epitaxial source/drain features for a p-type FET. The semiconductor layers of the epitaxial source/drain features 264 are selectively grown on different semiconductor surfaces exposed in the source/drain recesses, such as the lateral ends of the epitaxial layers 216. Since the insulation layer 256 covers the top surface of the base epitaxial layer 254, the epitaxial growth of the epitaxial source/drain features 264 does not take place therefrom. In other words, the insulation layer 256 blocks possible current path from the bottom of the epitaxial source/drain features 264 to the fin-shape base 220B (or substrate 202). Accordingly, substrate leakage current is significantly reduced. Further, the epitaxial source/drain features 264-1 in the first region 204 has a smaller height and smaller volume than the epitaxial source/drain features 264-2 in the second region 206. The epitaxial source/drain features 264-1 contacts top channel layers 216 but not the bottom ones (e.g., the bottommost one as shown in FIG. 24C). As a comparison, the epitaxial source/drain feature 264-2 contacts all available channel layers 216 in the second region 206. Therefore, the GAA transistors in the first region 204 have less functional channel layers than the GAA transistors formed in the second region 206.

Although not intended to be limiting, embodiments of the present disclosure provide one or more of the following advantages. For example, embodiments of the present disclosure form tunable numbers of stacked channel layers in different regions of one IC chip serving different functions. This advantageously meets requirements of different current driving capabilities of various transistors. Further, some embodiments of the present disclosure provide substrate leakage current suppression. Embodiments of the present disclosure can be readily integrated into existing semiconductor manufacturing processes.

In one exemplary aspect, the present disclosure is directed to a method. The method includes forming a stack of channel layers and sacrificial layers on a substrate, the channel layers and the sacrificial layers having different material compositions and being alternatingly disposed in a vertical direction, patterning the stack to form a semiconductor fin, forming an isolation feature on sidewalls of the semiconductor fin, recessing the semiconductor fin, thereby forming a source/drain recess, such that a recessed top surface of the semiconductor fin is below a top surface of the isolation feature, growing a base epitaxial layer from the recessed top surface of the semiconductor fin, depositing an insulation layer in the source/drain recess. The insulation layer is above the base epitaxial layer and above a bottommost channel layer. The method further includes forming an epitaxial feature in the source/drain recess, wherein the epitaxial feature is above the insulation layer. In some embodiments, the insulation layer separates the base epitaxial layer from contacting the epitaxial feature. In some embodiments, the insulation layer fully covers sidewalls of the bottommost channel layer. In some embodiments, a top surface of the base epitaxial layer is below a bottom surface of the bottommost channel layer and above a top surface of a bottommost sacrificial layer. In some embodiments, the base epitaxial layer fully covers sidewalls of the bottommost channel layer. In some embodiments, the insulation layer and the base epitaxial layer collectively cover sidewalls of the bottommost channel layer. In some embodiments, the depositing of the insulation layer includes a cyclic deposition process. In some embodiments, the depositing of the insulation layer includes a plasma-enhanced chemical vapor deposition (PECVD) process. In some embodiments, the method further includes forming first and second dielectric fins sandwiching the semiconductor fin, wherein the depositing of the insulation layer traps first air gaps under the insulation layer at corner regions of the first and second dielectric fins. In some embodiments, the forming of the epitaxial feature traps second air gaps between the epitaxial feature and the insulation layer, and the second air gaps are above the first air gaps.

In another exemplary aspect, the present disclosure is directed to a method of fabricating a semiconductor device. The method includes forming an epitaxial stack of channel layers and sacrificial layers on a semiconductor substrate, the channel layers and the sacrificial layers having different material compositions and being alternatingly stacked in a vertical direction, patterning the epitaxial stack to form a first semiconductor fin in a first region of the semiconductor substrate and a second semiconductor fin in a second region of the semiconductor substrate, recessing the first semiconductor fin in a first source/drain region, recessing the second semiconductor fin in a second source/drain region, forming an epitaxial layer in the first and second source/drain regions, forming a dielectric layer on the epitaxial layer in the first and second source/drain regions, wherein a top surface of the dielectric layer in the first source/drain region is above the top surface of the dielectric layer in the second source/drain region, and forming a first source/drain feature in the first source/drain region and a second source/drain feature in the second source/drain region, wherein the second source/drain feature is in contact with a bottommost channel layer in the second semiconductor fin, and the first source/drain feature is free of contact with a bottommost channel layer in the first semiconductor fin. In some embodiments, the first source/drain feature is free of contact with two or more bottom channel layers in the first semiconductor fin. In some embodiments, the forming of epitaxial layer includes growing the epitaxial layer in the first and second source/drain regions, depositing a masking layer covering the epitaxial layer in the second source/drain region, continue growing the epitaxial layer in the first source/drain region, and removing the masking layer. In some embodiments, the forming of the dielectric layer includes depositing the dielectric layer, such that the top surface of the dielectric layer in the first source/drain region is above the bottommost channel layer in the first semiconductor fin, and the top surface of the dielectric layer in the second source/drain region is above the bottommost channel layer in the second semiconductor fin, depositing a masking layer covering the dielectric layer in the first source/drain region, recessing the top surface of the dielectric layer in the second source/drain region, and removing the masking layer. In some embodiments, the method further includes removing the sacrificial layers from the first and second semiconductor fins, and forming a gate structure, wherein the gate structure wraps around each of the channel layers in the first and second semiconductor fins. In some embodiments, the method further includes forming inner spacers abutting the gate structure, wherein at least a bottommost inner spacer is laterally stacked between the dielectric layer and the gate structure.

In yet another exemplary aspect, the present disclosure is directed to a semiconductor device. The semiconductor device includes channel layers disposed over a substrate, a gate structure wrapping each of the channel layers, the gate structure including a gate dielectric layer and a gate electrode layer, a first epitaxial feature abutting a topmost channel layer, a second epitaxial feature under the first epitaxial feature, an inner spacer interposing the first epitaxial feature and the gate structure, and a dielectric layer disposed between the first and second epitaxial features. The dielectric layer and the second epitaxial feature separate the first epitaxial feature from contacting at least a bottommost channel layer. In some embodiments, the dielectric layer fully covers sidewalls of the bottommost channel layer. In some embodiments, the second epitaxial feature fully covers sidewalls of the bottommost channel layer. In some embodiments, a width of the first epitaxial feature is larger than a width of the second epitaxial feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a stack of channel layers and sacrificial layers on a substrate, the channel layers and the sacrificial layers having different material compositions and being alternatingly disposed in a vertical direction;
    patterning the stack to form a semiconductor fin;
    forming an isolation feature on sidewalls of the semiconductor fin;
    recessing the semiconductor fin, thereby forming a source/drain recess, such that a recessed top surface of the semiconductor fin is below a top surface of the isolation feature;
    growing a base epitaxial layer from the recessed top surface of the semiconductor fin;

depositing an insulation layer in the source/drain recess, wherein the insulation layer is above the base epitaxial layer and above a bottommost channel layer; and forming an epitaxial feature in the source/drain recess, wherein the epitaxial feature is above the insulation layer.

2. The method of claim 1, wherein the insulation layer separates the base epitaxial layer from contacting the epitaxial feature.

3. The method of claim 1, wherein the insulation layer fully covers sidewalls of the bottommost channel layer.

4. The method of claim 3, wherein a top surface of the base epitaxial layer is below a bottom surface of the bottommost channel layer and above a top surface of a bottommost sacrificial layer.

5. The method of claim 1, wherein the base epitaxial layer fully covers sidewalls of the bottommost channel layer.

6. The method of claim 1, wherein the insulation layer and the base epitaxial layer collectively cover sidewalls of the bottommost channel layer.

7. The method of claim 1, wherein the depositing of the insulation layer includes a cyclic deposition process.

8. The method of claim 1, wherein the depositing of the insulation layer includes a plasma-enhanced chemical vapor deposition (PECVD) process.

9. The method of claim 1, further comprising:
forming first and second dielectric fins sandwiching the semiconductor fin, wherein the depositing of the insulation layer traps first air gaps under the insulation layer at corner regions of the first and second dielectric fins.

10. The method of claim 9, wherein the forming of the epitaxial feature traps second air gaps between the epitaxial feature and the insulation layer, and the second air gaps are above the first air gaps.

11. A method of fabricating a semiconductor device, comprising:
forming an epitaxial stack of channel layers and sacrificial layers on a semiconductor substrate, the channel layers and the sacrificial layers having different material compositions and being alternatingly stacked in a vertical direction;
patterning the epitaxial stack to form a first semiconductor fin in a first region of the semiconductor substrate and a second semiconductor fin in a second region of the semiconductor substrate;
recessing the first semiconductor fin in a first source/drain region;
recessing the second semiconductor fin in a second source/drain region;
forming an epitaxial layer in the first and second source/drain regions;
forming a dielectric layer on the epitaxial layer in the first and second source/drain regions, wherein a top surface of the dielectric layer in the first source/drain region is above the top surface of the dielectric layer in the second source/drain region; and
forming a first source/drain feature in the first source/drain region and a second source/drain feature in the second source/drain region, wherein the second source/drain feature is in contact with a bottommost channel layer in the second semiconductor fin, and the first source/drain feature is free of contact with a bottommost channel layer in the first semiconductor fin.

12. The method of claim 11, wherein the first source/drain feature is free of contact with two or more bottom channel layers in the first semiconductor fin.

13. The method of claim 11, wherein the forming of epitaxial layer includes:
growing the epitaxial layer in the first and second source/drain regions;
depositing a masking layer covering the epitaxial layer in the second source/drain region;
continue growing the epitaxial layer in the first source/drain region; and
removing the masking layer.

14. The method of claim 11, wherein the forming of the dielectric layer includes:
depositing the dielectric layer, such that the top surface of the dielectric layer in the first source/drain region is above the bottommost channel layer in the first semiconductor fin, and the top surface of the dielectric layer in the second source/drain region is above the bottommost channel layer in the second semiconductor fin;
depositing a masking layer covering the dielectric layer in the first source/drain region;
recessing the top surface of the dielectric layer in the second source/drain region; and
removing the masking layer.

15. The method of claim 11, further comprising:
removing the sacrificial layers from the first and second semiconductor fins; and
forming a gate structure, wherein the gate structure wraps around each of the channel layers in the first and second semiconductor fins.

16. The method of claim 15, further comprising:
forming inner spacers abutting the gate structure, wherein at least a bottommost inner spacer is laterally stacked between the dielectric layer and the gate structure.

17. A method, comprising:
forming a stack of channel layers and sacrificial layers on a substrate, the channel layers and the sacrificial layers having different material compositions and being alternatingly disposed in a vertical direction;
patterning the stack to form a fin-shaped structure;
recessing a region the fin-shaped structure to form a trench;
depositing inner spacers in the trench and on sidewalls of the sacrificial layers;
depositing a first epitaxial layer in the trench, wherein a top surface of the base epitaxial layer is below a top surface of a bottommost one of the channel layers;
depositing an insulation layer in the trench and on the first epitaxial layer, wherein a top surface of the insulation layer is above the top surface of the bottommost one of the channel layers; and
forming a second epitaxial layer in the trench and on the insulating layer, wherein the second epitaxial layer abuts at least a topmost one of the channel layers.

18. The method of claim 17, wherein the first epitaxial layer is in contact with a bottommost one of the inner spacers.

19. The method of claim 17, wherein the insulation layer separates the first epitaxial layer from contacting the second epitaxial layer.

20. The method of claim 17, further comprising:
depositing an isolation feature on sidewalls of the fin-shaped structure, wherein a bottom surface of the first epitaxial layer is below a top surface of the isolation feature.

* * * * *